US010378106B2

(12) United States Patent
Kobayashi et al.

(10) Patent No.: US 10,378,106 B2
(45) Date of Patent: Aug. 13, 2019

(54) METHOD OF FORMING INSULATION FILM BY MODIFIED PEALD

(75) Inventors: Akiko Kobayashi, Tokyo (JP); Akira Shimizu, Tokyo (JP); Nobuyoshi Kobayashi, Tokyo (JP); Woo-Jin Lee, Tokyo (JP)

(73) Assignee: ASM IP Holding B.V., Versterkerstraat 8, Almere 1322 AP (NL)

( * ) Notice: Subject to any disclaimer, the term of this patent is extended or adjusted under 35 U.S.C. 154(b) by 1278 days.

(21) Appl. No.: 12/618,355

(22) Filed: Nov. 13, 2009

(65) Prior Publication Data

US 2010/0124621 A1 May 20, 2010

Related U.S. Application Data

(60) Provisional application No. 61/114,847, filed on Nov. 14, 2008.

(51) Int. Cl.

| | |
|---|---|
| ***C23C 16/32*** | (2006.01) |
| ***C23C 16/34*** | (2006.01) |
| ***C23C 16/40*** | (2006.01) |
| ***H01L 21/02*** | (2006.01) |
| ***C23C 16/455*** | (2006.01) |
| ***H05H 1/24*** | (2006.01) |

(52) U.S. Cl.

CPC .......... *C23C 16/402* (2013.01); *C23C 16/325* (2013.01); *C23C 16/345* (2013.01); *C23C 16/45542* (2013.01); *C23C 16/45553* (2013.01); *H01L 21/0214* (2013.01); *H01L 21/0217* (2013.01); *H01L 21/0228* (2013.01); *H01L 21/02164* (2013.01); *H01L 21/02219* (2013.01); *H01L 21/02274* (2013.01)

(58) Field of Classification Search

CPC ........... C23C 16/402; C23C 16/45542; C23C 16/45553; C23C 16/345; C23C 16/325; H01L 21/0228; H01L 21/0217; H01L 21/00274; H01L 21/0214; H01L 21/02164; H01L 21/02219

USPC ........................................... 427/248.1–255.7

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |

(Continued)

FOREIGN PATENT DOCUMENTS

| | | |
|---|---|---|
| CN | 2588350 | 11/2003 |
| CN | 1563483 | 1/2005 |

(Continued)

OTHER PUBLICATIONS

Schindler, Peter—Dissertatation, 2015—Next Generation High-k Dielectrics for DRAM Produced by Atomic Layer Deposition Studied by Transmission Electron Microscopy (Year: 2015).*

(Continued)

*Primary Examiner* — Michael P Wieczorek
*Assistant Examiner* — Michael G Miller
(74) *Attorney, Agent, or Firm* — Snell & Wilmer L.L.P.

(57) ABSTRACT

A method of forming an insulation film by alternating multiple times, respectively, a process of adsorbing a precursor onto a substrate and a process of treating the adsorbed surface using reactant gas and a plasma, wherein a plasma is applied in the process of supplying the precursor.

10 Claims, 7 Drawing Sheets

(56) References Cited

U.S. PATENT DOCUMENTS 2,059,480 A 11/1936 Obermaier
2,161,626 A 6/1939 Loughner et al.
2,266,416 A 12/1941 Duclos
2,280,778 A 4/1942 Anderson
2,410,420 A 11/1946 Bennett
2,563,931 A 8/1951 Harrison
2,660,061 A 11/1953 Lewis
2,745,640 A 5/1956 Cushman
2,990,045 A 9/1959 Root
3,038,951 A 6/1962 Mead
3,089,507 A 5/1963 Drake et al.
3,094,396 A 6/1963 Flugge et al.
3,232,437 A 2/1966 Hultgren
3,263,502 A 8/1966 Springfield
3,410,349 A 11/1968 Troutman
3,588,192 A 6/1971 Drutchas et al.
3,647,387 A 3/1972 Benson
3,647,716 A 3/1972 Koches
3,713,899 A 1/1973 Sebestyen
3,718,429 A 2/1973 Williamson
3,833,492 A 9/1974 Bollyky
3,854,443 A 12/1974 Baerg
3,862,397 A 1/1975 Anderson et al.
3,867,205 A 2/1975 Schley
3,885,504 A 5/1975 Baermann
3,887,790 A 6/1975 Ferguson
3,904,371 A 9/1975 Neti
3,913,058 A 10/1975 Nishio et al.
3,913,617 A 10/1975 van Laar
3,947,685 A 3/1976 Meinel
3,960,559 A 6/1976 Suzuki
3,997,638 A 12/1976 Manning et al.
4,054,071 A 10/1977 Patejak
4,058,430 A 11/1977 Suntola et al.
4,093,491 A 6/1978 Whelpton et al.
D249,341 S 9/1978 Mertz
4,126,027 A 11/1978 Smith et al.
4,134,425 A 1/1979 Gussefeld et al.
4,145,699 A 3/1979 Hu et al.
4,164,959 A 8/1979 Wurzburger
4,176,630 A 12/1979 Elmer
4,181,330 A 1/1980 Kojima
4,194,536 A 3/1980 Stine et al.
4,217,463 A 8/1980 Swearingen
4,234,449 A 11/1980 Wolson et al.
4,322,592 A 3/1982 Martin
4,333,735 A 6/1982 Hardy
4,355,912 A 10/1982 Haak
4,389,973 A 6/1983 Suntola et al.
4,393,013 A 7/1983 McMenamin
4,401,507 A 8/1983 Engle
4,414,492 A 11/1983 Hanlet
4,436,674 A 3/1984 McMenamin
4,444,990 A 4/1984 Villar
4,454,370 A 6/1984 Voznick
4,455,193 A 6/1984 Jeuch et al.
4,466,766 A 8/1984 Geren et al.
4,479,831 A 10/1984 Sandow
4,499,354 A 2/1985 Hill et al.
4,512,113 A 4/1985 Budinger
4,527,005 A 7/1985 McKelvey et al.
4,537,001 A 8/1985 Uppstrom
4,548,688 A 10/1985 Mathews
4,570,328 A 2/1986 Price et al.
4,575,636 A 3/1986 Caprari
4,578,560 A 3/1986 Tanaka et al.
4,579,378 A 4/1986 Snyders
4,579,623 A 4/1986 Suzuki et al.
4,590,326 A 5/1986 Woldy
4,611,966 A 9/1986 Johnson
4,620,998 A 11/1986 Lalvani
D288,556 S 3/1987 Wallgren
4,653,541 A 3/1987 Oehlschlaeger et al.
4,654,226 A 3/1987 Jackson et al.
4,664,769 A 5/1987 Cuomo et al.
4,681,134 A 7/1987 Paris
4,718,637 A 1/1988 Contin
4,721,533 A 1/1988 Phillippi et al.
4,722,298 A 2/1988 Rubin et al.
4,724,272 A 2/1988 Raniere et al.
4,735,259 A 4/1988 Vincent
4,749,416 A 6/1988 Greenspan
4,753,192 A 6/1988 Goldsmith et al.
4,753,856 A 6/1988 Haluska et al.
4,756,794 A 7/1988 Yoder
4,771,015 A 9/1988 Kanai
4,780,169 A 10/1988 Stark et al.
4,789,294 A 12/1988 Sato et al.
4,821,674 A 4/1989 deBoer et al.
4,827,430 A 5/1989 Aid et al.
4,830,515 A 5/1989 Cortes
4,837,113 A 6/1989 Luttmer et al.
4,837,185 A 6/1989 Yau et al.
4,854,263 A 8/1989 Chang et al.
4,854,266 A 8/1989 Simson et al.
4,857,137 A 8/1989 Tachi et al.
4,857,382 A 8/1989 Liu et al.
4,882,199 A 11/1989 Sadoway et al.
4,916,091 A 4/1990 Freeman et al.
4,934,831 A 6/1990 Volbrecht
4,949,848 A 8/1990 Kos
D311,126 S 10/1990 Crowley
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,856 A 1/1991 Hey
4,989,992 A 2/1991 Piai
4,991,614 A 2/1991 Hammel
5,013,691 A 5/1991 Lory et al.
5,027,746 A 7/1991 Frijlink
5,028,366 A 7/1991 Harakal et al.
5,057,436 A 10/1991 Ball
5,060,322 A 10/1991 Delepine
5,061,083 A 10/1991 Grimm et al.
5,062,386 A 11/1991 Christensen
5,065,698 A 11/1991 Koike
5,071,258 A 12/1991 Usher et al.
5,074,017 A 12/1991 Toya et al.
5,098,638 A 3/1992 Sawada
5,098,865 A * 3/1992 Machado .......... H01L 21/02164
148/DIG. 118
5,104,514 A 4/1992 Quartarone
5,108,192 A 4/1992 Mailliet et al.
5,116,018 A 5/1992 Friemoth et al.
D327,534 S 6/1992 Manville
5,119,760 A 6/1992 McMillan et al.
5,130,003 A 7/1992 Conrad
5,137,286 A 8/1992 Whitford
5,154,301 A 10/1992 Kos
5,158,128 A 10/1992 Inoue et al.
5,167,716 A 12/1992 Boitnott et al.
5,176,451 A 1/1993 Sasada
5,178,682 A 1/1993 Tsukamoto et al.
5,181,779 A 1/1993 Shia et al.
5,183,511 A 2/1993 Yamazaki et al.
5,192,717 A 3/1993 Kawakami
5,194,401 A 3/1993 Adams et al.
5,199,603 A 4/1993 Prescott
5,213,650 A 5/1993 Wang et al.
5,221,556 A 6/1993 Hawkins et al.
5,225,366 A 7/1993 Yoder et al.
5,226,383 A 7/1993 Bhat
5,228,114 A 7/1993 Suzuki
5,242,539 A 9/1993 Kumihashi et al.
5,243,195 A 9/1993 Nishi
5,243,202 A 9/1993 Mori et al.
5,246,218 A 9/1993 Yap et al.
5,246,500 A 9/1993 Samata et al.
5,259,881 A 11/1993 Edwards et al.
5,266,526 A 11/1993 Aoyama
5,271,967 A 12/1993 Kramer et al.
5,278,494 A 1/1994 Obigane

(56) References Cited

U.S. PATENT DOCUMENTS

| | | | |
|---|---|---|---|
| 5,284,519 | A | 2/1994 | Gadgil |
| 5,288,684 | A | 2/1994 | Yamazaki et al. |
| 5,294,778 | A | 3/1994 | Carman et al. |
| 5,306,666 | A | 4/1994 | Izumi |
| 5,306,946 | A | 4/1994 | Yamamoto |
| 5,310,456 | A | 5/1994 | Kadomura |
| 5,314,570 | A | 5/1994 | Ikegaya et al. |
| 5,315,092 | A | 5/1994 | Takahashi et al. |
| 5,326,427 | A | 7/1994 | Jerbic |
| 5,336,327 | A | 8/1994 | Lee |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,364,667 | A | 11/1994 | Rhieu |
| D353,452 | S | 12/1994 | Groenhoff |
| 5,374,315 | A | 12/1994 | Deboer et al. |
| 5,380,367 | A | 1/1995 | Bertone |
| 5,382,311 | A | 1/1995 | Ishikawa et al. |
| 5,388,945 | A | 2/1995 | Garric et al. |
| 5,404,082 | A | 4/1995 | Hernandez et al. |
| 5,407,449 | A | 4/1995 | Zinger |
| 5,413,813 | A | 5/1995 | Cruse et al. |
| 5,414,221 | A | 5/1995 | Gardner |
| 5,415,753 | A | 5/1995 | Hurwitt et al. |
| 5,421,893 | A | 6/1995 | Perlov |
| 5,422,139 | A | 6/1995 | Fischer |
| 5,423,942 | A | 6/1995 | Robbins et al. |
| 5,430,011 | A | 7/1995 | Tanaka et al. |
| 5,444,217 | A | 8/1995 | Moore |
| 5,453,124 | A | 9/1995 | Moslehi et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai et al. |
| 5,504,042 | A | 4/1996 | Cho et al. |
| 5,514,439 | A | 5/1996 | Sibley |
| 5,518,549 | A | 5/1996 | Hellwig |
| 5,523,616 | A | 6/1996 | Yasuhide |
| 5,527,111 | A | 6/1996 | Lysen et al. |
| 5,527,417 | A | 6/1996 | Iida et al. |
| 5,531,835 | A | 7/1996 | Fodor et al. |
| 5,540,898 | A | 7/1996 | Davidson |
| 5,558,717 | A | 9/1996 | Zhao et al. |
| 5,559,046 | A | 9/1996 | Oishi et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,604,410 | A | 2/1997 | Vollkommer et al. |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| D380,527 | S | 7/1997 | Velez |
| 5,656,093 | A | 8/1997 | Burkhart et al. |
| 5,663,899 | A | 9/1997 | Zvonar et al. |
| 5,665,608 | A | 9/1997 | Chapple-Sokol et al. |
| 5,679,215 | A | 10/1997 | Barnes et al. |
| 5,681,779 | A | 10/1997 | Pasch et al. |
| 5,683,517 | A | 11/1997 | Shan |
| 5,695,567 | A | 12/1997 | Kordina |
| 5,697,706 | A | 12/1997 | Ciaravino et al. |
| 5,700,729 | A | 12/1997 | Lee et al. |
| 5,708,825 | A | 1/1998 | Sotomayor |
| 5,711,811 | A | 1/1998 | Suntola et al. |
| 5,716,133 | A | 2/1998 | Hosokawa et al. |
| 5,718,574 | A | 2/1998 | Shimazu |
| D392,855 | S | 3/1998 | Pillow |
| 5,724,748 | A | 3/1998 | Brooks |
| 5,728,223 | A | 3/1998 | Murakarni et al. |
| 5,730,801 | A | 3/1998 | Tepman et al. |
| 5,732,744 | A | 3/1998 | Barr et al. |
| 5,736,314 | A | 4/1998 | Hayes et al. |
| 5,753,835 | A | 5/1998 | Gustin |
| 5,761,328 | A | 6/1998 | Solberg et al. |
| 5,777,838 | A | 7/1998 | Tamagawa et al. |
| 5,779,203 | A | 7/1998 | Edlinger |
| 5,781,693 | A | 7/1998 | Balance et al. |
| 5,782,979 | A | 7/1998 | Kaneno |
| 5,791,782 | A | 8/1998 | Wooten et al. |
| 5,792,272 | A | 8/1998 | Van Os et al. |
| 5,796,074 | A | 8/1998 | Edelstein et al. |
| 5,801,104 | A | 9/1998 | Schuegraf et al. |
| 5,806,980 | A | 9/1998 | Berrian |
| 5,813,851 | A | 9/1998 | Nakao |
| 5,819,092 | A | 10/1998 | Ferguson et al. |
| 5,819,434 | A | 10/1998 | Herchen et al. |
| 5,827,435 | A | 10/1998 | Seiji |
| 5,827,757 | A | 10/1998 | Robinson, Jr. et al. |
| 5,836,483 | A | 11/1998 | Disel |
| 5,837,058 | A | 11/1998 | Chen et al. |
| 5,837,320 | A | 11/1998 | Hampden-Smith et al. |
| 5,844,683 | A | 12/1998 | Pavloski et al. |
| 5,846,332 | A | 12/1998 | Zhao et al. |
| 5,851,294 | A | 12/1998 | Young et al. |
| 5,852,879 | A | 12/1998 | Schumaier |
| 5,853,484 | A | 12/1998 | Jeong |
| 5,855,680 | A | 1/1999 | Soininen et al. |
| 5,855,681 | A | 1/1999 | Maydan et al. |
| 5,857,777 | A | 1/1999 | Schuh |
| 5,863,123 | A | 1/1999 | Lee |
| 5,865,205 | A | 2/1999 | Wilmer |
| 5,873,942 | A | 2/1999 | Park |
| 5,877,095 | A | 3/1999 | Tamura et al. |
| 5,879,128 | A | 3/1999 | Tietz et al. |
| 5,884,640 | A | 3/1999 | Fishkin et al. |
| D409,894 | S | 5/1999 | McClurg |
| 5,908,672 | A | 6/1999 | Ryu |
| 5,916,365 | A | 6/1999 | Sherman |
| D412,270 | S | 7/1999 | Fredrickson |
| 5,920,798 | A | 7/1999 | Higuchi et al. |
| 5,937,323 | A | 8/1999 | Orczyk et al. |
| 5,947,718 | A | 9/1999 | Weaver |
| 5,954,375 | A | 9/1999 | Trickle et al. |
| 5,961,775 | A | 10/1999 | Fujimura |
| 5,968,275 | A | 10/1999 | Lee et al. |
| 5,970,621 | A | 10/1999 | Bazydola |
| 5,975,492 | A | 11/1999 | Brenes |
| 5,979,506 | A | 11/1999 | Aarseth |
| 5,982,931 | A | 11/1999 | Ishimaru |
| 5,984,391 | A | 11/1999 | Vanderpot et al. |
| 5,987,480 | A | 11/1999 | Donohue et al. |
| 5,997,588 | A | 12/1999 | Goodwin |
| 5,997,768 | A | 12/1999 | Scully |
| 5,998,870 | A | 12/1999 | Lee et al. |
| 6,001,267 | A | 12/1999 | Van Os et al. |
| D419,652 | S | 1/2000 | Hall et al. |
| 6,013,553 | A | 1/2000 | Wallace |
| 6,013,920 | A | 1/2000 | Gordon et al. |
| 6,015,465 | A | 1/2000 | Kholodenko et al. |
| 6,017,779 | A | 1/2000 | Miyasaka |
| 6,017,818 | A | 1/2000 | Lu |
| 6,024,799 | A | 2/2000 | Chen |
| 6,035,101 | A | 3/2000 | Sajoto et al. |
| 6,042,652 | A | 3/2000 | Hyun |
| 6,044,860 | A | 4/2000 | Nue |
| 6,045,260 | A | 4/2000 | Schwartz et al. |
| 6,048,154 | A | 4/2000 | Wytman |
| 6,050,506 | A | 4/2000 | Guo et al. |
| 6,054,678 | A | 4/2000 | Miyazaki |
| 6,060,691 | A | 5/2000 | Minami et al. |
| 6,060,721 | A | 5/2000 | Huang |
| 6,068,441 | A | 5/2000 | Raaijmakers et al. |
| 6,072,163 | A | 6/2000 | Armstrong |
| 6,073,973 | A | 6/2000 | Boscaljon et al. |
| 6,074,443 | A | 6/2000 | Venkatesh |
| 6,083,321 | A | 7/2000 | Lei et al. |
| 6,086,677 | A | 7/2000 | Umotoy et al. |
| 6,091,062 | A | 7/2000 | Pfahnl et al. |

(56) References Cited

U.S. PATENT DOCUMENTS

| | | | |
|---|---|---|---|
| 6,093,252 | A | 7/2000 | Wengert et al. |
| 6,093,253 | A | 7/2000 | Lofgren |
| 6,096,267 | A | 8/2000 | Kishkovich |
| 6,099,302 | A | 8/2000 | Hong et al. |
| 6,102,565 | A | 8/2000 | Kita et al. |
| 6,104,011 | A | 8/2000 | Juliano |
| 6,104,401 | A | 8/2000 | Parsons |
| 6,106,678 | A | 8/2000 | Shufflebotham |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,848 | A | 10/2000 | Li et al. |
| 6,129,044 | A | 10/2000 | Zhao et al. |
| 6,129,546 | A | 10/2000 | Sada |
| 6,134,807 | A | 10/2000 | Komino |
| 6,137,240 | A | 10/2000 | Bogdan et al. |
| 6,140,252 | A | 10/2000 | Cho et al. |
| 6,148,761 | A | 11/2000 | Majewski et al. |
| 6,158,941 | A | 12/2000 | Muka et al. |
| 6,160,244 | A | 12/2000 | Ohashi |
| 6,161,500 | A | 12/2000 | Kopacz et al. |
| 6,162,323 | A | 12/2000 | Koshimizu et al. |
| 6,174,809 | B1 | 1/2001 | Kang et al. |
| 6,178,918 | B1 | 1/2001 | Van Os et al. |
| 6,180,979 | B1 | 1/2001 | Hofman et al. |
| 6,187,672 | B1 | 2/2001 | Zhao |
| 6,187,691 | B1 | 2/2001 | Fukuda |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,201,999 | B1 | 3/2001 | Jevtic |
| 6,203,613 | B1 | 3/2001 | Gates et al. |
| 6,207,932 | B1 | 3/2001 | Yoo |
| 6,212,789 | B1 | 4/2001 | Kato |
| 6,214,122 | B1 | 4/2001 | Thompson |
| 6,217,658 | B1 | 4/2001 | Orczyk et al. |
| 6,218,288 | B1 | 4/2001 | Li et al. |
| 6,225,020 | B1 | 5/2001 | Jung et al. |
| 6,235,858 | B1 | 5/2001 | Swarup et al. |
| 6,242,359 | B1 | 6/2001 | Misra |
| 6,243,654 | B1 | 6/2001 | Johnson et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,257,758 | B1 | 7/2001 | Culbertson |
| 6,264,467 | B1 | 7/2001 | Andreas et al. |
| 6,271,148 | B1 | 8/2001 | Kao |
| 6,274,878 | B1 | 8/2001 | Li et al. |
| 6,281,098 | B1 | 8/2001 | Wang |
| 6,281,141 | B1 | 8/2001 | Das et al. |
| 6,284,050 | B1 | 9/2001 | Shi et al. |
| 6,287,965 | B1 | 9/2001 | Kang et al. |
| 6,293,700 | B1 | 9/2001 | Lund et al. |
| D449,873 | S | 10/2001 | Bronson |
| 6,296,909 | B1 | 10/2001 | Spitsberg |
| 6,299,133 | B2 | 10/2001 | Waragai et al. |
| 6,302,964 | B1 | 10/2001 | Umotoy et al. |
| 6,303,523 | B2 | 10/2001 | Cheung |
| 6,305,898 | B1 | 10/2001 | Yamagishi et al. |
| 6,311,016 | B1 | 10/2001 | Yanagawa et al. |
| 6,312,525 | B1 | 11/2001 | Bright et al. |
| 6,315,512 | B1 | 11/2001 | Tabrizi et al. |
| 6,316,162 | B1 | 11/2001 | Jung et al. |
| 6,321,680 | B2 | 11/2001 | Cook et al. |
| D451,893 | S | 12/2001 | Robson |
| D452,220 | S | 12/2001 | Robson |
| 6,325,858 | B1 | 12/2001 | Wengert |
| 6,326,597 | B1 | 12/2001 | Lubomirsky et al. |
| 6,329,297 | B1 | 12/2001 | Balish |
| 6,342,427 | B1 | 1/2002 | Choi et al. |
| 6,344,084 | B1 | 2/2002 | Koinuma et al. |
| 6,344,232 | B1 | 2/2002 | Jones et al. |
| 6,347,636 | B1 | 2/2002 | Xia |
| 6,350,391 | B1 | 2/2002 | Livshits et al. |
| 6,352,945 | B1 | 3/2002 | Matsuki |
| D455,024 | S | 4/2002 | Mimick et al. |
| 6,367,410 | B1 | 4/2002 | Leahey et al. |
| 6,368,773 | B1 | 4/2002 | Jung et al. |
| 6,368,987 | B1 | 4/2002 | Kopacz et al. |
| 6,370,796 | B1 | 4/2002 | Zucker |
| 6,372,583 | B1 | 4/2002 | Tyagi |
| 6,374,831 | B1 | 4/2002 | Chandran |
| 6,375,312 | B1 | 4/2002 | Ikeda et al. |
| 6,375,750 | B1 | 4/2002 | Van Os et al. |
| D457,609 | S | 5/2002 | Piano |
| 6,383,566 | B1 | 5/2002 | Zagdoun |
| 6,383,955 | B1 | 5/2002 | Matsuki |
| 6,387,207 | B1 | 5/2002 | Janakiraman |
| 6,391,803 | B1 | 5/2002 | Kim et al. |
| 6,395,650 | B1 | 5/2002 | Callegari et al. |
| 6,398,184 | B1 | 6/2002 | Sowada et al. |
| 6,410,459 | B2 | 6/2002 | Blalock et al. |
| 6,413,321 | B1 | 7/2002 | Kim et al. |
| 6,413,583 | B1 | 7/2002 | Moghadam et al. |
| 6,420,279 | B1 | 7/2002 | Ono et al. |
| D461,233 | S | 8/2002 | Whalen |
| D461,882 | S | 8/2002 | Piano |
| 6,432,849 | B1 | 8/2002 | Endo et al. |
| 6,435,798 | B1 | 8/2002 | Satoh |
| 6,435,865 | B1 | 8/2002 | Tseng et al. |
| 6,436,819 | B1 | 8/2002 | Zhang |
| 6,437,444 | B2 | 8/2002 | Andideh |
| 6,438,502 | B1 | 8/2002 | Awtrey |
| 6,441,350 | B1 | 8/2002 | Stoddard et al. |
| 6,445,574 | B1 | 9/2002 | Saw et al. |
| 6,446,573 | B2 | 9/2002 | Hirayama et al. |
| 6,447,232 | B1 | 9/2002 | Davis et al. |
| 6,447,651 | B1 | 9/2002 | Ishikawa et al. |
| 6,448,192 | B1 | 9/2002 | Kaushik |
| 6,450,757 | B1 | 9/2002 | Saeki |
| 6,451,713 | B1 | 9/2002 | Tay et al. |
| 6,454,860 | B2 | 9/2002 | Metzner et al. |
| 6,455,225 | B1 | 9/2002 | Kong et al. |
| 6,455,445 | B2 | 9/2002 | Matsuki |
| 6,461,435 | B1 | 10/2002 | Littau et al. |
| 6,461,436 | B1 | 10/2002 | Campbell et al. |
| 6,468,924 | B2 | 10/2002 | Lee |
| 6,471,779 | B1 | 10/2002 | Nishio et al. |
| 6,472,266 | B1 | 10/2002 | Yu et al. |
| 6,475,276 | B1 | 11/2002 | Elers et al. |
| 6,475,930 | B1 | 11/2002 | Junker et al. |
| 6,478,872 | B1 | 11/2002 | Chae et al. |
| 6,482,331 | B2 | 11/2002 | Lu et al. |
| 6,482,663 | B1 | 11/2002 | Buckland |
| 6,483,989 | B1 | 11/2002 | Okada et al. |
| 6,494,065 | B2 | 12/2002 | Babbitt |
| 6,494,998 | B1 | 12/2002 | Brcka |
| 6,496,819 | B1 | 12/2002 | Bello et al. |
| 6,499,533 | B2 | 12/2002 | Yamada |
| 6,503,079 | B2 | 1/2003 | Kogano et al. |
| 6,503,562 | B1 | 1/2003 | Saito et al. |
| 6,503,826 | B1 | 1/2003 | Oda |
| 6,506,253 | B2 | 1/2003 | Sakuma |
| 6,507,410 | B1 | 1/2003 | Robertson et al. |
| 6,511,539 | B1 | 1/2003 | Raaijmakers |
| 6,514,313 | B1 | 2/2003 | Spiegelman |
| 6,514,666 | B1 | 2/2003 | Choi et al. |
| 6,521,295 | B1 | 2/2003 | Remington |
| 6,521,547 | B1 | 2/2003 | Chang et al. |
| 6,528,430 | B2 | 3/2003 | Kwan |
| 6,528,767 | B2 | 3/2003 | Bagley et al. |
| 6,531,193 | B2 | 3/2003 | Fonash et al. |
| 6,531,412 | B2 | 3/2003 | Conti et al. |
| 6,534,133 | B1 | 3/2003 | Kaloyeros et al. |
| 6,534,395 | B2 | 3/2003 | Werkhoven et al. |
| 6,536,950 | B1 | 3/2003 | Green |
| 6,540,469 | B2 | 4/2003 | Matsunaga et al. |
| 6,544,906 | B2 | 4/2003 | Rotondaro et al. |
| 6,552,209 | B1 | 4/2003 | Lei et al. |
| 6,558,755 | B2 | 5/2003 | Berry et al. |
| 6,559,026 | B1 | 5/2003 | Rossman et al. |

(56) References Cited

U.S. PATENT DOCUMENTS

| | | | |
|---|---|---|---|
| 6,566,278 B1 | 5/2003 | Harvey et al. | |
| 6,569,239 B2 | 5/2003 | Arai et al. | |
| 6,569,971 B2 | 5/2003 | Roh et al. | |
| 6,573,030 B1 | 6/2003 | Fairbairn et al. | |
| 6,574,644 B2 | 6/2003 | Hsu et al. | |
| 6,576,062 B2 | 6/2003 | Matsuse | |
| 6,576,064 B2 | 6/2003 | Griffiths et al. | |
| 6,576,300 B1 | 6/2003 | Berry et al. | |
| 6,576,564 B2 | 6/2003 | Agarwal | |
| 6,578,589 B1 | 6/2003 | Mayusumi | |
| 6,579,833 B1 | 6/2003 | McNallan et al. | |
| 6,580,050 B1 | 6/2003 | Miller et al. | |
| 6,583,048 B1 | 6/2003 | Vincent et al. | |
| 6,589,707 B2 | 7/2003 | Lee et al. | |
| 6,589,868 B2 | 7/2003 | Rossman | |
| 6,590,251 B2 | 7/2003 | Kang et al. | |
| 6,594,550 B1 | 7/2003 | Okrah | |
| 6,596,653 B2 | 7/2003 | Tan | |
| 6,598,559 B1 | 7/2003 | Vellore et al. | |
| 6,607,868 B2 | 8/2003 | Choi | |
| 6,607,948 B1 | 8/2003 | Sugiyama et al. | |
| 6,608,745 B2 | 8/2003 | Tsuruta et al. | |
| 6,620,251 B2 | 9/2003 | Kitano | |
| 6,624,064 B1 | 9/2003 | Sahin | |
| 6,627,268 B1 | 9/2003 | Fair et al. | |
| 6,627,503 B2 | 9/2003 | Ma et al. | |
| 6,632,478 B2 | 10/2003 | Gaillard et al. | |
| 6,633,364 B2 | 10/2003 | Hayashi | |
| 6,635,117 B1 | 10/2003 | Kinnard et al. | |
| 6,638,839 B2 | 10/2003 | Deng et al. | |
| 6,645,304 B2 | 11/2003 | Yamaguchi | |
| 6,648,974 B1 | 11/2003 | Ogliari et al. | |
| 6,649,921 B1 | 11/2003 | Cekic et al. | |
| 6,652,924 B2 | 11/2003 | Sherman | |
| 6,656,281 B1 | 12/2003 | Ueda | |
| 6,660,662 B2 | 12/2003 | Ishikawa et al. | |
| 6,662,817 B2 | 12/2003 | Yamagishi | |
| 6,673,196 B1 | 1/2004 | Oyabu | |
| 6,676,290 B1 | 1/2004 | Lu | |
| 6,682,971 B2 | 1/2004 | Tsuneda et al. | |
| 6,682,973 B1 | 1/2004 | Paton et al. | |
| D486,891 S | 2/2004 | Cronce | |
| 6,684,659 B1 | 2/2004 | Tanaka et al. | |
| 6,688,784 B1 | 2/2004 | Templeton | |
| 6,689,220 B1 * | 2/2004 | Nguyen | 118/695 |
| 6,692,575 B1 | 2/2004 | Omstead et al. | |
| 6,692,576 B2 | 2/2004 | Halpin et al. | |
| 6,699,003 B2 | 3/2004 | Saeki | |
| 6,699,399 B1 | 3/2004 | Qian et al. | |
| 6,709,989 B2 | 3/2004 | Ramdani et al. | |
| 6,710,364 B2 | 3/2004 | Guldi et al. | |
| 6,710,857 B2 | 3/2004 | Kondo | |
| 6,713,824 B1 | 3/2004 | Mikata | |
| 6,716,571 B2 | 4/2004 | Gabriel | |
| 6,720,260 B1 | 4/2004 | Fair et al. | |
| 6,722,837 B2 | 4/2004 | Inui | |
| 6,723,642 B1 | 4/2004 | Lim et al. | |
| 6,730,614 B1 | 5/2004 | Lim et al. | |
| 6,732,006 B2 | 5/2004 | Haanstra et al. | |
| 6,734,090 B2 | 5/2004 | Agarwala et al. | |
| 6,740,853 B1 | 5/2004 | Johnson et al. | |
| 6,743,475 B2 | 6/2004 | Skarp et al. | |
| 6,743,738 B2 | 6/2004 | Todd et al. | |
| 6,745,095 B1 | 6/2004 | Ben-Dov | |
| 6,753,507 B2 | 6/2004 | Fure et al. | |
| 6,755,221 B2 | 6/2004 | Jeong et al. | |
| 6,756,085 B2 | 6/2004 | Waldfried | |
| 6,756,293 B2 | 6/2004 | Li et al. | |
| 6,756,318 B2 * | 6/2004 | Nguyen et al. | 438/758 |
| 6,759,098 B2 | 7/2004 | Han | |
| 6,760,981 B2 | 7/2004 | Leap | |
| 6,784,108 B1 | 8/2004 | Donohoe et al. | |
| D497,977 S | 11/2004 | Engelbrektsson | |
| 6,811,960 B2 | 11/2004 | Lee et al. | |
| 6,815,350 B2 | 11/2004 | Kim et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,825,134 B2 | 11/2004 | Law et al. | |
| 6,828,235 B2 | 12/2004 | Takano | |
| 6,831,004 B2 | 12/2004 | Byun | |
| 6,835,039 B2 | 12/2004 | Van Den Berg | |
| 6,846,146 B2 | 1/2005 | Inui | |
| 6,846,515 B2 | 1/2005 | Vrtis | |
| 6,846,742 B2 | 1/2005 | Rossman | |
| 6,847,014 B1 | 1/2005 | Benjamin et al. | |
| 6,858,524 B2 | 2/2005 | Haukka et al. | |
| 6,858,547 B2 | 2/2005 | Metzner | |
| 6,863,019 B2 | 3/2005 | Shamouilian | |
| 6,863,281 B2 | 3/2005 | Endou et al. | |
| 6,864,041 B2 | 3/2005 | Brown | |
| 6,872,258 B2 | 3/2005 | Park et al. | |
| 6,872,259 B2 | 3/2005 | Strang | |
| 6,874,247 B1 | 4/2005 | Hsu | |
| 6,874,480 B1 | 4/2005 | Ismailov | |
| 6,875,677 B1 | 4/2005 | Conley, Jr. et al. | |
| 6,876,017 B2 | 4/2005 | Goodner | |
| 6,878,402 B2 | 4/2005 | Chiang et al. | |
| 6,884,066 B2 | 4/2005 | Nguyen et al. | |
| 6,884,295 B2 | 4/2005 | Ishii | |
| 6,884,319 B2 | 4/2005 | Kim | |
| D505,590 S | 5/2005 | Greiner | |
| 6,889,211 B1 | 5/2005 | Yoshiura et al. | |
| 6,889,864 B2 | 5/2005 | Lindfors et al. | |
| 6,895,158 B2 | 5/2005 | Alyward et al. | |
| 6,899,507 B2 | 5/2005 | Yamagishi et al. | |
| 6,909,839 B2 | 6/2005 | Wang et al. | |
| 6,911,092 B2 | 6/2005 | Sneh | |
| 6,913,152 B2 | 7/2005 | Zuk | |
| 6,913,796 B2 | 7/2005 | Albano et al. | |
| 6,917,755 B2 | 7/2005 | Nguyen et al. | |
| 6,924,078 B2 | 8/2005 | Lee et al. | |
| 6,929,700 B2 | 8/2005 | Tan et al. | |
| 6,930,041 B2 | 8/2005 | Agarwal | |
| 6,930,059 B2 | 8/2005 | Conley, Jr. et al. | |
| 6,935,269 B2 | 8/2005 | Lee et al. | |
| 6,939,817 B2 | 9/2005 | Sandhu et al. | |
| 6,942,753 B2 | 9/2005 | Choi et al. | |
| 6,951,587 B1 | 10/2005 | Narushima | |
| 6,953,609 B2 | 10/2005 | Carollo | |
| 6,955,836 B2 | 10/2005 | Kumagai et al. | |
| 6,972,055 B2 | 12/2005 | Sferlazzo | |
| 6,972,478 B1 | 12/2005 | Waite et al. | |
| 6,974,781 B2 | 12/2005 | Timmermans et al. | |
| 6,975,921 B2 | 12/2005 | Verhaar | |
| 6,976,822 B2 | 12/2005 | Woodruff | |
| 6,981,832 B2 | 1/2006 | Zinger et al. | |
| 6,982,046 B2 | 1/2006 | Srivastava et al. | |
| 6,984,595 B1 | 1/2006 | Yamazaki | |
| 6,985,788 B2 | 1/2006 | Haanstra et al. | |
| 6,987,155 B2 | 1/2006 | Roh et al. | |
| 6,990,430 B2 | 1/2006 | Hosek | |
| 7,005,227 B2 | 2/2006 | Yueh et al. | |
| 7,005,391 B2 | 2/2006 | Min | |
| 7,010,580 B1 | 3/2006 | Fu et al. | |
| 7,017,514 B1 | 3/2006 | Shepherd et al. | |
| 7,018,941 B2 | 3/2006 | Cui et al. | |
| 7,021,881 B2 | 4/2006 | Yamagishi | |
| 7,036,453 B2 | 5/2006 | Ishikawa et al. | |
| 7,041,609 B2 | 5/2006 | Vaartstra | |
| 7,045,430 B2 | 5/2006 | Ahn et al. | |
| 7,049,247 B2 | 5/2006 | Gates et al. | |
| 7,053,009 B2 | 5/2006 | Conley, Jr. et al. | |
| 7,055,875 B2 | 6/2006 | Bonora | |
| 7,062,161 B2 | 6/2006 | Kusuda et al. | |
| 7,070,178 B2 | 7/2006 | Van Der Toorn et al. | |
| 7,071,051 B1 | 7/2006 | Jeon et al. | |
| 7,073,834 B2 | 7/2006 | Matsumoto et al. | |
| 7,080,545 B2 | 7/2006 | Dimeo et al. | |
| 7,084,060 B1 | 8/2006 | Furukawa | |
| 7,084,079 B2 | 8/2006 | Conti et al. | |
| 7,085,623 B2 | 8/2006 | Siegers | |
| 7,088,003 B2 | 8/2006 | Gates et al. | |
| 7,090,394 B2 | 8/2006 | Hashikura et al. | |

(56) References Cited

U.S. PATENT DOCUMENTS

| | | | |
|---|---|---|---|
| 7,092,287 | B2 | 8/2006 | Beulens et al. |
| 7,098,149 | B2 | 8/2006 | Lukas |
| 7,101,763 | B1 | 9/2006 | Anderson et al. |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,143,897 | B1 | 12/2006 | Guzman et al. |
| 7,147,766 | B2 | 12/2006 | Uzoh et al. |
| 7,153,542 | B2 | 12/2006 | Nguyen et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,693 | B2 | 3/2007 | Cowans |
| 7,198,447 | B2 | 4/2007 | Morimitsu et al. |
| 7,201,943 | B2 | 4/2007 | Park et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,389 | B1 | 4/2007 | Tipton et al. |
| 7,210,925 | B2 | 5/2007 | Adachi |
| 7,211,524 | B2 | 5/2007 | Ryu et al. |
| 7,211,525 | B1 | 5/2007 | Shanker |
| 7,214,630 | B1 | 5/2007 | Varadarajan et al. |
| 7,223,014 | B2 | 5/2007 | Lojen |
| 7,208,413 | B2 | 6/2007 | Byun et al. |
| 7,234,476 | B2 | 6/2007 | Arai |
| 7,235,137 | B2 | 6/2007 | Kitayama et al. |
| 7,235,482 | B2 | 6/2007 | Wu |
| 7,235,501 | B2 | 6/2007 | Ahn et al. |
| 7,238,596 | B2 | 7/2007 | Kouvetakis et al. |
| 7,238,616 | B2 | 7/2007 | Agarwal |
| 7,238,653 | B2 | 7/2007 | Lee et al. |
| 7,265,061 | B1 | 9/2007 | Cho et al. |
| 7,274,867 | B2 | 9/2007 | Peukert |
| D553,104 | S | 10/2007 | Oohashi et al. |
| 7,279,256 | B2 | 10/2007 | Son |
| 7,290,813 | B2 | 11/2007 | Bonora |
| 7,294,581 | B2 | 11/2007 | Haverkort et al. |
| 7,296,460 | B2 | 11/2007 | Dimeo et al. |
| 7,297,641 | B2 | 11/2007 | Todd et al. |
| 7,298,009 | B2 | 11/2007 | Yan et al. |
| D557,226 | S | 12/2007 | Uchino et al. |
| 7,307,028 | B2 | 12/2007 | Goto et al. |
| 7,307,178 | B2 | 12/2007 | Kiyomori et al. |
| 7,312,148 | B2 | 12/2007 | Ramaswamy et al. |
| 7,312,162 | B2 | 12/2007 | Ramaswamy et al. |
| 7,312,494 | B2 | 12/2007 | Ahn et al. |
| 7,320,544 | B2 | 1/2008 | Hsieh |
| 7,323,401 | B2 | 1/2008 | Ramaswamy et al. |
| 7,326,657 | B2 | 2/2008 | Xia et al. |
| 7,327,948 | B1 | 2/2008 | Shrinivasan |
| 7,329,947 | B2 | 2/2008 | Adachi et al. |
| 7,335,611 | B2 | 2/2008 | Ramaswamy et al. |
| 7,351,057 | B2 | 4/2008 | Berenbak et al. |
| 7,354,847 | B2 | 4/2008 | Chan et al. |
| 7,354,873 | B2 | 4/2008 | Fukazawa et al. |
| 7,356,762 | B2 | 4/2008 | van Driel |
| 7,357,138 | B2 | 4/2008 | Ji et al. |
| 7,361,447 | B2 | 4/2008 | Jung |
| 7,376,520 | B2 | 5/2008 | Wong |
| 7,379,785 | B2 | 5/2008 | Higashi et al. |
| 7,381,644 | B1 | 6/2008 | Soubramonium et al. |
| 7,387,685 | B2 | 6/2008 | Choi et al. |
| 7,393,207 | B2 | 7/2008 | Imai |
| 7,393,418 | B2 | 7/2008 | Yokogawa |
| 7,393,736 | B2 | 7/2008 | Ahn et al. |
| 7,393,765 | B2 | 7/2008 | Hanawa et al. |
| 7,396,491 | B2 | 7/2008 | Marking et al. |
| 7,399,388 | B2 | 7/2008 | Moghadam et al. |
| 7,399,570 | B2 | 7/2008 | Lee et al. |
| 7,402,534 | B2 | 7/2008 | Mahajani |
| 7,405,166 | B2 | 7/2008 | Liang et al. |
| 7,405,454 | B2 | 7/2008 | Ahn et al. |
| D575,713 | S | 8/2008 | Ratcliffe |
| 7,410,290 | B2 | 8/2008 | Tanaka |
| 7,410,666 | B2 | 8/2008 | Elers |
| 7,411,352 | B2 | 8/2008 | Madocks |
| 7,414,281 | B1 | 8/2008 | Fastow |
| 7,416,989 | B1 | 8/2008 | Liu et al. |
| D576,001 | S | 9/2008 | Brunderman |
| 7,422,635 | B2 | 9/2008 | Zheng et al. |
| 7,422,653 | B2 | 9/2008 | Blahnik et al. |
| 7,422,775 | B2 | 9/2008 | Ramaswamy et al. |
| 7,429,532 | B2 | 9/2008 | Ramaswamy et al. |
| 7,431,966 | B2 | 10/2008 | Derderian et al. |
| 7,432,476 | B2 | 10/2008 | Morita et al. |
| 7,437,060 | B2 | 10/2008 | Wang et al. |
| 7,442,275 | B2 | 10/2008 | Cowans |
| 7,467,632 | B2 | 12/2008 | Lee et al. |
| 7,475,588 | B2 | 1/2009 | Dimeo et al. |
| 7,476,291 | B2 | 1/2009 | Wang et al. |
| 7,479,198 | B2 | 1/2009 | Guffrey |
| 7,482,247 | B1 | 1/2009 | Papasouliotis |
| 7,482,283 | B2 | 1/2009 | Yamasaki et al. |
| D585,968 | S | 2/2009 | Elkins et al. |
| 7,489,389 | B2 | 2/2009 | Shibazaki et al. |
| 7,494,882 | B2 | 2/2009 | Vitale |
| 7,497,614 | B2 | 3/2009 | Gaff |
| 7,498,242 | B2 | 3/2009 | Kumar et al. |
| 7,501,292 | B2 | 3/2009 | Matsushita et al. |
| 7,501,355 | B2 | 3/2009 | Bhatia et al. |
| 7,503,980 | B2 | 3/2009 | Kida et al. |
| D590,933 | S | 4/2009 | Vansell |
| 7,514,375 | B1 | 4/2009 | Shanker et al. |
| D593,969 | S | 6/2009 | Li |
| 7,541,297 | B2 | 6/2009 | Mallick et al. |
| 7,547,363 | B2 | 6/2009 | Tomiyasu et al. |
| 7,547,633 | B2 | 6/2009 | Ranish et al. |
| 7,550,396 | B2 | 6/2009 | Frohberg et al. |
| 7,561,982 | B2 | 7/2009 | Rund et al. |
| 7,563,715 | B2 | 7/2009 | Haukka et al. |
| 7,566,891 | B2 | 7/2009 | Rocha-Alvarez et al. |
| 7,575,968 | B2 | 8/2009 | Sadaka et al. |
| 7,579,285 | B2 | 8/2009 | Zimmerman et al. |
| 7,579,785 | B2 | 8/2009 | Shinmen et al. |
| D600,223 | S | 9/2009 | Aggarwal |
| 7,582,555 | B1 | 9/2009 | Lang |
| 7,582,575 | B2 | 9/2009 | Fukazawa et al. |
| 7,589,003 | B2 | 9/2009 | Kouvetakis et al. |
| 7,589,029 | B2 | 9/2009 | Derderian et al. |
| 7,591,601 | B2 | 9/2009 | Matsuoka et al. |
| D602,575 | S | 10/2009 | Breda |
| 7,598,513 | B2 | 10/2009 | Kouvetakis et al. |
| 7,601,223 | B2 | 10/2009 | Lindfors et al. |
| 7,601,225 | B2 | 10/2009 | Tuominen et al. |
| 7,601,652 | B2 | 10/2009 | Singh et al. |
| 7,611,751 | B2 | 11/2009 | Elers |
| 7,611,980 | B2 | 11/2009 | Wells et al. |
| 7,618,226 | B2 | 11/2009 | Takizawa |
| 7,621,672 | B2 | 11/2009 | Ripley |
| 7,622,369 | B1 | 11/2009 | Lee et al. |
| 7,622,378 | B2 | 11/2009 | Liu et al. |
| 7,623,940 | B2 | 11/2009 | Huskamp et al. |
| D606,952 | S | 12/2009 | Lee |
| 7,625,820 | B1 | 12/2009 | Papasouliotis |
| 7,629,277 | B2 | 12/2009 | Ghatnagar |
| 7,632,549 | B2 | 12/2009 | Goundar |
| 7,640,142 | B2 | 12/2009 | Tachikawa et al. |
| 7,645,341 | B2 | 1/2010 | Kennedy et al. |
| 7,645,484 | B2 | 1/2010 | Ishizaka |

(56) References Cited

U.S. PATENT DOCUMENTS

| | | | |
|---|---|---|---|
| 7,648,927 | B2 | 1/2010 | Singh et al. |
| 7,651,269 | B2 | 1/2010 | Comendant |
| 7,651,583 | B2 | 1/2010 | Kent et al. |
| 7,651,955 | B2 | 1/2010 | Ranish et al. |
| 7,651,959 | B2 | 1/2010 | Fukazawa et al. |
| 7,651,961 | B2 | 1/2010 | Clark |
| D609,652 | S | 2/2010 | Nagasaka |
| D609,655 | S | 2/2010 | Sugimoto |
| 7,661,299 | B2 | 2/2010 | Kusunoki |
| 7,678,197 | B2 | 3/2010 | Maki |
| 7,678,715 | B2 | 3/2010 | Mungekar et al. |
| 7,682,454 | B2 | 3/2010 | Sneh |
| 7,682,657 | B2 | 3/2010 | Sherman |
| D613,829 | S | 4/2010 | Griffin et al. |
| D614,153 | S | 4/2010 | Fondurulia et al. |
| D614,267 | S | 4/2010 | Breda |
| D614,268 | S | 4/2010 | Breda |
| D614,593 | S | 4/2010 | Lee |
| 7,690,881 | B2 | 4/2010 | Yamagishi |
| 7,691,205 | B2 | 4/2010 | Ikedo |
| 7,692,171 | B2 | 4/2010 | Kaszuba et al. |
| 7,695,808 | B2 | 4/2010 | Tuma |
| 7,713,874 | B2 | 5/2010 | Milligan |
| 7,716,993 | B2 | 5/2010 | Ozawa et al. |
| 7,720,560 | B2 | 5/2010 | Menser et al. |
| 7,723,648 | B2 | 5/2010 | Tsukamoto et al. |
| 7,727,864 | B2 | 6/2010 | Elers |
| 7,732,343 | B2 | 6/2010 | Niroomand et al. |
| 7,736,437 | B2 | 6/2010 | Cadwell et al. |
| 7,736,528 | B2 | 6/2010 | Okita et al. |
| 7,740,437 | B2 | 6/2010 | de Ridder et al. |
| 7,740,705 | B2 | 6/2010 | Li |
| 7,745,346 | B2 | 6/2010 | Hausmann et al. |
| 7,748,760 | B2 | 7/2010 | Kushida |
| 7,749,563 | B2 | 7/2010 | Zheng et al. |
| 7,753,584 | B2 | 7/2010 | Gambino et al. |
| 7,754,621 | B2 | 7/2010 | Putjkonen |
| 7,763,869 | B2 | 7/2010 | Matsushita et al. |
| 7,767,262 | B2 | 8/2010 | Clark |
| 7,771,796 | B2 | 8/2010 | Kohno et al. |
| 7,780,440 | B2 | 8/2010 | Shibagaki et al. |
| 7,781,352 | B2 | 8/2010 | Fukazawa et al. |
| 7,789,559 | B2 | 9/2010 | Waser et al. |
| 7,789,965 | B2 | 9/2010 | Matsushita et al. |
| 7,790,633 | B1 | 9/2010 | Tarafdar et al. |
| 7,798,096 | B2 | 9/2010 | Mahajani et al. |
| 7,803,722 | B2 | 9/2010 | Liang |
| 7,806,587 | B2 | 10/2010 | Kobayashi |
| 7,807,566 | B2 | 10/2010 | Tsuji et al. |
| 7,807,578 | B2 | 10/2010 | Bencher et al. |
| 7,816,278 | B2 | 10/2010 | Reed et al. |
| 7,824,492 | B2 | 11/2010 | Tois et al. |
| 7,825,040 | B1 | 11/2010 | Fukazawa et al. |
| 7,829,460 | B2 | 11/2010 | Streck et al. |
| 7,833,353 | B2 | 11/2010 | Furukawahara et al. |
| 7,838,084 | B2 | 11/2010 | Derderian et al. |
| 7,842,518 | B2 | 11/2010 | Miyajima |
| 7,842,622 | B1 | 11/2010 | Lee et al. |
| D629,874 | S | 12/2010 | Hermans |
| 7,850,449 | B2 | 12/2010 | Yang et al. |
| 7,851,019 | B2 | 12/2010 | Tuominen et al. |
| 7,851,232 | B2 | 12/2010 | van Schravendijk et al. |
| 7,858,519 | B2 | 12/2010 | Liu et al. |
| 7,858,533 | B2 | 12/2010 | Liu et al. |
| 7,865,070 | B2 | 1/2011 | Nakamura |
| 7,871,198 | B2 | 1/2011 | Rempe et al. |
| 7,874,726 | B2 | 1/2011 | Jacobs et al. |
| 7,884,918 | B2 | 2/2011 | Hattori |
| 7,888,233 | B1 | 2/2011 | Gauri |
| D634,329 | S | 3/2011 | Wastrom |
| D634,719 | S | 3/2011 | Yasuda et al. |
| 7,897,215 | B1 | 3/2011 | Fair et al. |
| 7,897,217 | B2 | 3/2011 | Faguet |
| 7,902,582 | B2 | 3/2011 | Forbes et al. |
| 7,906,174 | B1 | 3/2011 | Wu et al. |
| 7,910,288 | B2 | 3/2011 | Abatchev et al. |
| 7,915,139 | B1 | 3/2011 | Lang |
| 7,915,667 | B2 | 3/2011 | Knoefler et al. |
| 7,919,416 | B2 | 4/2011 | Lee et al. |
| 7,925,378 | B2 | 4/2011 | Gilchrist et al. |
| 7,935,940 | B1 | 5/2011 | Smargiassi |
| 7,939,447 | B2 | 5/2011 | Bauer et al. |
| 7,942,969 | B2 | 5/2011 | Riker et al. |
| 7,946,762 | B2 | 5/2011 | Yednak |
| 7,951,262 | B2 | 5/2011 | Koshiishi et al. |
| 7,955,516 | B2 | 6/2011 | Chandrachood et al. |
| 7,955,650 | B2 | 6/2011 | Tsuji |
| 7,957,708 | B2 | 6/2011 | Karschnia et al. |
| 7,963,736 | B2 | 6/2011 | Takizawa et al. |
| 7,967,913 | B2 | 6/2011 | Hua et al. |
| 7,972,980 | B2 | 7/2011 | Lee et al. |
| 7,977,256 | B2 | 7/2011 | Liu et al. |
| 7,981,751 | B2 | 7/2011 | Zhu et al. |
| D643,055 | S | 8/2011 | Takahashi |
| 7,989,736 | B2 | 8/2011 | Park et al. |
| 7,992,318 | B2 | 8/2011 | Kawaji |
| 7,994,721 | B2 | 8/2011 | Espiau et al. |
| 7,997,795 | B2 | 8/2011 | Schwagerman et al. |
| 7,998,875 | B2 | 8/2011 | DeYoung |
| 8,003,174 | B2 | 8/2011 | Fukazawa |
| 8,003,919 | B2 | 8/2011 | Goto et al. |
| 8,004,198 | B2 | 8/2011 | Bakre et al. |
| 8,020,315 | B2 | 9/2011 | Nishimura |
| 8,030,129 | B2 | 10/2011 | Jeong |
| 8,033,771 | B1 | 10/2011 | Gage et al. |
| 8,038,835 | B2 | 10/2011 | Hayashi et al. |
| 8,041,197 | B2 | 10/2011 | Kasai et al. |
| 8,041,450 | B2 | 10/2011 | Takizawa et al. |
| 8,043,972 | B1 | 10/2011 | Liu et al. |
| 8,046,193 | B2 | 10/2011 | Yetter et al. |
| 8,048,783 | B2 | 11/2011 | Chung et al. |
| 8,055,378 | B2 | 11/2011 | Numakura |
| 8,060,252 | B2 | 11/2011 | Gage et al. |
| 8,083,853 | B2 | 11/2011 | Choi et al. |
| D651,291 | S | 12/2011 | Liebson et al. |
| 8,071,451 | B2 | 12/2011 | Berry |
| 8,071,452 | B2 | 12/2011 | Raisanen |
| 8,072,578 | B2 | 12/2011 | Yasuda et al. |
| 8,076,230 | B2 | 12/2011 | Wei |
| 8,076,237 | B2 | 12/2011 | Uzoh |
| 8,076,250 | B1 | 12/2011 | Rajagopalan |
| 8,076,251 | B2 | 12/2011 | Akae et al. |
| 8,078,310 | B2 | 12/2011 | Nishimoto et al. |
| 8,082,946 | B2 | 12/2011 | Laverdiere et al. |
| 8,084,104 | B2 | 12/2011 | Shinriki et al. |
| 8,084,372 | B2 | 12/2011 | You et al. |
| D652,896 | S | 1/2012 | Gether |
| 8,092,604 | B2 | 1/2012 | Tomiyasu et al. |
| 8,100,583 | B2 | 1/2012 | Aggarwal |
| D653,734 | S | 2/2012 | Sisk |
| D654,884 | S | 2/2012 | Honma |
| D655,055 | S | 2/2012 | Toll |
| 8,110,099 | B2 | 2/2012 | Hersey et al. |
| 8,114,734 | B2 | 2/2012 | Yang et al. |
| 8,119,466 | B2 | 2/2012 | Avouris |
| 8,129,290 | B2 | 3/2012 | Balseanu et al. |
| 8,137,462 | B2 | 3/2012 | Fondurulia et al. |
| 8,137,465 | B1 | 3/2012 | Shrinivasan et al. |
| 8,138,104 | B2 | 3/2012 | Balseanu et al. |
| 8,138,676 | B2 | 3/2012 | Mills |
| 8,142,862 | B2 | 3/2012 | Lee et al. |
| 8,143,174 | B2 | 3/2012 | Xia et al. |
| 8,147,242 | B2 | 4/2012 | Shibagaki et al. |
| 8,158,512 | B2 | 4/2012 | Ji et al. |
| 8,172,947 | B2 | 5/2012 | Shibata et al. |
| 8,173,554 | B2 | 5/2012 | Lee et al. |
| 8,178,436 | B2 | 5/2012 | King et al. |
| 8,187,679 | B2 | 5/2012 | Dickey et al. |
| 8,187,951 | B1 | 5/2012 | Wang |
| 8,192,901 | B2 | 6/2012 | Kageyama |
| 8,196,234 | B2 | 6/2012 | Glunk |
| 8,197,915 | B2 | 6/2012 | Oka et al. |
| 8,198,168 | B2 | 6/2012 | Tanioku |
| 8,216,380 | B2 | 7/2012 | White et al. |

(56) References Cited

U.S. PATENT DOCUMENTS

| | | | |
|---|---|---|---|
| 8,231,799 | B2 | 7/2012 | Bera et al. |
| D665,055 | S | 8/2012 | Yanagisawa et al. |
| 8,241,991 | B2 | 8/2012 | Hsieh et al. |
| 8,242,028 | B1 | 8/2012 | van Schravendijk |
| 8,242,031 | B2 | 8/2012 | Mallick et al. |
| 8,246,900 | B2 | 8/2012 | Kasai et al. |
| 8,252,114 | B2 | 8/2012 | Vukovic |
| 8,252,659 | B2 | 8/2012 | Huyghabaert et al. |
| 8,252,691 | B2 | 8/2012 | Beynet et al. |
| 8,267,633 | B2 | 9/2012 | Obikane |
| 8,272,516 | B2 | 9/2012 | Salvador |
| 8,278,176 | B2 | 10/2012 | Bauer et al. |
| 8,282,769 | B2 | 10/2012 | Iizuka |
| 8,282,847 | B2 | 10/2012 | Romano |
| 8,287,648 | B2 | 10/2012 | Reed et al. |
| 8,293,016 | B2 | 10/2012 | Bahng et al. |
| 8,293,642 | B2 | 10/2012 | Kim |
| 8,298,951 | B1 | 10/2012 | Nakano |
| 8,307,472 | B1 | 11/2012 | Saxon et al. |
| 8,309,173 | B2 | 11/2012 | Tuominen et al. |
| 8,323,413 | B2 | 12/2012 | Son |
| 8,328,939 | B2 | 12/2012 | Choi et al. |
| 8,329,599 | B2 | 12/2012 | Fukazawa et al. |
| 8,334,219 | B2 | 12/2012 | Lee et al. |
| 8,349,083 | B2 | 1/2013 | Takasuka et al. |
| D676,943 | S | 2/2013 | Kluss |
| 8,367,528 | B2 | 2/2013 | Bauer et al. |
| 8,372,204 | B2 | 2/2013 | Nakamura |
| 8,378,464 | B2 | 2/2013 | Kato et al. |
| 8,393,091 | B2 | 3/2013 | Kawamoto |
| 8,394,466 | B2 | 3/2013 | Hong et al. |
| 8,398,773 | B2 | 3/2013 | Jdira et al. |
| 8,404,499 | B2 | 3/2013 | Moffatt |
| 8,415,258 | B2 | 4/2013 | Akae |
| 8,415,259 | B2 | 4/2013 | Lee et al. |
| 8,440,259 | B2 | 5/2013 | Chiang et al. |
| 8,444,120 | B2 | 5/2013 | Gregg et al. |
| 8,445,075 | B2 | 5/2013 | Xu et al. |
| 8,450,191 | B2 | 5/2013 | Wang |
| 8,465,811 | B2 | 6/2013 | Ueda |
| 8,466,411 | B2 | 6/2013 | Arai |
| 8,470,187 | B2 | 6/2013 | Ha |
| 8,484,846 | B2 | 7/2013 | Dhindsa |
| 8,492,170 | B2 | 7/2013 | Xie et al. |
| 8,496,377 | B2 | 7/2013 | Harr et al. |
| 8,496,756 | B2 | 7/2013 | Cruse et al. |
| 8,497,213 | B2 | 7/2013 | Yasui et al. |
| 8,501,599 | B2 | 8/2013 | Ueno et al. |
| 8,506,162 | B2 | 8/2013 | Schick et al. |
| 8,506,713 | B2 | 8/2013 | Takagi |
| 8,529,701 | B2 | 9/2013 | Morita |
| 8,535,767 | B1 | 9/2013 | Kimura |
| D691,974 | S | 10/2013 | Osada et al. |
| 8,551,892 | B2 | 10/2013 | Nakano |
| 8,562,272 | B2 | 10/2013 | Lenz |
| 8,563,443 | B2 | 10/2013 | Fukazawa |
| 8,569,184 | B2 | 10/2013 | Oka |
| 8,586,484 | B2 | 11/2013 | Matsuyama et al. |
| 8,591,659 | B1 | 11/2013 | Fang et al. |
| 8,592,005 | B2 | 11/2013 | Ueda |
| D695,240 | S | 12/2013 | Iida et al. |
| 8,608,885 | B2 | 12/2013 | Goto et al. |
| 8,614,047 | B2 | 12/2013 | Ayothi et al. |
| 8,616,765 | B2 | 12/2013 | Darabnia et al. |
| 8,617,411 | B2 | 12/2013 | Singh |
| 8,633,115 | B2 | 1/2014 | Chang et al. |
| D698,904 | S | 2/2014 | Milligan et al. |
| 8,642,488 | B2 | 2/2014 | Liu et al. |
| 8,647,722 | B2 | 2/2014 | Kobayashi et al. |
| 8,664,627 | B1 | 3/2014 | Ishikawa et al. |
| 8,667,654 | B2 | 3/2014 | Gros-Jean |
| 8,668,957 | B2 | 3/2014 | Dussarrat et al. |
| 8,669,185 | B2 | 3/2014 | Onizawa |
| 8,679,958 | B2 | 3/2014 | Takamure et al. |
| D702,188 | S | 4/2014 | Jacobs |
| 8,683,943 | B2 | 4/2014 | Onodera et al. |
| 8,710,580 | B2 | 4/2014 | Sakuma et al. |
| 8,711,338 | B2 | 4/2014 | Liu et al. |
| D705,745 | S | 5/2014 | Kurs et al. |
| D705,762 | S | 5/2014 | Yu |
| 8,664,127 | B2 | 5/2014 | Bhatia et al. |
| 8,720,965 | B2 | 5/2014 | Hino et al. |
| 8,721,791 | B2 | 5/2014 | Choi et al. |
| 8,722,510 | B2 | 5/2014 | Watanabe et al. |
| 8,722,546 | B2 | 5/2014 | Fukazawa et al. |
| 8,726,837 | B2 | 5/2014 | Patalay et al. |
| 8,728,832 | B2 | 5/2014 | Raisanen et al. |
| 8,742,668 | B2 | 6/2014 | Nakano et al. |
| 8,759,223 | B2 | 6/2014 | Sapre et al. |
| 8,764,085 | B2 | 7/2014 | Urabe |
| 8,771,807 | B2 | 7/2014 | Xiao et al. |
| 8,779,502 | B2 | 7/2014 | Sakuma et al. |
| 8,784,950 | B2 | 7/2014 | Fukazawa et al. |
| 8,784,951 | B2 | 7/2014 | Fukazawa et al. |
| 8,785,215 | B2 | 7/2014 | Kobayashi et al. |
| 8,785,311 | B2 | 7/2014 | Miyoshi |
| 8,790,743 | B1 | 7/2014 | Omari |
| 8,790,749 | B2 | 7/2014 | Omori et al. |
| 8,802,201 | B2 | 8/2014 | Raisanen et al. |
| 8,820,809 | B2 | 9/2014 | Ando et al. |
| 8,821,640 | B2 | 9/2014 | Cleary et al. |
| 8,841,182 | B1 | 9/2014 | Chen et al. |
| 8,845,806 | B2 | 9/2014 | Aida et al. |
| 8,846,502 | B2 | 9/2014 | Haukka et al. |
| D715,410 | S | 10/2014 | Lohmann |
| 8,864,202 | B1 | 10/2014 | Schrameyer |
| D716,742 | S | 11/2014 | Jang et al. |
| 8,877,655 | B2 | 11/2014 | Shero et al. |
| 8,882,923 | B2 | 11/2014 | Saido et al. |
| 8,883,270 | B2 | 11/2014 | Shero et al. |
| 8,901,016 | B2 | 12/2014 | Jeongseok et al. |
| 8,911,553 | B2 | 12/2014 | Baluja et al. |
| 8,911,826 | B2 | 12/2014 | Adachi et al. |
| 8,912,101 | B2 | 12/2014 | Tsuji et al. |
| D720,838 | S | 1/2015 | Yamagishi et al. |
| 8,927,906 | B2 | 1/2015 | Tadokoro et al. |
| 8,933,375 | B2 | 1/2015 | Dunn et al. |
| 8,940,646 | B1 | 1/2015 | Chandrasekharan |
| D723,153 | S | 2/2015 | Borkholder |
| 8,945,305 | B2 | 2/2015 | Marsh |
| 8,945,306 | B2 | 2/2015 | Tsuda |
| 8,945,339 | B2 | 2/2015 | Kakimoto |
| 8,946,830 | B2 | 2/2015 | Jung et al. |
| 8,956,971 | B2 | 2/2015 | Huakka |
| 8,956,983 | B2 | 2/2015 | Swaminathan |
| D723,330 | S | 3/2015 | York |
| D724,553 | S | 3/2015 | Choi |
| D724,701 | S | 3/2015 | Yamagishi et al. |
| D725,168 | S | 3/2015 | Yamagishi |
| 8,967,608 | B2 | 3/2015 | Mitsumori et al. |
| 8,974,868 | B2 | 3/2015 | Ishikawa et al. |
| 8,986,456 | B2 | 3/2015 | Fondurulia et al. |
| 8,991,214 | B2 | 3/2015 | Hoshino et al. |
| 8,991,887 | B2 | 3/2015 | Shin et al. |
| 8,993,054 | B2 | 3/2015 | Jung et al. |
| 8,993,457 | B1 | 3/2015 | Ramkumar et al. |
| D726,365 | S | 4/2015 | Weigensberg |
| D726,884 | S | 4/2015 | Yamagishi et al. |
| 8,999,102 | B2 | 4/2015 | Miyoshi et al. |
| 9,005,539 | B2 | 4/2015 | Halpin et al. |
| 9,017,481 | B1 | 4/2015 | Pettinger et al. |
| 9,017,933 | B2 | 4/2015 | Liu et al. |
| 9,018,093 | B2 | 4/2015 | Tsuji et al. |
| 9,018,111 | B2 | 4/2015 | Milligan et al. |
| 9,018,567 | B2 | 4/2015 | de Ridder et al. |
| 9,021,985 | B2 | 5/2015 | Alokozai et al. |
| 9,023,737 | B2 | 5/2015 | Beynet et al. |
| 9,023,738 | B2 | 5/2015 | Kato et al. |
| 9,029,253 | B2 | 5/2015 | Milligan et al. |
| 9,029,272 | B1 | 5/2015 | Nakano |
| D732,145 | S | 6/2015 | Yamagishi |
| D732,644 | S | 6/2015 | Yamagishi et al. |
| D733,261 | S | 6/2015 | Yamagishi et al. |
| D733,262 | S | 7/2015 | Yamagishi et al. |

(56) References Cited

U.S. PATENT DOCUMENTS

| | | | |
|---|---|---|---|
| D733,843 | S | 7/2015 | Yamagishi |
| D734,377 | S | 7/2015 | Hirakida |
| D735,836 | S | 8/2015 | Yamagishi et al. |
| 9,096,931 | B2 | 8/2015 | Yednak et al. |
| 9,099,505 | B2 | 8/2015 | Kusakabe et al. |
| 9,111,972 | B2 | 8/2015 | Takeshita et al. |
| 9,117,657 | B2 | 8/2015 | Nakano et al. |
| 9,117,866 | B2 | 8/2015 | Marquardt et al. |
| D739,222 | S | 9/2015 | Chadbourne |
| 9,123,510 | B2 | 9/2015 | Nakano et al. |
| 9,123,577 | B2 | 9/2015 | Fujimoto et al. |
| 9,129,897 | B2 | 9/2015 | Pore et al. |
| 9,136,108 | B2 | 9/2015 | Matsushita et al. |
| 9,136,180 | B2 | 9/2015 | Machkaoutsan |
| 9,142,393 | B2 | 9/2015 | Okabe et al. |
| 9,142,437 | B2 | 9/2015 | Fosnight et al. |
| 9,153,441 | B2 | 10/2015 | Takamure et al. |
| 9,166,012 | B2 | 10/2015 | Sim et al. |
| 9,169,975 | B2 | 10/2015 | Sarin et al. |
| 9,171,714 | B2 | 10/2015 | Mori |
| 9,171,716 | B2 | 10/2015 | Fukuda |
| D742,202 | S | 11/2015 | Cyphers et al. |
| D743,357 | S | 11/2015 | Vyne |
| D743,513 | S | 11/2015 | Yamagishi |
| 9,174,178 | B2 | 11/2015 | Yudovsky et al. |
| 9,175,394 | B2 | 11/2015 | Berger et al. |
| 9,177,784 | B2 | 11/2015 | Raisanen et al. |
| 9,184,047 | B2 | 11/2015 | Liu et al. |
| 9,190,263 | B2 | 11/2015 | Ishikawa et al. |
| 9,190,264 | B2 | 11/2015 | Yuasa et al. |
| 9,196,483 | B1 | 11/2015 | Lee et al. |
| 9,202,727 | B2 | 12/2015 | Dunn et al. |
| 9,214,333 | B1 | 12/2015 | Sims et al. |
| 9,228,259 | B2 | 1/2016 | Haukka et al. |
| 9,240,412 | B2 | 1/2016 | Xie et al. |
| 9,245,742 | B2 | 1/2016 | Haukka |
| 9,252,024 | B2 | 2/2016 | Lam et al. |
| 9,257,274 | B2 | 2/2016 | Kang et al. |
| 9,263,298 | B2 | 2/2016 | Matsumoto et al. |
| 9,267,850 | B2 | 2/2016 | Aggarwal |
| 9,281,277 | B2 | 3/2016 | Baek et al. |
| 9,284,642 | B2 | 3/2016 | Nakano |
| 9,297,705 | B2 | 3/2016 | Aggarwal |
| 9,299,557 | B2 | 3/2016 | Tolle et al. |
| 9,299,595 | B2 | 3/2016 | Dunn et al. |
| D753,269 | S | 4/2016 | Yamagishi et al. |
| D753,629 | S | 4/2016 | Plattard |
| 9,305,836 | B1 | 4/2016 | Gates et al. |
| 9,312,155 | B2 | 4/2016 | Mori |
| 9,315,897 | B2 | 4/2016 | Byun |
| 9,324,811 | B2 | 4/2016 | Weeks |
| 9,324,846 | B1 | 4/2016 | Camillo |
| 9,337,054 | B2 | 5/2016 | Hunks et al. |
| 9,341,296 | B2 | 5/2016 | Yednak |
| 9,343,297 | B1 | 5/2016 | Fukazawa et al. |
| 9,343,308 | B2 | 5/2016 | Isii |
| 9,343,343 | B2 | 5/2016 | Mori |
| 9,343,350 | B2 | 5/2016 | Arai |
| 9,349,620 | B2 | 5/2016 | Kamata et al. |
| 9,353,441 | B2 | 5/2016 | Chung |
| 9,355,876 | B2 | 5/2016 | Rejuter et al. |
| 9,365,924 | B2 | 6/2016 | Nonaka |
| 9,368,352 | B2 | 6/2016 | Takamure et al. |
| 9,370,863 | B2 | 6/2016 | Tsuji et al. |
| 9,384,987 | B2 | 7/2016 | Jung et al. |
| 9,390,909 | B2 | 7/2016 | Pasquale et al. |
| 9,394,608 | B2 | 7/2016 | Shero et al. |
| 9,396,934 | B2 | 7/2016 | Tolle |
| 9,396,956 | B1 | 7/2016 | Fukazawa |
| 9,404,587 | B2 | 8/2016 | Shugrue |
| 9,412,564 | B2 | 8/2016 | Milligan |
| 9,412,582 | B2 | 8/2016 | Sasaki et al. |
| 9,425,078 | B2 | 8/2016 | Tang et al. |
| 9,443,725 | B2 | 9/2016 | Liu et al. |
| 9,447,498 | B2 | 9/2016 | Shiba et al. |
| 9,449,793 | B2 | 9/2016 | Shaji et al. |
| 9,455,138 | B1 | 9/2016 | Fukazawa |
| 9,464,352 | B2 | 10/2016 | Nakano et al. |
| 9,478,414 | B2 | 10/2016 | Kobayashi et al. |
| 9,478,415 | B2 | 10/2016 | Kimura |
| D770,993 | S | 11/2016 | Yoshida et al. |
| 9,484,191 | B2 | 11/2016 | Winkler |
| 9,514,927 | B2 | 12/2016 | Tolle et al. |
| 9,514,932 | B2 | 12/2016 | Mallick et al. |
| 9,543,180 | B2 | 1/2017 | Kamiya |
| 9,556,516 | B2 | 1/2017 | Takamure |
| 9,558,931 | B2 | 1/2017 | Tang |
| 9,564,314 | B2 | 2/2017 | Takamure et al. |
| 9,574,268 | B1 | 2/2017 | Dunn et al. |
| 9,589,770 | B2 | 3/2017 | Winkler |
| 9,605,342 | B2 | 3/2017 | Alokozai et al. |
| 9,605,343 | B2 | 3/2017 | Winkler |
| 9,607,837 | B1 | 3/2017 | Namba |
| D783,351 | S | 4/2017 | Fujino et al. |
| 9,613,801 | B2 | 4/2017 | Carcasi et al. |
| 9,627,221 | B1 | 4/2017 | Zaitsu et al. |
| D785,766 | S | 5/2017 | Sato |
| D787,458 | S | 5/2017 | Kim et al. |
| 9,640,416 | B2 | 5/2017 | Arai |
| 9,640,448 | B2 | 5/2017 | Ikegawa et al. |
| 9,647,114 | B2 | 5/2017 | Margetis |
| 9,657,845 | B2 | 5/2017 | Shugrue |
| 9,659,799 | B2 | 5/2017 | Lawson |
| 9,663,857 | B2 | 5/2017 | Nakano et al. |
| D789,888 | S | 6/2017 | Jang et al. |
| 9,685,320 | B2 | 6/2017 | Kang et al. |
| 9,691,771 | B2 | 6/2017 | Lansalot-Matras |
| 9,698,031 | B2 | 7/2017 | Kobayashi et al. |
| 9,708,707 | B2 | 7/2017 | Ditizio et al. |
| 9,708,708 | B2 | 7/2017 | Isobe et al. |
| 9,711,345 | B2 | 7/2017 | Shiba et al. |
| D793,352 | S | 8/2017 | Hill |
| D793,572 | S | 8/2017 | Kozuka et al. |
| 9,735,024 | B2 | 8/2017 | Zaitsu |
| 9,741,559 | B2 | 8/2017 | Shimura et al. |
| 9,748,145 | B1 | 8/2017 | Kannan et al. |
| D796,458 | S | 9/2017 | Jang et al. |
| 9,754,779 | B1 | 9/2017 | Ishikawa |
| 9,754,818 | B2 | 9/2017 | Shiu et al. |
| 9,759,489 | B2 | 9/2017 | Kaneko |
| 9,790,595 | B2 | 10/2017 | Jung et al. |
| 9,793,115 | B2 | 10/2017 | Tolle |
| 9,793,135 | B1 | 10/2017 | Zaitsu et al. |
| 9,793,148 | B2 | 10/2017 | Yamagishi et al. |
| D802,546 | S | 11/2017 | Jang et al. |
| 9,808,246 | B2 | 11/2017 | Shelton et al. |
| 9,812,319 | B1 | 11/2017 | Fukazawa et al. |
| 9,812,320 | B1 | 11/2017 | Pore et al. |
| 9,859,151 | B1 | 1/2018 | Niskanen |
| 9,875,891 | B2 | 1/2018 | Henri et al. |
| 9,887,082 | B1 | 2/2018 | Pore et al. |
| 9,890,456 | B2 | 2/2018 | Tolle et al. |
| 9,891,521 | B2 | 2/2018 | Kang et al. |
| 9,892,908 | B2 | 2/2018 | Pettinger et al. |
| 9,892,913 | B2 | 2/2018 | Margetis et al. |
| 9,895,715 | B2 | 2/2018 | Haukka et al. |
| 9,899,291 | B2 | 2/2018 | Kato |
| 9,899,405 | B2 | 2/2018 | Kim |
| 9,905,420 | B2 | 2/2018 | Margetis et al. |
| 9,909,492 | B2 | 2/2018 | Tang |
| 9,909,214 | B2 | 3/2018 | Suemori |
| 9,911,676 | B2 | 3/2018 | Tang |
| 9,916,980 | B1 | 3/2018 | Knaepen |
| 9,929,011 | B2 | 3/2018 | Hawryluk et al. |
| 9,960,072 | B2 | 5/2018 | Coomer |
| 9,984,869 | B1 | 5/2018 | Blanquart |
| 10,032,628 | B2 | 6/2018 | Xie et al. |
| 10,023,960 | B2 | 7/2018 | Alokozai |
| 10,032,792 | B2 | 7/2018 | Kim et al. |
| 10,043,661 | B2 | 8/2018 | Kato et al. |
| 10,053,774 | B2 | 8/2018 | Tolle et al. |
| 10,083,836 | B2 | 9/2018 | Milligan |
| D830,981 | S | 10/2018 | Jeong et al. |
| 10,087,522 | B2 | 10/2018 | Raisanen et al. |

(56) References Cited

U.S. PATENT DOCUMENTS

| | | | |
|---|---|---|---|
| 10,087,525 | B2 | 10/2018 | Schmotzer et al. |
| 10,090,316 | B2 | 10/2018 | Ootsuka |
| 10,103,040 | B1 | 10/2018 | Oosterlaken et al. |
| 10,134,757 | B2 | 11/2018 | Chun et al. |
| RE47,170 | E | 12/2018 | Beynet et al. |
| 10,167,557 | B2 | 1/2019 | Hawkins et al. |
| 2001/0001953 | A1 | 5/2001 | Griffiths et al. |
| 2001/0003191 | A1 | 6/2001 | Kovacs et al. |
| 2001/0006070 | A1 | 7/2001 | Shang |
| 2001/0007645 | A1 | 7/2001 | Honma |
| 2001/0014514 | A1 | 8/2001 | Geusic |
| 2001/0017103 | A1 | 8/2001 | Takeshita et al. |
| 2001/0018267 | A1 | 8/2001 | Shinriki et al. |
| 2001/0019777 | A1 | 9/2001 | Tanaka et al. |
| 2001/0019900 | A1 | 9/2001 | Hasegawa |
| 2001/0020715 | A1 | 9/2001 | Yamasaki |
| 2001/0028924 | A1 | 10/2001 | Sherman |
| 2001/0031535 | A1 | 10/2001 | Agnello et al. |
| 2001/0038783 | A1 | 11/2001 | Nakashima et al. |
| 2001/0040511 | A1 | 11/2001 | Bushner et al. |
| 2001/0046765 | A1 | 11/2001 | Cappellani et al. |
| 2001/0048981 | A1 | 12/2001 | Suzuki |
| 2001/0049080 | A1 | 12/2001 | Asano |
| 2001/0049202 | A1 | 12/2001 | Maeda et al. |
| 2002/0001974 | A1 | 1/2002 | Chan |
| 2002/0001976 | A1 | 1/2002 | Danek |
| 2002/0005400 | A1 | 1/2002 | Gat et al. |
| 2002/0009119 | A1 | 1/2002 | Matthew et al. |
| 2002/0011210 | A1 | 1/2002 | Satoh et al. |
| 2002/0011211 | A1 | 1/2002 | Halpin |
| 2002/0013792 | A1 | 1/2002 | Imielinski et al. |
| 2002/0014204 | A1 | 2/2002 | Pyo |
| 2002/0014483 | A1 | 2/2002 | Suzuki et al. |
| 2002/0016829 | A1 | 2/2002 | Defosse |
| 2002/0023677 | A1 | 2/2002 | Zheng |
| 2002/0031644 | A1 | 3/2002 | Malofsky et al. |
| 2002/0041931 | A1 | 4/2002 | Suntola et al. |
| 2002/0043337 | A1 | 4/2002 | Goodman et al. |
| 2002/0081826 | A1 | 4/2002 | Rotondaro et al. |
| 2002/0064592 | A1 | 5/2002 | Datta et al. |
| 2002/0064598 | A1 | 5/2002 | Wang et al. |
| 2002/0069222 | A1 | 6/2002 | McNeely |
| 2002/0076507 | A1* | 6/2002 | Chiang et al. ................ 427/569 |
| 2002/0078893 | A1 | 6/2002 | Van Os et al. |
| 2002/0079714 | A1 | 6/2002 | Soucy et al. |
| 2002/0088542 | A1 | 7/2002 | Nishikawa et al. |
| 2002/0096211 | A1 | 7/2002 | Zheng |
| 2002/0098627 | A1 | 7/2002 | Pomarede et al. |
| 2002/0108670 | A1 | 8/2002 | Baker et al. |
| 2002/0109115 | A1 | 8/2002 | Cederstav et al. |
| 2002/0110695 | A1 | 8/2002 | Yang et al. |
| 2002/0110991 | A1 | 8/2002 | Li |
| 2002/0112114 | A1 | 8/2002 | Blair et al. |
| 2002/0114886 | A1 | 8/2002 | Chou et al. |
| 2002/0115252 | A1 | 8/2002 | Haukka et al. |
| 2002/0124883 | A1 | 9/2002 | Zheng |
| 2002/0127350 | A1 | 9/2002 | Ishikawa et al. |
| 2002/0134511 | A1 | 9/2002 | Ushioda et al. |
| 2002/0136214 | A1 | 9/2002 | Do et al. |
| 2002/0136909 | A1 | 9/2002 | Yang |
| 2002/0139775 | A1 | 10/2002 | Chang |
| 2002/0146512 | A1 | 10/2002 | Rossman |
| 2002/0151327 | A1 | 10/2002 | Levitt |
| 2002/0152244 | A1 | 10/2002 | Dean et al. |
| 2002/0155219 | A1 | 10/2002 | Wang et al. |
| 2002/0164420 | A1 | 11/2002 | Derderian et al. |
| 2002/0172768 | A1 | 11/2002 | Endo et al. |
| 2002/0174106 | A1 | 11/2002 | Martin |
| 2002/0179011 | A1 | 12/2002 | Jonnalagadda et al. |
| 2002/0184111 | A1 | 12/2002 | Swanson |
| 2002/0187650 | A1 | 12/2002 | Blalock et al. |
| 2002/0187656 | A1 | 12/2002 | Tan et al. |
| 2002/0197849 | A1 | 12/2002 | Mandal |
| 2003/0002562 | A1 | 1/2003 | Yerlikaya et al. |
| 2003/0003607 | A1 | 1/2003 | Kagoshima |
| 2003/0003635 | A1 | 1/2003 | Paranjpe et al. |
| 2003/0003696 | A1 | 1/2003 | Gelatos et al. |
| 2003/0010451 | A1 | 1/2003 | Tzu |
| 2003/0010452 | A1 | 1/2003 | Park et al. |
| 2003/0012632 | A1 | 1/2003 | Saeki |
| 2003/0015294 | A1 | 1/2003 | Wang |
| 2003/0015596 | A1 | 1/2003 | Evans |
| 2003/0017268 | A1 | 1/2003 | Hu |
| 2003/0019428 | A1 | 1/2003 | Ku et al. |
| 2003/0019580 | A1 | 1/2003 | Strang |
| 2003/0022468 | A1 | 1/2003 | Shioya et al. |
| 2003/0022523 | A1 | 1/2003 | Irino et al. |
| 2003/0023338 | A1 | 1/2003 | Chin et al. |
| 2003/0024901 | A1 | 2/2003 | Ishikawa |
| 2003/0025146 | A1 | 2/2003 | Narwankar et al. |
| 2003/0029303 | A1 | 2/2003 | Hasegawa et al. |
| 2003/0029381 | A1 | 2/2003 | Nishibayashi |
| 2003/0029475 | A1 | 2/2003 | Hua et al. |
| 2003/0035002 | A1 | 2/2003 | Moles |
| 2003/0036272 | A1 | 2/2003 | Shamouilian et al. |
| 2003/0040158 | A1 | 2/2003 | Saitoh |
| 2003/0040841 | A1 | 2/2003 | Nasr et al. |
| 2003/0042419 | A1 | 3/2003 | Katsumata et al. |
| 2003/0049372 | A1 | 3/2003 | Cook et al. |
| 2003/0049375 | A1 | 3/2003 | Nguyen et al. |
| 2003/0049937 | A1 | 3/2003 | Suzuki |
| 2003/0054670 | A1 | 3/2003 | Wang et al. |
| 2003/0059535 | A1 | 3/2003 | Luo et al. |
| 2003/0059980 | A1 | 3/2003 | Chen et al. |
| 2003/0065413 | A1 | 4/2003 | Liteplo et al. |
| 2003/0066541 | A1 | 4/2003 | Sun et al. |
| 2003/0066826 | A1 | 4/2003 | Lee et al. |
| 2003/0071015 | A1 | 4/2003 | Chinn et al. |
| 2003/0075925 | A1 | 4/2003 | Lindfors et al. |
| 2003/0082296 | A1 | 5/2003 | Elers et al. |
| 2003/0082307 | A1 | 5/2003 | Chung et al. |
| 2003/0091938 | A1 | 5/2003 | Fairbairn et al. |
| 2003/0094133 | A1 | 5/2003 | Yoshidome et al. |
| 2003/0109107 | A1 | 6/2003 | Hsieh et al. |
| 2003/0109951 | A1 | 6/2003 | Hsiung et al. |
| 2003/0111963 | A1 | 6/2003 | Tolmachev et al. |
| 2003/0116087 | A1 | 6/2003 | Nguyen |
| 2003/0168750 | A1 | 6/2003 | Basceri et al. |
| 2003/0121608 | A1 | 7/2003 | Chen |
| 2003/0133854 | A1 | 7/2003 | Tabata et al. |
| 2003/0134038 | A1* | 7/2003 | Paranjpe .................... 427/248.1 |
| 2003/0141820 | A1 | 7/2003 | White et al. |
| 2003/0143328 | A1 | 7/2003 | Chen |
| 2003/0157436 | A1 | 8/2003 | Manger et al. |
| 2003/0159656 | A1 | 8/2003 | Tan |
| 2003/0162412 | A1 | 8/2003 | Chung |
| 2003/0168001 | A1 | 9/2003 | Sneh |
| 2003/0168699 | A1 | 9/2003 | Honda |
| 2003/0170583 | A1 | 9/2003 | Nakashima |
| 2003/0173490 | A1 | 9/2003 | Lappen |
| 2003/0180458 | A1 | 9/2003 | Sneh |
| 2003/0183156 | A1 | 10/2003 | Dando |
| 2003/0183856 | A1 | 10/2003 | Wieczorek et al. |
| 2003/0188685 | A1 | 10/2003 | Wang |
| 2003/0192875 | A1 | 10/2003 | Bieker et al. |
| 2003/0198587 | A1* | 10/2003 | Kaloyeros et al. ........... 423/409 |
| 2003/0201541 | A1 | 10/2003 | Kim |
| 2003/0205202 | A1 | 11/2003 | Funaki et al. |
| 2003/0209323 | A1 | 11/2003 | Yokogaki |
| 2003/0209326 | A1 | 11/2003 | Lee et al. |
| 2003/0209746 | A1 | 11/2003 | Horii |
| 2003/0211735 | A1 | 11/2003 | Rossman |
| 2003/0217915 | A1 | 11/2003 | Ouellet |
| 2003/0219972 | A1 | 11/2003 | Green |
| 2003/0226840 | A1 | 12/2003 | Dalton |
| 2003/0228772 | A1 | 12/2003 | Cowans |
| 2003/0231698 | A1 | 12/2003 | Yamaguchi |
| 2003/0232138 | A1 | 12/2003 | Tuominen et al. |
| 2003/0232491 | A1 | 12/2003 | Yamaguchi |
| 2004/0002224 | A1 | 1/2004 | Chono et al. |
| 2004/0009307 | A1 | 1/2004 | Koh et al. |
| 2004/0009679 | A1 | 1/2004 | Yeo et al. |
| 2004/0010772 | A1 | 1/2004 | McKenna et al. |
| 2004/0013577 | A1 | 1/2004 | Ganguli et al. |

(56) References Cited

U.S. PATENT DOCUMENTS

| | | | |
|---|---|---|---|
| 2004/0013818 | A1 | 1/2004 | Moon et al. |
| 2004/0016637 | A1 | 1/2004 | Yang |
| 2004/0018304 | A1 | 1/2004 | Chung et al. |
| 2004/0018307 | A1 | 1/2004 | Park et al. |
| 2004/0018723 | A1 | 1/2004 | Byun et al. |
| 2004/0018750 | A1 | 1/2004 | Sophie et al. |
| 2004/0023516 | A1 | 2/2004 | Londergan et al. |
| 2004/0026372 | A1 | 2/2004 | Takenaka et al. |
| 2004/0029052 | A1 | 2/2004 | Park et al. |
| 2004/0036129 | A1 | 2/2004 | Forbes et al. |
| 2004/0037675 | A1 | 2/2004 | Zinger et al. |
| 2004/0048439 | A1 | 3/2004 | Soman |
| 2004/0048492 | A1 | 3/2004 | Ishikawa et al. |
| 2004/0050325 | A1 | 3/2004 | Samoilov |
| 2004/0062081 | A1 | 4/2004 | Drewes |
| 2004/0063289 | A1 | 4/2004 | Ohta |
| 2004/0071897 | A1 | 4/2004 | Verplancken et al. |
| 2004/0077182 | A1 | 4/2004 | Lim et al. |
| 2004/0079960 | A1 | 4/2004 | Shakuda |
| 2004/0080697 | A1 | 4/2004 | Song |
| 2004/0082171 | A1 | 4/2004 | Shin et al. |
| 2004/0087141 | A1 | 5/2004 | Ramanathan et al. |
| 2004/0094402 | A1 | 5/2004 | Gopalraja |
| 2004/0099213 | A1 | 5/2004 | Adomaitis et al. |
| 2004/0101622 | A1 | 5/2004 | Park et al. |
| 2004/0103914 | A1 | 6/2004 | Cheng et al. |
| 2004/0106249 | A1 | 6/2004 | Huotari |
| 2004/0124131 | A1 | 7/2004 | Aitchison |
| 2004/0124549 | A1 | 7/2004 | Curran |
| 2004/0126990 | A1 | 7/2004 | Ohta |
| 2004/0129211 | A1 | 7/2004 | Blonigan et al. |
| 2004/0129671 | A1 | 7/2004 | Ji et al. |
| 2004/0134429 | A1 | 7/2004 | Yamanaka |
| 2004/0144311 | A1 | 7/2004 | Chen |
| 2004/0144980 | A1 | 7/2004 | Ahn et al. |
| 2004/0146644 | A1 | 7/2004 | Xia et al. |
| 2004/0151844 | A1* | 8/2004 | Zhang et al. ................. 427/569 |
| 2004/0151845 | A1 | 8/2004 | Nguyen et al. |
| 2004/0152287 | A1 | 8/2004 | Sherrill et al. |
| 2004/0159343 | A1 | 8/2004 | Shimbara et al. |
| 2004/0168627 | A1 | 9/2004 | Conley et al. |
| 2004/0169032 | A1 | 9/2004 | Murayama et al. |
| 2004/0187777 | A1 | 9/2004 | Okamoto et al. |
| 2004/0187790 | A1 | 9/2004 | Bader |
| 2004/0187928 | A1 | 9/2004 | Ambrosina |
| 2004/0198069 | A1 | 10/2004 | Metzner et al. |
| 2004/0200499 | A1 | 10/2004 | Harvey et al. |
| 2004/0203251 | A1 | 10/2004 | Kawaguchi et al. |
| 2004/0206305 | A1 | 10/2004 | Choi et al. |
| 2004/0209477 | A1 | 10/2004 | Buxbaum et al. |
| 2004/0211357 | A1 | 10/2004 | Gadgil |
| 2004/0212947 | A1 | 10/2004 | Nguyen |
| 2004/0213921 | A1 | 10/2004 | Leu |
| 2004/0214399 | A1 | 10/2004 | Ahn et al. |
| 2004/0214445 | A1 | 10/2004 | Shimizu et al. |
| 2004/0217217 | A1 | 11/2004 | Han et al. |
| 2004/0219793 | A1 | 11/2004 | Hishiya et al. |
| 2004/0221807 | A1 | 11/2004 | Verghese et al. |
| 2004/0231600 | A1 | 11/2004 | Lee |
| 2004/0238523 | A1 | 12/2004 | Kuibira et al. |
| 2004/0241998 | A1 | 12/2004 | Hanson |
| 2004/0247779 | A1 | 12/2004 | Selvamanickam et al. |
| 2004/0250600 | A1 | 12/2004 | Bevers et al. |
| 2004/0253867 | A1 | 12/2004 | Matsumoto |
| 2004/0261712 | A1 | 12/2004 | Hayashi et al. |
| 2004/0266011 | A1 | 12/2004 | Lee et al. |
| 2005/0000428 | A1 | 1/2005 | Shero et al. |
| 2005/0003662 | A1 | 1/2005 | Jurisch et al. |
| 2005/0008799 | A1 | 1/2005 | Tomiyasu et al. |
| 2005/0019026 | A1 | 1/2005 | Wang et al. |
| 2005/0019494 | A1 | 1/2005 | Moghadam et al. |
| 2005/0020071 | A1 | 1/2005 | Sonobe et al. |
| 2005/0023624 | A1 | 2/2005 | Ahn et al. |
| 2005/0034674 | A1 | 2/2005 | Ono |
| 2005/0037154 | A1 | 2/2005 | Koh et al. |
| 2005/0037610 | A1 | 2/2005 | Cha |
| 2005/0042778 | A1 | 2/2005 | Peukert |
| 2005/0048797 | A1 | 3/2005 | Fukazawa |
| 2005/0051093 | A1 | 3/2005 | Makino et al. |
| 2005/0054228 | A1 | 3/2005 | March |
| 2005/0059262 | A1 | 3/2005 | Yin et al. |
| 2005/0064207 | A1 | 3/2005 | Senzaki et al. |
| 2005/0064719 | A1 | 3/2005 | Liu |
| 2005/0066893 | A1 | 3/2005 | Soininen |
| 2005/0069651 | A1 | 3/2005 | Miyoshi |
| 2005/0070123 | A1 | 3/2005 | Hirano |
| 2005/0070729 | A1 | 3/2005 | Kiyomori et al. |
| 2005/0072357 | A1 | 4/2005 | Shero et al. |
| 2005/0074983 | A1 | 4/2005 | Shinriki et al. |
| 2005/0092247 | A1 | 5/2005 | Schmidt |
| 2005/0092249 | A1 | 5/2005 | Kilpela et al. |
| 2005/0092733 | A1 | 5/2005 | Ito et al. |
| 2005/0095770 | A1 | 5/2005 | Kumagai et al. |
| 2005/0098107 | A1 | 5/2005 | Du Bois et al. |
| 2005/0100669 | A1 | 5/2005 | Kools et al. |
| 2005/0101154 | A1 | 5/2005 | Huang |
| 2005/0101843 | A1 | 5/2005 | Quinn et al. |
| 2005/0106893 | A1 | 5/2005 | Wilk |
| 2005/0110069 | A1 | 5/2005 | Kil et al. |
| 2005/0118804 | A1 | 6/2005 | Byun et al. |
| 2005/0118837 | A1 | 6/2005 | Todd |
| 2005/0120805 | A1 | 6/2005 | Lane |
| 2005/0120962 | A1 | 6/2005 | Ushioda et al. |
| 2005/0123690 | A1 | 6/2005 | Derderian et al. |
| 2005/0130427 | A1 | 6/2005 | Seok-Jun |
| 2005/0132957 | A1 | 6/2005 | El-Raghy |
| 2005/0133161 | A1 | 6/2005 | Carpenter et al. |
| 2005/0141591 | A1 | 6/2005 | Sakano |
| 2005/0142361 | A1 | 6/2005 | Nakanishi |
| 2005/0145338 | A1 | 7/2005 | Park et al. |
| 2005/0153571 | A1 | 7/2005 | Senzaki |
| 2005/0172895 | A1 | 8/2005 | Kijima et al. |
| 2005/0173003 | A1 | 8/2005 | Laverdiere et al. |
| 2005/0175789 | A1 | 8/2005 | Helms |
| 2005/0181535 | A1 | 8/2005 | Yun et al. |
| 2005/0181555 | A1 | 8/2005 | Haukka et al. |
| 2005/0187647 | A1 | 8/2005 | Wang et al. |
| 2005/0191828 | A1 | 9/2005 | Al-Bayati et al. |
| 2005/0199013 | A1 | 9/2005 | Vandroux et al. |
| 2005/0208718 | A1 | 9/2005 | Lim et al. |
| 2005/0211167 | A1 | 9/2005 | Gunji |
| 2005/0212119 | A1 | 9/2005 | Shero |
| 2005/0214457 | A1 | 9/2005 | Schmitt et al. |
| 2005/0214458 | A1 | 9/2005 | Meiere |
| 2005/0208778 | A1 | 10/2005 | Li |
| 2005/0218462 | A1 | 10/2005 | Ahn et al. |
| 2005/0221021 | A1 | 10/2005 | Strang |
| 2005/0221618 | A1 | 10/2005 | AmRhein et al. |
| 2005/0223982 | A1 | 10/2005 | Park et al. |
| 2005/0223994 | A1 | 10/2005 | Blomiley et al. |
| 2005/0227502 | A1 | 10/2005 | Schmitt et al. |
| 2005/0229848 | A1 | 10/2005 | Shinriki |
| 2005/0229849 | A1 | 10/2005 | Silvetti et al. |
| 2005/0229972 | A1 | 10/2005 | Hoshi et al. |
| 2005/0233477 | A1 | 10/2005 | Yamazaki et al. |
| 2005/0241176 | A1 | 11/2005 | Shero et al. |
| 2005/0241763 | A1 | 11/2005 | Huang et al. |
| 2005/0245058 | A1 | 11/2005 | Lee et al. |
| 2005/0249876 | A1 | 11/2005 | Kawahara et al. |
| 2005/0250340 | A1 | 11/2005 | Chen et al. |
| 2005/0251990 | A1 | 11/2005 | Choi |
| 2005/0252449 | A1 | 11/2005 | Nguyen et al. |
| 2005/0255257 | A1 | 11/2005 | Choi et al. |
| 2005/0258280 | A1 | 11/2005 | Goto et al. |
| 2005/0260347 | A1 | 11/2005 | Narwankar et al. |
| 2005/0260850 | A1 | 11/2005 | Loke |
| 2005/0263072 | A1 | 12/2005 | Balasubramanian et al. |
| 2005/0263075 | A1 | 12/2005 | Wang et al. |
| 2005/0263932 | A1 | 12/2005 | Heugel |
| 2005/0271813 | A1 | 12/2005 | Kher et al. |
| 2005/0274323 | A1 | 12/2005 | Seidel et al. |
| 2005/0277271 | A1 | 12/2005 | Beintner |
| 2005/0282101 | A1 | 12/2005 | Adachi |
| 2005/0285097 | A1 | 12/2005 | Shang et al. |

(56) References Cited

U.S. PATENT DOCUMENTS

2005/0287725 A1 12/2005 Kitagawa
2005/0287771 A1 12/2005 Seamons et al.
2006/0000411 A1 1/2006 Seo
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019502 A1 1/2006 Park et al.
2006/0021572 A1 2/2006 Wolden
2006/0021703 A1 2/2006 Umotoy et al.
2006/0024439 A2 2/2006 Tuominen et al.
2006/0026314 A1 2/2006 Franchuk et al.
2006/0040054 A1 2/2006 Pearlstein et al.
2006/0040508 A1 2/2006 Ji
2006/0046518 A1 3/2006 Hill et al.
2006/0051520 A1 3/2006 Behle et al.
2006/0051925 A1 3/2006 Ahn et al.
2006/0057828 A1 3/2006 Omura
2006/0060930 A1 3/2006 Metz et al.
2006/0062910 A1 3/2006 Meiere
2006/0063346 A1 3/2006 Lee et al.
2006/0068104 A1 3/2006 Ishizaka
2006/0068121 A1 3/2006 Lee et al.
2006/0068125 A1 3/2006 Radhakrishnan
2006/0087638 A1 4/2006 Hirayanagi
2006/0096540 A1 5/2006 Choi
2006/0099782 A1 5/2006 Ritenour
2006/0105566 A1 5/2006 Waldfried et al.
2006/0107898 A1 5/2006 Blomberg
2006/0110934 A1 5/2006 Fukuchi
2006/0113675 A1 6/2006 Chang et al.
2006/0113806 A1 6/2006 Tsuji et al.
2006/0128142 A1 6/2006 Whelan et al.
2006/0128168 A1 6/2006 Ahn et al.
2006/0130767 A1 6/2006 Herchen
2006/0137609 A1 6/2006 Puchacz et al.
2006/0147626 A1 7/2006 Blomberg
2006/0148180 A1 7/2006 Ahn et al.
2006/0154424 A1 7/2006 Yang et al.
2006/0156981 A1 7/2006 Fondurulia
2006/0163612 A1 7/2006 Kouvetakis et al.
2006/0166428 A1 7/2006 Kamioka
2006/0172531 A1 8/2006 Lin et al.
2006/0175669 A1 8/2006 Kim et al.
2006/0177855 A1 8/2006 Utermohlen
2006/0182885 A1 8/2006 Lei et al.
2006/0188360 A1 8/2006 Bonora et al.
2006/0191555 A1 8/2006 Yoshida et al.
2006/0193979 A1 8/2006 Meiere et al.
2006/0196420 A1 9/2006 Ushakov et al.
2006/0199357 A1 9/2006 Wan et al.
2006/0205223 A1 9/2006 Smayling
2006/0205231 A1 9/2006 Chou et al.
2006/0208215 A1 9/2006 Metzner et al.
2006/0211243 A1 9/2006 Ishizaka et al.
2006/0211259 A1 9/2006 Maes
2006/0213439 A1 9/2006 Ishizaka
2006/0216942 A1 9/2006 Kim et al.
2006/0219169 A1 10/2006 Chen et al.
2006/0223301 A1 10/2006 Vanhaelemeersch et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0236934 A1 10/2006 Choi et al.
2006/0240574 A1 10/2006 Yoshie
2006/0240662 A1 10/2006 Conley et al.
2006/0249253 A1 11/2006 Dando
2006/0251827 A1 11/2006 Nowak
2006/0252228 A1 11/2006 Jeng
2006/0252351 A1 11/2006 Kundracik
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2007/0006806 A1 1/2007 Imai
2007/0010072 A1 1/2007 Bailey et al.
2007/0012402 A1 1/2007 Sneh
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0028842 A1 2/2007 Inagawa et al.
2007/0031598 A1 2/2007 Okuyama et al.
2007/0031599 A1 2/2007 Gschwandtner et al.
2007/0032045 A1 2/2007 Kasahara et al.
2007/0032082 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0049053 A1 3/2007 Mahajani
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0065578 A1 3/2007 McDougall
2007/0066010 A1 3/2007 Ando
2007/0066079 A1 3/2007 Kolster et al.
2007/0066084 A1 3/2007 Wajda et al.
2007/0077355 A1 4/2007 Chacin et al.
2007/0082132 A1 4/2007 Shinriki
2007/0082500 A1 4/2007 Norman et al.
2007/0084405 A1 4/2007 Kim
2007/0087579 A1 4/2007 Kitayama et al.
2007/0089670 A1 4/2007 Ikedo
2007/0096194 A1 5/2007 Streck et al.
2007/0098527 A1 5/2007 Hall et al.
2007/0107845 A1 5/2007 Ishizawa et al.
2007/0111470 A1 5/2007 Smythe
2007/0111545 A1 5/2007 Lee et al.
2007/0116873 A1 5/2007 Li et al.
2007/0116888 A1 5/2007 Faguet
2007/0119370 A1 5/2007 Ma et al.
2007/0123037 A1 5/2007 Lee et al.
2007/0123189 A1 5/2007 Saito et al.
2007/0125762 A1 6/2007 Cui et al.
2007/0128538 A1 6/2007 Fairbairn et al.
2007/0128876 A1 6/2007 Fukiage
2007/0128888 A1 6/2007 Goto et al.
2007/0129621 A1 6/2007 Kellogg et al.
2007/0134942 A1 6/2007 Ahn et al.
2007/0137794 A1 6/2007 Qiu et al.
2007/0146621 A1 6/2007 Yeom
2007/0148350 A1 6/2007 Rahtu
2007/0148990 A1 6/2007 Deboer et al.
2007/0155138 A1 7/2007 Tomasini et al.
2007/0157466 A1 7/2007 Kida et al.
2007/0158026 A1 7/2007 Amikura
2007/0163440 A1 7/2007 Kim et al.
2007/0163625 A1 7/2007 Lee
2007/0166457 A1 7/2007 Yamoto et al.
2007/0166966 A1 7/2007 Todd et al.

(56) References Cited

U.S. PATENT DOCUMENTS

2007/0166999 A1 7/2007 Vaarstra
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0186849 A1 8/2007 Furuya
2007/0186952 A1 8/2007 Honda et al.
2007/0187363 A1 8/2007 Oka et al.
2007/0202678 A1 8/2007 Plombon et al.
2007/0207275 A1 9/2007 Nowak et al.
2007/0209590 A1 9/2007 Li
2007/0210890 A1 9/2007 Hsu et al.
2007/0215048 A1 9/2007 Suzuki et al.
2007/0218200 A1 9/2007 Suzuki et al.
2007/0218705 A1 9/2007 Matsuki et al.
2007/0224777 A1 9/2007 Hamelin
2007/0224833 A1 9/2007 Morisada et al.
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0241688 A1 10/2007 DeVancentis et al.
2007/0248767 A1 10/2007 Okura
2007/0249131 A1 10/2007 Allen et al.
2007/0251444 A1 11/2007 Gros-Jean et al.
2007/0251456 A1 11/2007 Herchen et al.
2007/0252244 A1 11/2007 Srividya et al.
2007/0252532 A1 11/2007 DeVancentis et al.
2007/0258506 A1 11/2007 Schwagerman et al.
2007/0264807 A1 11/2007 Leone et al.
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281496 A1 12/2007 Ingle et al.
2007/0298362 A1 12/2007 Rocha-Alvarez et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0036354 A1 2/2008 Letz et al.
2008/0038485 A1 2/2008 Fukazawa et al.
2008/0038934 A1 2/2008 Vrtis et al.
2008/0042165 A1 2/2008 Sugizaki
2008/0043803 A1 2/2008 Bandoh
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0066778 A1 3/2008 Matsushita et al.
2008/0069955 A1 3/2008 Hong et al.
2008/0075562 A1 3/2008 Maria et al.
2008/0075881 A1 3/2008 Won et al.
2008/0076070 A1 3/2008 Koh et al.
2008/0076266 A1 3/2008 Fukazawa et al.
2008/0081104 A1* 4/2008 Hasebe et al. .................. 427/58
2008/0081113 A1 4/2008 Clark
2008/0081121 A1 4/2008 Morita et al.
2008/0085226 A1 4/2008 Fondurulia et al.
2008/0092815 A1 4/2008 Chen et al.
2008/0102203 A1 5/2008 Wu
2008/0113094 A1 5/2008 Casper
2008/0113096 A1 5/2008 Mahajani
2008/0113097 A1 5/2008 Mahajani et al.
2008/0118334 A1 5/2008 Bonora
2008/0121177 A1 5/2008 Bang et al.
2008/0121626 A1 5/2008 Thomas et al.
2008/0124197 A1 5/2008 van der Meulen et al.
2008/0124908 A1 5/2008 Forbes et al.
2008/0124946 A1 5/2008 Xiao et al.
2008/0132046 A1 6/2008 Walther
2008/0133154 A1 6/2008 Krauss et al.
2008/0142483 A1 6/2008 Hua
2008/0149031 A1 6/2008 Chu et al.
2008/0149593 A1 6/2008 Bai et al.
2008/0152463 A1 6/2008 Chidambaram et al.
2008/0153311 A1 6/2008 Padhi et al.
2008/0157157 A1 7/2008 Tonomura
2008/0157365 A1 7/2008 Ott et al.
2008/0173237 A1 7/2008 Collins
2008/0173238 A1 7/2008 Nakashima et al.
2008/0173240 A1 7/2008 Furukawahara
2008/0173326 A1 7/2008 Gu et al.
2008/0176375 A1 7/2008 Erben et al.
2008/0178805 A1 7/2008 Paterson et al.
2008/0179104 A1 7/2008 Zhang
2008/0179715 A1 7/2008 Coppa
2008/0182075 A1 7/2008 Chopra
2008/0182390 A1 7/2008 Lemmi et al.
2008/0191193 A1 8/2008 Li et al.
2008/0199977 A1 8/2008 Weigel et al.
2008/0202416 A1 8/2008 Provencher
2008/0202689 A1 8/2008 Kim
2008/0203487 A1 8/2008 Hohage et al.
2008/0205483 A1 8/2008 Rempe et al.
2008/0211423 A1 9/2008 Shinmen et al.
2008/0211526 A1 9/2008 Shinma
2008/0216077 A1 9/2008 Emani et al.
2008/0216742 A1 9/2008 Takebayashi
2008/0220619 A1 9/2008 Matsushita et al.
2008/0224240 A1 9/2008 Ahn et al.
2008/0228306 A1 9/2008 Yetter et al.
2008/0233288 A1 9/2008 Clark
2008/0237572 A1 10/2008 Chui et al.
2008/0241384 A1 10/2008 Jeong
2008/0241387 A1 10/2008 Keto
2008/0242116 A1 10/2008 Clark
2008/0248310 A1 10/2008 Kim et al.
2008/0257494 A1 10/2008 Hayashi et al.
2008/0260963 A1 10/2008 Yoon et al.
2008/0261413 A1 10/2008 Mahajani
2008/0264337 A1 10/2008 Sano et al.
2008/0267598 A1 10/2008 Nakamura
2008/0268635 A1 10/2008 Yu et al.
2008/0277715 A1 11/2008 Ohmi et al.
2008/0282970 A1 11/2008 Heys et al.
2008/0283962 A1 11/2008 Dyer
2008/0289574 A1 11/2008 Jacobs et al.
2008/0291964 A1 11/2008 Shrimpling
2008/0295872 A1 12/2008 Riker et al.
2008/0298945 A1 12/2008 Cox
2008/0299326 A1 12/2008 Fukazawa
2008/0299758 A1 12/2008 Harada et al.
2008/0302303 A1 12/2008 Choi et al.
2008/0305014 A1 12/2008 Honda
2008/0305246 A1 12/2008 Choi et al.
2008/0305443 A1 12/2008 Nakamura
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0011145 A1 1/2009 Yun
2009/0011608 A1 1/2009 Nabatame
2009/0017631 A1 1/2009 Bencher
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.

(56) References Cited

U.S. PATENT DOCUMENTS

2009/0033907 A1 2/2009 Watson
2009/0035947 A1 2/2009 Horii
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045829 A1 2/2009 Awazu
2009/0050621 A1 2/2009 Awazu
2009/0052498 A1 2/2009 Halpin et al.
2009/0053023 A1 2/2009 Wakabayashi
2009/0053906 A1 2/2009 Miya et al.
2009/0056629 A1 3/2009 Katz et al.
2009/0057269 A1 3/2009 Katz et al.
2009/0061083 A1 3/2009 Chiang et al.
2009/0061644 A1 3/2009 Chiang et al.
2009/0061647 A1 3/2009 Mallick et al.
2009/0075491 A1 3/2009 Liu et al.
2009/0084317 A1 4/2009 Wu
2009/0085156 A1 4/2009 Dewey et al.
2009/0090382 A1 4/2009 Morisada
2009/0093094 A1 4/2009 Ye et al.
2009/0095221 A1 4/2009 Tam et al.
2009/0104351 A1 4/2009 Kakegawa
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136668 A1 5/2009 Gregg et al.
2009/0136683 A1 5/2009 Fukasawa et al.
2009/0139657 A1 6/2009 Lee et al.
2009/0142905 A1 6/2009 Yamazaki
2009/0142935 A1 6/2009 Fukazawa et al.
2009/0146322 A1 6/2009 Weling et al.
2009/0156015 A1 6/2009 Park et al.
2009/0159000 A1 6/2009 Aggarwal et al.
2009/0159424 A1 6/2009 Liu et al.
2009/0162996 A1 6/2009 Ramaswarmy et al.
2009/0163038 A1 6/2009 Miyoshi
2009/0165715 A1 7/2009 Oh
2009/0179365 A1 7/2009 Lerner et al.
2009/0186571 A1 7/2009 Haro
2009/0197015 A1 8/2009 Kudela et al.
2009/0200494 A1 8/2009 Hatem
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0227094 A1 9/2009 Bateman
2009/0230211 A1 9/2009 Kobayashi et al.
2009/0236014 A1 9/2009 Wilson
2009/0236276 A1 9/2009 Kurth et al.
2009/0239386 A1 9/2009 Suzaki et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250955 A1 10/2009 Aoki
2009/0255901 A1 10/2009 Okita
2009/0261331 A1 10/2009 Yang et al.
2009/0269506 A1 10/2009 Okura et al.
2009/0269941 A1 10/2009 Raisanen
2009/0275205 A1 11/2009 Kiehlbauch et al.
2009/0277510 A1 11/2009 Shikata
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0289300 A1 11/2009 Sasaki et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.
2009/0315093 A1 12/2009 Li et al.
2009/0320754 A1 12/2009 Oya
2009/0324971 A1 12/2009 De Vries et al.
2009/0325391 A1 12/2009 De Vusser et al.
2009/0325469 A1 12/2009 Koo et al.
2010/0001409 A1 1/2010 Humbert et al.
2010/0003406 A1 1/2010 Lam et al.
2010/0006031 A1 1/2010 Choi et al.
2010/0006923 A1 1/2010 Fujitsuka
2010/0014479 A1 1/2010 Kim
2010/0015813 A1 1/2010 McGinnis et al.
2010/0018460 A1 1/2010 Singh et al.
2010/0024727 A1 2/2010 Kim et al.
2010/0024872 A1 2/2010 Kishimoto
2010/0025796 A1 2/2010 Dabiran
2010/0032587 A1 2/2010 Hosch et al.
2010/0032842 A1 2/2010 Herdt et al.
2010/0040441 A1 2/2010 Obikane
2010/0041179 A1 2/2010 Lee
2010/0041243 A1 2/2010 Cheng et al.
2010/0050943 A1 3/2010 Kato et al.
2010/0051597 A1 3/2010 Morita et al.
2010/0055312 A1 3/2010 Kato et al.
2010/0055442 A1 3/2010 Kellock
2010/0058984 A1 3/2010 Marubayashi
2010/0065758 A1 3/2010 Liu et al.
2010/0068009 A1 3/2010 Kimura
2010/0068891 A1 3/2010 Hatanaka et al.
2010/0075037 A1 3/2010 Marsh et al.
2010/0075507 A1 3/2010 Chang et al.
2010/0081094 A1 4/2010 Hasebe et al.
2010/0089320 A1 4/2010 Kim
2010/0089870 A1 4/2010 Hiroshima et al.
2010/0090149 A1 4/2010 Thompson et al.
2010/0092696 A1 4/2010 Shinriki
2010/0093187 A1 4/2010 Lee et al.
2010/0098862 A1 4/2010 Xu et al.
2010/0102417 A1 4/2010 Ganguli et al.
2010/0105936 A1 4/2010 Tada et al.
2010/0112496 A1 5/2010 Nakajima et al.
2010/0116207 A1 5/2010 Givens
2010/0116209 A1 5/2010 Kato
2010/0124610 A1 5/2010 Aikawa et al.
2010/0124618 A1 5/2010 Kobayashi et al.
2010/0124621 A1 5/2010 Kobayashi et al.
2010/0126415 A1 5/2010 Ishino et al.
2010/0126539 A1 5/2010 Lee et al.
2010/0126605 A1 5/2010 Stones
2010/0129990 A1 5/2010 Nishizawa et al.
2010/0130015 A1 5/2010 Nakajima et al.
2010/0130017 A1 5/2010 Luo et al.
2010/0130105 A1 5/2010 Lee
2010/0134023 A1 6/2010 Mills
2010/0136216 A1 6/2010 Tsuei et al.
2010/0140221 A1 6/2010 Kikuchi et al.
2010/0143609 A1 6/2010 Fukazawa et al.
2010/0144162 A1 6/2010 Lee et al.
2010/0144968 A1 6/2010 Lee et al.
2010/0145547 A1 6/2010 Darabnia et al.
2010/0151206 A1 6/2010 Wu et al.
2010/0159638 A1 6/2010 Jeong
2010/0162752 A1 7/2010 Tabata et al.
2010/0162956 A1 7/2010 Murakami et al.
2010/0163524 A1 7/2010 Arai
2010/0163937 A1 7/2010 Clendenning
2010/0168404 A1 7/2010 Girolami et al.
2010/0170441 A1 7/2010 Won et al.
2010/0170868 A1 7/2010 Lin et al.
2010/0173432 A1 7/2010 White et al.
2010/0178137 A1 7/2010 Chintalapati et al.
2010/0178423 A1 7/2010 Shimizu et al.
2010/0180819 A1 7/2010 Hatanaka et al.

(56) References Cited

U.S. PATENT DOCUMENTS

2010/0183825 A1 7/2010 Becker et al.
2010/0184302 A1 7/2010 Lee et al.
2010/0186669 A1 7/2010 Shin et al.
2010/0193501 A1 8/2010 Zucker et al.
2010/0195392 A1 8/2010 Freeman
2010/0202860 A1 8/2010 Reed
2010/0221452 A1 9/2010 Kang
2010/0229795 A1 9/2010 Tanabe
2010/0230051 A1 9/2010 Iizuka
2010/0230863 A1 9/2010 Moench et al.
2010/0233885 A1 9/2010 Kushibiki et al.
2010/0233886 A1 9/2010 Yang et al.
2010/0236691 A1 9/2010 Yamazaki
2010/0243166 A1 9/2010 Hayashi et al.
2010/0244688 A1 9/2010 Braun et al.
2010/0248465 A1 9/2010 Yi et al.
2010/0255198 A1 10/2010 Cleary et al.
2010/0255218 A1 10/2010 Oka et al.
2010/0255625 A1 10/2010 De Vries
2010/0255658 A1 10/2010 Aggarwal
2010/0259152 A1 10/2010 Yasuda et al.
2010/0266765 A1 10/2010 White et al.
2010/0267248 A1 10/2010 Ma et al.
2010/0270675 A1 10/2010 Harada
2010/0246630 A1 11/2010 Kaszynski et al.
2010/0275846 A1 11/2010 Kitagawa
2010/0282163 A1 11/2010 Aggarwal et al.
2010/0282170 A1 11/2010 Nishizawa
2010/0282645 A1 11/2010 Wang
2010/0285237 A1 11/2010 Ditizio et al.
2010/0285319 A1 11/2010 Kwak et al.
2010/0294199 A1 11/2010 Tran et al.
2010/0297391 A1 11/2010 Kley
2010/0301752 A1 12/2010 Bakre et al.
2010/0304047 A1 12/2010 Yang et al.
2010/0307415 A1 12/2010 Shero et al.
2010/0317198 A1 12/2010 Antonelli
2010/0322604 A1 12/2010 Fondurulia et al.
2010/0326358 A1 12/2010 Choi
2011/0000619 A1 1/2011 Suh
2011/0006402 A1 1/2011 Zhou
2011/0006406 A1 1/2011 Urbanowicz et al.
2011/0014359 A1 1/2011 Hashim
2011/0014795 A1 1/2011 Lee
2011/0027725 A1 2/2011 Tsutsumi et al.
2011/0027999 A1 2/2011 Sparks et al.
2011/0034039 A1 2/2011 Liang et al.
2011/0045610 A1 2/2011 van Schravendijk
2011/0046314 A1 2/2011 Klipp et al.
2011/0048642 A1 3/2011 Mihara et al.
2011/0048769 A1 3/2011 Fujwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0070380 A1 3/2011 Shero et al.
2011/0081519 A1 4/2011 Dillingh
2011/0083496 A1 4/2011 Lin et al.
2011/0086516 A1 4/2011 Lee et al.
2011/0089469 A1 4/2011 Merckling
2011/0097901 A1 4/2011 Banna et al.
2011/0107512 A1 5/2011 Gilbert
2011/0108194 A1 5/2011 Yoshioka et al.
2011/0108741 A1 5/2011 Ingram
2011/0108929 A1 5/2011 Meng
2011/0117490 A1 5/2011 Bae et al.
2011/0117737 A1 5/2011 Agarwala et al.
2011/0117749 A1 5/2011 Sheu
2011/0124196 A1 5/2011 Lee
2011/0139272 A1 6/2011 Matsumoto et al.
2011/0139748 A1 6/2011 Donnelly et al.
2011/0140172 A1 6/2011 Chu
2011/0143032 A1 6/2011 Vrtis et al.
2011/0143461 A1 6/2011 Fish et al.
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171775 A1 7/2011 Yamamoto et al.
2011/0175011 A1 7/2011 Ehrne et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0192820 A1 8/2011 Yeom et al.
2011/0198417 A1 8/2011 Detmar et al.
2011/0198736 A1 8/2011 Shero et al.
2011/0210468 A1 9/2011 Shannon et al.
2011/0220874 A1 9/2011 Hanrath
2011/0236600 A1 9/2011 Fox et al.
2011/0237040 A1 9/2011 Ng et al.
2011/0239936 A1 10/2011 Suzaki et al.
2011/0253044 A1 10/2011 Tam et al.
2011/0254052 A1 10/2011 Kouvetakis
2011/0256675 A1 10/2011 Avouris
2011/0256726 A1 10/2011 Lavoie et al.
2011/0256727 A1 10/2011 Beynet et al.
2011/0256734 A1 10/2011 Hausmann et al.
2011/0263107 A1 10/2011 Chung et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0291243 A1 12/2011 Seamons
2011/0294075 A1 12/2011 Chen et al.
2011/0294288 A1 12/2011 Lee et al.
2011/0298062 A1 12/2011 Ganguli et al.
2011/0300720 A1 12/2011 Fu
2011/0308453 A1 12/2011 Su et al.
2011/0308460 A1 12/2011 Hong et al.
2011/0312191 A1 12/2011 Ohkura et al.
2012/0003500 A1 1/2012 Yoshida et al.
2012/0006489 A1 1/2012 Okita
2012/0009802 A1 1/2012 Lavoie
2012/0024227 A1 2/2012 Takasuka et al.
2012/0024479 A1 2/2012 Palagashvili et al.
2012/0028454 A1 2/2012 Swaminathan et al.
2012/0031333 A1 2/2012 Kurita et al.
2012/0032311 A1 2/2012 Gates
2012/0033695 A1 2/2012 Hayashi et al.
2012/0036732 A1 2/2012 Varadarajan
2012/0040528 A1 2/2012 Kim et al.
2012/0043556 A1 2/2012 Dube et al.
2012/0046421 A1 2/2012 Darling et al.
2012/0052681 A1 3/2012 Marsh
2012/0058630 A1 3/2012 Quinn
2012/0064690 A1 3/2012 Hirota et al.
2012/0068242 A1 3/2012 Shin et al.
2012/0070136 A1 3/2012 Koelmel et al.
2012/0070997 A1 3/2012 Larson
2012/0074533 A1 3/2012 Aoyama
2012/0077349 A1 3/2012 Li et al.
2012/0080756 A1 4/2012 Suzuki
2012/0090704 A1 4/2012 Laverdiere et al.
2012/0098107 A1 4/2012 Raisanen et al.
2012/0100464 A1 4/2012 Kageyama
2012/0103264 A1 5/2012 Choi et al.
2012/0103522 A1 5/2012 Hohenwater
2012/0103939 A1 5/2012 Wu et al.
2012/0107607 A1 5/2012 Takaki et al.
2012/0108039 A1 5/2012 Zajaji
2012/0114877 A1 5/2012 Lee
2012/0115250 A1 5/2012 Ariga et al.
2012/0115257 A1 5/2012 Matsuyam et al.
2012/0119337 A1 5/2012 Sasaki et al.
2012/0121823 A1 5/2012 Chhabra

(56) References Cited

U.S. PATENT DOCUMENTS

| | | | |
|---|---|---|---|
| 2012/0122275 | A1 | 5/2012 | Koo et al. |
| 2012/0122302 | A1 | 5/2012 | Weisman et al. |
| 2012/0128897 | A1 | 5/2012 | Xiao et al. |
| 2012/0135145 | A1 | 5/2012 | Je et al. |
| 2012/0149213 | A1 | 6/2012 | Nittala |
| 2012/0156108 | A1 | 6/2012 | Fondurulia et al. |
| 2012/0156890 | A1 | 6/2012 | Yim et al. |
| 2012/0160172 | A1 | 6/2012 | Wamura et al. |
| 2012/0161405 | A1 | 6/2012 | Mohn |
| 2012/0164327 | A1 | 6/2012 | Sato |
| 2012/0164837 | A1 | 6/2012 | Tan et al. |
| 2012/0164842 | A1 | 6/2012 | Watanabe |
| 2012/0170170 | A1 | 7/2012 | Gros-Jean |
| 2012/0171391 | A1 | 7/2012 | Won |
| 2012/0171874 | A1 | 7/2012 | Thridandam et al. |
| 2012/0175751 | A1 | 7/2012 | Gatineau et al. |
| 2012/0180954 | A1 | 7/2012 | Yang et al. |
| 2012/0183689 | A1 | 7/2012 | Suzuki et al. |
| 2012/0187083 | A1 | 7/2012 | Hashizume |
| 2012/0187305 | A1 | 7/2012 | Elam et al. |
| 2012/0190178 | A1 | 7/2012 | Wang et al. |
| 2012/0190185 | A1 | 7/2012 | Rogers |
| 2012/0196048 | A1 | 8/2012 | Ueda |
| 2012/0196450 | A1 | 8/2012 | Balseanu et al. |
| 2012/0207456 | A1 | 8/2012 | Kim et al. |
| 2012/0212121 | A1 | 8/2012 | Lin |
| 2012/0214318 | A1 | 8/2012 | Fukazawa et al. |
| 2012/0216743 | A1 | 8/2012 | Itoh et al. |
| 2012/0219824 | A1 | 8/2012 | Prolier |
| 2012/0220139 | A1 | 8/2012 | Lee et al. |
| 2012/0225561 | A1 | 9/2012 | Watanabe |
| 2012/0231771 | A1 | 9/2012 | Marcus |
| 2012/0238074 | A1 | 9/2012 | Santhanam et al. |
| 2012/0240858 | A1 | 9/2012 | Taniyama et al. |
| 2012/0241411 | A1 | 9/2012 | Darling et al. |
| 2012/0252229 | A1 | 10/2012 | Timans et al. |
| 2012/0263876 | A1 | 10/2012 | Haukka et al. |
| 2012/0264051 | A1 | 10/2012 | Angelov et al. |
| 2012/0270339 | A1 | 10/2012 | Xie et al. |
| 2012/0270393 | A1 | 10/2012 | Pore et al. |
| 2012/0289053 | A1 | 11/2012 | Holland et al. |
| 2012/0289057 | A1 | 11/2012 | DeDontney |
| 2012/0295427 | A1 | 11/2012 | Bauer |
| 2012/0304935 | A1 | 12/2012 | Oosterlaken et al. |
| 2012/0305026 | A1 | 12/2012 | Nomura et al. |
| 2012/0305196 | A1 | 12/2012 | Mori et al. |
| 2012/0305987 | A1 | 12/2012 | Hirler et al. |
| 2012/0310440 | A1 | 12/2012 | Darabnia et al. |
| 2012/0315113 | A1 | 12/2012 | Hiroki |
| 2012/0318334 | A1 | 12/2012 | Bedell et al. |
| 2012/0321786 | A1 | 12/2012 | Satitpunwaycha et al. |
| 2012/0322252 | A1 | 12/2012 | Son et al. |
| 2012/0325148 | A1 | 12/2012 | Yamagishi et al. |
| 2012/0328780 | A1 | 12/2012 | Yamagishi et al. |
| 2013/0005122 | A1 | 1/2013 | Schwarzenbach et al. |
| 2013/0011983 | A1 | 1/2013 | Tsai |
| 2013/0014697 | A1 | 1/2013 | Kanayama |
| 2013/0014896 | A1 | 1/2013 | Shoji et al. |
| 2013/0019944 | A1 | 1/2013 | Hekmatshoar-Tabai et al. |
| 2013/0019945 | A1 | 1/2013 | Hekmatshoar-Tabai et al. |
| 2013/0020246 | A1 | 1/2013 | Hoots et al. |
| 2013/0023129 | A1 | 1/2013 | Reed |
| 2013/0025786 | A1 | 1/2013 | Davidkovich et al. |
| 2013/0026451 | A1 | 1/2013 | Bangsaruntip et al. |
| 2013/0037858 | A1 | 2/2013 | Hong et al. |
| 2013/0037886 | A1 | 2/2013 | Tsai et al. |
| 2013/0048606 | A1 | 2/2013 | Mao et al. |
| 2013/0052585 | A1 | 2/2013 | Ayothi et al. |
| 2013/0061755 | A1 | 3/2013 | Frederick |
| 2013/0064973 | A1 | 3/2013 | Chen et al. |
| 2013/0065189 | A1 | 3/2013 | Yoshii et al. |
| 2013/0068727 | A1 | 3/2013 | Okita |
| 2013/0068970 | A1 | 3/2013 | Matsushita |
| 2013/0069052 | A1 | 3/2013 | Sandhu |
| 2013/0078392 | A1 | 3/2013 | Xiao et al. |
| 2013/0081702 | A1 | 4/2013 | Mohammed et al. |
| 2013/0082274 | A1 | 4/2013 | Yang |
| 2013/0084156 | A1 | 4/2013 | Shimamoto |
| 2013/0084714 | A1 | 4/2013 | Oka et al. |
| 2013/0089716 | A1 | 4/2013 | Krishnamurthy et al. |
| 2013/0095664 | A1 | 4/2013 | Matero et al. |
| 2013/0095973 | A1 | 4/2013 | Kroneberger et al. |
| 2013/0104988 | A1 | 5/2013 | Yednak et al. |
| 2013/0104992 | A1 | 5/2013 | Yednak et al. |
| 2013/0115383 | A1 | 5/2013 | Lu et al. |
| 2013/0115763 | A1 | 5/2013 | Takamure et al. |
| 2013/0115768 | A1 | 5/2013 | Pore et al. |
| 2013/0119018 | A1 | 5/2013 | Kanarik et al. |
| 2013/0122712 | A1 | 5/2013 | Kim et al. |
| 2013/0126515 | A1 | 5/2013 | Shero et al. |
| 2013/0129577 | A1 | 5/2013 | Halpin et al. |
| 2013/0134148 | A1 | 5/2013 | Tachikawa |
| 2013/0143401 | A1 | 6/2013 | Yu et al. |
| 2013/0157409 | A1 | 6/2013 | Vaidya |
| 2013/0160709 | A1 | 6/2013 | White |
| 2013/0161629 | A1 | 6/2013 | Han et al. |
| 2013/0168354 | A1 | 7/2013 | Kanarik |
| 2013/0171818 | A1 | 7/2013 | Kim et al. |
| 2013/0175596 | A1 | 7/2013 | Cheng et al. |
| 2013/0180448 | A1 | 7/2013 | Sakaue et al. |
| 2013/0183814 | A1 | 7/2013 | Huang et al. |
| 2013/0189854 | A1 | 7/2013 | Hausmann et al. |
| 2013/0196507 | A1 | 8/2013 | Ma et al. |
| 2013/0203266 | A1 | 8/2013 | Hintze |
| 2013/0209940 | A1 | 8/2013 | Sakamoto et al. |
| 2013/0210241 | A1 | 8/2013 | Lavoie et al. |
| 2013/0214232 | A1 | 8/2013 | Tendulkar et al. |
| 2013/0217239 | A1 | 8/2013 | Mallick et al. |
| 2013/0217240 | A1 | 8/2013 | Mallick et al. |
| 2013/0217241 | A1 | 8/2013 | Underwood et al. |
| 2013/0217243 | A1 | 8/2013 | Underwood et al. |
| 2013/0224964 | A1 | 8/2013 | Fukazawa |
| 2013/0230814 | A1 | 9/2013 | Dunn et al. |
| 2013/0256265 | A1 | 10/2013 | Darling et al. |
| 2013/0256838 | A1 | 10/2013 | Sanchez et al. |
| 2013/0256962 | A1 | 10/2013 | Ranish |
| 2013/0264659 | A1 | 10/2013 | Jung |
| 2013/0269612 | A1 | 10/2013 | Cheng et al. |
| 2013/0270676 | A1 | 10/2013 | Lindert et al. |
| 2013/0276978 | A1 | 10/2013 | Bluck et al. |
| 2013/0285155 | A1 | 10/2013 | Glass |
| 2013/0287526 | A1 | 10/2013 | Bluck et al. |
| 2013/0288480 | A1 | 10/2013 | Sanchez et al. |
| 2013/0288485 | A1 | 10/2013 | Liang et al. |
| 2013/0292047 | A1 | 11/2013 | Tian et al. |
| 2013/0292676 | A1 | 11/2013 | Milligan et al. |
| 2013/0292807 | A1 | 11/2013 | Raisanen et al. |
| 2013/0295779 | A1 | 11/2013 | Chandra et al. |
| 2013/0302999 | A1 | 11/2013 | Won et al. |
| 2013/0303803 | A1 | 11/2013 | Doerr et al. |
| 2013/0313656 | A1 | 11/2013 | Tong |
| 2013/0319290 | A1 | 12/2013 | Xiao et al. |
| 2013/0320429 | A1 | 12/2013 | Thomas |
| 2013/0323435 | A1 | 12/2013 | Xiao et al. |
| 2013/0330165 | A1 | 12/2013 | Wimplinger |
| 2013/0330911 | A1 | 12/2013 | Huang et al. |
| 2013/0330933 | A1 | 12/2013 | Fukazawa et al. |
| 2013/0333619 | A1 | 12/2013 | Omari |
| 2013/0337583 | A1 | 12/2013 | Kobayashi et al. |
| 2013/0337653 | A1 | 12/2013 | Kovalgin et al. |
| 2013/0340619 | A1 | 12/2013 | Tammera |
| 2013/0344248 | A1 | 12/2013 | Clark |
| 2014/0000843 | A1 | 1/2014 | Dunn et al. |
| 2014/0001520 | A1 | 1/2014 | Glass |
| 2014/0014642 | A1 | 1/2014 | Elliot et al. |
| 2014/0014644 | A1 | 1/2014 | Akiba et al. |
| 2014/0015186 | A1 | 1/2014 | Wessel et al. |
| 2014/0020619 | A1 | 1/2014 | Vincent et al. |
| 2014/0023794 | A1 | 1/2014 | Mahajani et al. |
| 2014/0027884 | A1 | 1/2014 | Tang et al. |
| 2014/0033978 | A1 | 2/2014 | Adachi et al. |
| 2014/0036274 | A1 | 2/2014 | Marquardt et al. |
| 2014/0047705 | A1 | 2/2014 | Singh |
| 2014/0048765 | A1 | 2/2014 | Ma et al. |

(56) References Cited

U.S. PATENT DOCUMENTS

| | | | |
|---|---|---|---|
| 2014/0056679 | A1 | 2/2014 | Yamabe et al. |
| 2014/0056770 | A1 | 2/2014 | Bedard et al. |
| 2014/0057454 | A1 | 2/2014 | Subramonium |
| 2014/0058179 | A1 | 2/2014 | Stevens et al. |
| 2014/0060147 | A1 | 3/2014 | Sarin et al. |
| 2014/0061770 | A1 | 3/2014 | Lee |
| 2014/0062304 | A1 | 3/2014 | Nakano et al. |
| 2014/0065841 | A1 | 3/2014 | Matero |
| 2014/0067110 | A1 | 3/2014 | Lawson et al. |
| 2014/0073143 | A1 | 3/2014 | Alokozai et al. |
| 2014/0076861 | A1 | 3/2014 | Cornelius et al. |
| 2014/0077240 | A1 | 3/2014 | Roucka et al. |
| 2014/0084341 | A1 | 3/2014 | Weeks |
| 2014/0087544 | A1 | 3/2014 | Tolle |
| 2014/0094027 | A1 | 4/2014 | Azumo et al. |
| 2014/0096716 | A1 | 4/2014 | Chung et al. |
| 2014/0097468 | A1 | 4/2014 | Okita |
| 2014/0099798 | A1 | 4/2014 | Tsuji |
| 2014/0103145 | A1 | 4/2014 | White et al. |
| 2014/0106574 | A1 | 4/2014 | Kang et al. |
| 2014/0110798 | A1 | 4/2014 | Cai |
| 2014/0113457 | A1 | 4/2014 | Sims |
| 2014/0116335 | A1 | 5/2014 | Tsuji et al. |
| 2014/0117380 | A1 | 5/2014 | Loboda et al. |
| 2014/0120487 | A1 | 5/2014 | Kaneko |
| 2014/0120723 | A1 | 5/2014 | Fu et al. |
| 2014/0120738 | A1 | 5/2014 | Jung |
| 2014/0127907 | A1 | 5/2014 | Yang |
| 2014/0138779 | A1 | 5/2014 | Xie et al. |
| 2014/0141625 | A1 | 5/2014 | Fukazawa et al. |
| 2014/0144500 | A1 | 5/2014 | Cao et al. |
| 2014/0158786 | A1 | 6/2014 | Santo |
| 2014/0159170 | A1 | 6/2014 | Raisanen et al. |
| 2014/0167187 | A1 | 6/2014 | Kuo et al. |
| 2014/0174354 | A1 | 6/2014 | Arai |
| 2014/0175054 | A1 | 6/2014 | Carlson et al. |
| 2014/0182053 | A1 | 7/2014 | Huang |
| 2014/0191389 | A1 | 7/2014 | Lee et al. |
| 2014/0193983 | A1 | 7/2014 | Lavoie |
| 2014/0202386 | A1 | 7/2014 | Taga |
| 2014/0202388 | A1 | 7/2014 | Um et al. |
| 2014/0209976 | A1 | 7/2014 | Yang et al. |
| 2014/0217065 | A1 | 8/2014 | Winkler et al. |
| 2014/0220247 | A1 | 8/2014 | Haukka et al. |
| 2014/0225065 | A1 | 8/2014 | Rachmady et al. |
| 2014/0227072 | A1 | 8/2014 | Lee et al. |
| 2014/0227861 | A1 | 8/2014 | Wu et al. |
| 2014/0227881 | A1 | 8/2014 | Lubomirsky et al. |
| 2014/0234550 | A1 | 8/2014 | Winter et al. |
| 2014/0245948 | A1 | 9/2014 | Nguyen et al. |
| 2014/0251953 | A1 | 9/2014 | Winkler et al. |
| 2014/0251954 | A1 | 9/2014 | Winkler et al. |
| 2014/0252134 | A1 | 9/2014 | Chen |
| 2014/0252479 | A1 | 9/2014 | Utomo et al. |
| 2014/0260684 | A1 | 9/2014 | Christmann |
| 2014/0264902 | A1 | 9/2014 | Ting et al. |
| 2014/0272194 | A1 | 9/2014 | Xiao et al. |
| 2014/0273428 | A1 | 9/2014 | Shero |
| 2014/0273477 | A1 | 9/2014 | Niskanen |
| 2014/0273510 | A1 | 9/2014 | Chen et al. |
| 2014/0273528 | A1 | 9/2014 | Niskanen |
| 2014/0273530 | A1 | 9/2014 | Nguyen |
| 2014/0273531 | A1 | 9/2014 | Niskanen |
| 2014/0283747 | A1 | 9/2014 | Kasai et al. |
| 2014/0346142 | A1 | 11/2014 | Chapuis et al. |
| 2014/0346650 | A1 | 11/2014 | Raisanen et al. |
| 2014/0349033 | A1 | 11/2014 | Nonaka et al. |
| 2014/0363980 | A1 | 12/2014 | Kawamata et al. |
| 2014/0363983 | A1 | 12/2014 | Nakano et al. |
| 2014/0363985 | A1 | 12/2014 | Jang et al. |
| 2014/0367043 | A1 | 12/2014 | Bishara et al. |
| 2014/0367642 | A1 | 12/2014 | Guo |
| 2014/0377960 | A1 | 12/2014 | Koiwa |
| 2015/0004316 | A1 | 1/2015 | Thompson et al. |
| 2015/0004317 | A1 | 1/2015 | Dussarrat et al. |
| 2015/0004798 | A1 | 1/2015 | Chandrasekharan et al. |
| 2015/0007770 | A1 | 1/2015 | Chandrasekharan et al. |
| 2015/0010381 | A1 | 1/2015 | Cai |
| 2015/0014632 | A1 | 1/2015 | Kim et al. |
| 2015/0014823 | A1 | 1/2015 | Mallikarjunan et al. |
| 2015/0017794 | A1 | 1/2015 | Takamure |
| 2015/0021599 | A1 | 1/2015 | Ridgeway |
| 2015/0024609 | A1 | 1/2015 | Milligan et al. |
| 2015/0041431 | A1 | 2/2015 | Zafiropoulo et al. |
| 2015/0048485 | A1 | 2/2015 | Tolle |
| 2015/0056815 | A1 | 2/2015 | Fernandez |
| 2015/0072509 | A1 | 3/2015 | Chi et al. |
| 2015/0078874 | A1 | 3/2015 | Sansoni |
| 2015/0079311 | A1 | 3/2015 | Nakano |
| 2015/0086316 | A1 | 3/2015 | Greenberg |
| 2015/0087154 | A1 | 3/2015 | Guha et al. |
| 2015/0091057 | A1 | 4/2015 | Xie et al. |
| 2015/0096973 | A1 | 4/2015 | Dunn et al. |
| 2015/0099065 | A1 | 4/2015 | Canizares et al. |
| 2015/0099072 | A1 | 4/2015 | Takamure et al. |
| 2015/0099342 | A1 | 4/2015 | Tsai |
| 2015/0102466 | A1 | 4/2015 | Colinge |
| 2015/0111374 | A1 | 4/2015 | Bao |
| 2015/0111395 | A1 | 4/2015 | Hashimoto et al. |
| 2015/0122180 | A1 | 5/2015 | Chang et al. |
| 2015/0132212 | A1 | 5/2015 | Winkler et al. |
| 2015/0140210 | A1 | 5/2015 | Jung et al. |
| 2015/0147483 | A1 | 5/2015 | Fukazawa |
| 2015/0147488 | A1 | 5/2015 | Choi et al. |
| 2015/0147877 | A1 | 5/2015 | Jung |
| 2015/0162168 | A1 | 6/2015 | Oehrlien |
| 2015/0162185 | A1 | 6/2015 | Pore |
| 2015/0162214 | A1 | 6/2015 | Thompson |
| 2015/0167159 | A1 | 6/2015 | Halpin et al. |
| 2015/0170914 | A1 | 6/2015 | Haukka et al. |
| 2015/0170947 | A1 | 6/2015 | Bluck |
| 2015/0170954 | A1 | 6/2015 | Agarwal |
| 2015/0171177 | A1 | 6/2015 | Cheng et al. |
| 2015/0174768 | A1 | 6/2015 | Rodnick |
| 2015/0179501 | A1 | 6/2015 | Jhaveri et al. |
| 2015/0179564 | A1 | 6/2015 | Lee et al. |
| 2015/0184291 | A1 | 7/2015 | Alokozai et al. |
| 2015/0187559 | A1 | 7/2015 | Sano |
| 2015/0187568 | A1 | 7/2015 | Pettinger et al. |
| 2015/0217330 | A1 | 8/2015 | Haukka |
| 2015/0217456 | A1 | 8/2015 | Tsuji et al. |
| 2015/0218695 | A1 | 8/2015 | Odedra |
| 2015/0225850 | A1 | 8/2015 | Arora et al. |
| 2015/0228572 | A1 | 8/2015 | Yang et al. |
| 2015/0240359 | A1 | 8/2015 | Jdira et al. |
| 2015/0243542 | A1 | 8/2015 | Yoshihara et al. |
| 2015/0243545 | A1 | 8/2015 | Tang |
| 2015/0243658 | A1 | 8/2015 | Joshi et al. |
| 2015/0255385 | A1 | 9/2015 | Lee et al. |
| 2015/0259790 | A1 | 9/2015 | Newman |
| 2015/0263033 | A1 | 9/2015 | Aoyama |
| 2015/0267295 | A1 | 9/2015 | Hill et al. |
| 2015/0267297 | A1 | 9/2015 | Shiba |
| 2015/0267298 | A1 | 9/2015 | Saitou et al. |
| 2015/0267299 | A1 | 9/2015 | Hawkins |
| 2015/0267301 | A1 | 9/2015 | Hill et al. |
| 2015/0270140 | A1 | 9/2015 | Gupta et al. |
| 2015/0270146 | A1 | 9/2015 | Yoshihara et al. |
| 2015/0279681 | A1 | 10/2015 | Knoops |
| 2015/0279708 | A1 | 10/2015 | Kobayashi et al. |
| 2015/0284848 | A1 | 10/2015 | Nakano et al. |
| 2015/0287626 | A1 | 10/2015 | Arai |
| 2015/0287710 | A1 | 10/2015 | Yun et al. |
| 2015/0292088 | A1 | 10/2015 | Canizares |
| 2015/0299848 | A1 | 10/2015 | Haukka et al. |
| 2015/0308586 | A1 | 10/2015 | Shugrue et al. |
| 2015/0303056 | A1 | 11/2015 | Varadarajan et al. |
| 2015/0315704 | A1 | 11/2015 | Nakano et al. |
| 2015/0340247 | A1 | 11/2015 | Balakrishnan et al. |
| 2015/0340500 | A1 | 11/2015 | Brunco |
| 2015/0343741 | A1 | 12/2015 | Shibata et al. |
| 2015/0348755 | A1 | 12/2015 | Han et al. |
| 2015/0361553 | A1 | 12/2015 | Murakawa |
| 2015/0364371 | A1 | 12/2015 | Yen |

(56) References Cited

U.S. PATENT DOCUMENTS

| | | | |
|---|---|---|---|
| 2015/0367253 | A1 | 12/2015 | Kanyal et al. |
| 2015/0376211 | A1 | 12/2015 | Girard |
| 2015/0376785 | A1 | 12/2015 | Knaapen et al. |
| 2015/0380296 | A1 | 12/2015 | Antonelli et al. |
| 2016/0013022 | A1 | 1/2016 | Ayoub |
| 2016/0013024 | A1 | 1/2016 | Milligan et al. |
| 2016/0020092 | A1 | 1/2016 | Kang et al. |
| 2016/0024656 | A1 | 1/2016 | White et al. |
| 2016/0035566 | A1 | 2/2016 | LaVoie |
| 2016/0051964 | A1 | 2/2016 | Tolle et al. |
| 2016/0056074 | A1 | 2/2016 | Na |
| 2016/0079054 | A1 | 3/2016 | Chen et al. |
| 2016/0097123 | A1 | 4/2016 | Shugrue et al. |
| 2016/0099150 | A1 | 4/2016 | Tsai |
| 2016/0102214 | A1 | 4/2016 | Dietz et al. |
| 2016/0111272 | A1 | 4/2016 | Girard |
| 2016/0111438 | A1 | 4/2016 | Tsutsumi et al. |
| 2016/0115590 | A1 | 4/2016 | Haukka et al. |
| 2016/0133307 | A1 | 5/2016 | Lee et al. |
| 2016/0133628 | A1 | 5/2016 | Xie |
| 2016/0141172 | A1 | 5/2016 | Kang |
| 2016/0145738 | A1 | 5/2016 | Liu et al. |
| 2016/0148811 | A1 | 5/2016 | Nakatani et al. |
| 2016/0148821 | A1 | 5/2016 | Singh |
| 2016/0155629 | A1 | 6/2016 | Hawryluk et al. |
| 2016/0163556 | A1 | 6/2016 | Briggs et al. |
| 2016/0163561 | A1 | 6/2016 | Hudson et al. |
| 2016/0163711 | A1 | 6/2016 | Arndt et al. |
| 2016/0168699 | A1 | 6/2016 | Fukazawa et al. |
| 2016/0181128 | A1 | 6/2016 | Mori |
| 2016/0181368 | A1 | 6/2016 | Weeks |
| 2016/0190137 | A1 | 6/2016 | Tsai et al. |
| 2016/0211135 | A1 | 7/2016 | Noda et al. |
| 2016/0211147 | A1 | 7/2016 | Fukazawa |
| 2016/0217857 | A1 | 7/2016 | Paudel |
| 2016/0225607 | A1 | 8/2016 | Yamamoto et al. |
| 2016/0245704 | A1 | 8/2016 | Osaka et al. |
| 2016/0256187 | A1 | 9/2016 | Shelton et al. |
| 2016/0268102 | A1 | 9/2016 | White |
| 2016/0268107 | A1 | 9/2016 | White |
| 2016/0276148 | A1 | 9/2016 | Qian et al. |
| 2016/0284542 | A1 | 9/2016 | Noda et al. |
| 2016/0289828 | A1 | 10/2016 | Shero et al. |
| 2016/0293398 | A1 | 10/2016 | Danek et al. |
| 2016/0307766 | A1 | 10/2016 | Jongbloed et al. |
| 2016/0312360 | A1 | 10/2016 | Rasheed et al. |
| 2016/0314964 | A1 | 10/2016 | Tang et al. |
| 2016/0334709 | A1 | 11/2016 | Huli et al. |
| 2016/0358772 | A1 | 12/2016 | Xie |
| 2016/0362783 | A1 | 12/2016 | Tolle et al. |
| 2016/0362813 | A1 | 12/2016 | Bao et al. |
| 2016/0365280 | A1 | 12/2016 | Brink et al. |
| 2016/0372365 | A1 | 12/2016 | Tang et al. |
| 2016/0372744 | A1 | 12/2016 | Essaki et al. |
| 2016/0376700 | A1 | 12/2016 | Haukka |
| 2016/0376704 | A1 | 12/2016 | Raisanen |
| 2016/0379851 | A1 | 12/2016 | Swaminathan et al. |
| 2016/0381732 | A1 | 12/2016 | Moench et al. |
| 2017/0011889 | A1 | 1/2017 | Winkler et al. |
| 2017/0011950 | A1 | 1/2017 | Schmotzer |
| 2017/0018477 | A1 | 1/2017 | Kato |
| 2017/0025280 | A1 | 1/2017 | Milligan |
| 2017/0025291 | A1 | 1/2017 | Lin |
| 2017/0029945 | A1 | 2/2017 | Kamakura |
| 2017/0033004 | A1 | 2/2017 | Siew et al. |
| 2017/0037513 | A1 | 2/2017 | Haukka |
| 2017/0040164 | A1 | 2/2017 | Wang et al. |
| 2017/0040206 | A1 | 2/2017 | Schmotzer et al. |
| 2017/0047446 | A1 | 2/2017 | Margetis et al. |
| 2017/0051408 | A1 | 2/2017 | Kosuke et al. |
| 2017/0053811 | A1 | 2/2017 | Fung et al. |
| 2017/0062204 | A1 | 3/2017 | Suzuki et al. |
| 2017/0062209 | A1 | 3/2017 | Shiba |
| 2017/0062258 | A1 | 3/2017 | Bluck |
| 2017/0091320 | A1 | 3/2017 | Psota et al. |
| 2017/0092469 | A1 | 3/2017 | Kurita et al. |
| 2017/0092531 | A1 | 3/2017 | Coomer |
| 2017/0092847 | A1 | 3/2017 | Kim et al. |
| 2017/0100742 | A1 | 4/2017 | Pore et al. |
| 2017/0103907 | A1 | 4/2017 | Chu et al. |
| 2017/0107621 | A1 | 4/2017 | Suemori |
| 2017/0110313 | A1 | 4/2017 | Tang et al. |
| 2017/0114464 | A1 | 4/2017 | Iriuda et al. |
| 2017/0117141 | A1 | 4/2017 | Zhu et al. |
| 2017/0117202 | A1 | 4/2017 | Tang et al. |
| 2017/0117203 | A1 | 4/2017 | Tang et al. |
| 2017/0117222 | A1 | 4/2017 | Kim et al. |
| 2017/0130332 | A1 | 5/2017 | Stumpf |
| 2017/0136578 | A1 | 5/2017 | Yoshimura |
| 2017/0154757 | A1 | 6/2017 | Winkler et al. |
| 2017/0173696 | A1 | 6/2017 | Sheinman |
| 2017/0178899 | A1 | 6/2017 | Kabansky et al. |
| 2017/0186754 | A1 | 6/2017 | Blomberg et al. |
| 2017/0191164 | A1 | 7/2017 | Alokozai et al. |
| 2017/0196562 | A1 | 7/2017 | Shelton |
| 2017/0216762 | A1 | 8/2017 | Shugrue et al. |
| 2017/0232457 | A1 | 8/2017 | Toshiki et al. |
| 2017/0243734 | A1 | 8/2017 | Ishikawa et al. |
| 2017/0250068 | A1 | 8/2017 | Ishikawa et al. |
| 2017/0250075 | A1 | 8/2017 | Caymax et al. |
| 2017/0256429 | A1 | 9/2017 | Lawson et al. |
| 2017/0260649 | A1 | 9/2017 | Coomer |
| 2017/0263437 | A1 | 9/2017 | Li et al. |
| 2017/0267527 | A1 | 9/2017 | Kim et al. |
| 2017/0267531 | A1 | 9/2017 | Huakka |
| 2017/0271256 | A1 | 9/2017 | Inatsuka |
| 2017/0271501 | A1 | 9/2017 | Avci et al. |
| 2017/0278707 | A1 | 9/2017 | Margetis et al. |
| 2017/0287681 | A1 | 10/2017 | Nitadori et al. |
| 2017/0294318 | A1 | 10/2017 | Yoshida et al. |
| 2017/0306478 | A1 | 10/2017 | Raisanen et al. |
| 2017/0306479 | A1 | 10/2017 | Raisanen et al. |
| 2017/0306480 | A1 | 10/2017 | Zhu et al. |
| 2017/0316933 | A1 | 11/2017 | Xie et al. |
| 2017/0316940 | A1 | 11/2017 | Ishikawa et al. |
| 2017/0317194 | A1 | 11/2017 | Tang et al. |
| 2017/0338192 | A1 | 11/2017 | Lee et al. |
| 2017/0342559 | A1 | 11/2017 | Fukazawa et al. |
| 2017/0343896 | A1 | 11/2017 | Darling et al. |
| 2017/0358670 | A1 | 12/2017 | Kub et al. |
| 2017/0372884 | A1 | 12/2017 | Margetis et al. |
| 2018/0010247 | A1 | 1/2018 | Niskanen |
| 2018/0025890 | A1 | 1/2018 | Choi |
| 2018/0025939 | A1 | 1/2018 | Kovalgin et al. |
| 2018/0033616 | A1 | 2/2018 | Masaru |
| 2018/0033625 | A1 | 2/2018 | Yoo |
| 2018/0033645 | A1 | 2/2018 | Saido et al. |
| 2018/0033674 | A1 | 2/2018 | Jeong |
| 2018/0033679 | A1 | 2/2018 | Pore |
| 2018/0040746 | A1 | 2/2018 | Johnson et al. |
| 2018/0047749 | A1 | 2/2018 | Kim |
| 2018/0057937 | A1 | 3/2018 | Lee et al. |
| 2018/0061628 | A1 | 3/2018 | Ou et al. |
| 2018/0061851 | A1 | 3/2018 | Ootsuka |
| 2018/0069019 | A1 | 3/2018 | Kim et al. |
| 2018/0076021 | A1 | 3/2018 | Fukushima et al. |
| 2018/0083435 | A1 | 3/2018 | Redler |
| 2018/0087152 | A1 | 3/2018 | Yoshida |
| 2018/0087154 | A1 | 3/2018 | Pore et al. |
| 2018/0087156 | A1 | 3/2018 | Kohei et al. |
| 2018/0102276 | A1 | 4/2018 | Zhu et al. |
| 2018/0105930 | A1 | 4/2018 | Kang et al. |
| 2018/0108587 | A1 | 4/2018 | Jiang |
| 2018/0114680 | A1 | 4/2018 | Kim et al. |
| 2018/0119283 | A1 | 5/2018 | Fukazawa |
| 2018/0122642 | A1 | 5/2018 | Raisanen |
| 2018/0122709 | A1 | 5/2018 | Xie |
| 2018/0122959 | A1 | 5/2018 | Calka et al. |
| 2018/0127876 | A1 | 5/2018 | Tolle |
| 2018/0130652 | A1 | 5/2018 | Pettinger et al. |
| 2018/0130701 | A1 | 5/2018 | Chun |
| 2018/0135173 | A1 | 5/2018 | Kim et al. |
| 2018/0135179 | A1 | 5/2018 | Toshiyuki et al. |
| 2018/0142353 | A1 | 5/2018 | Tetsuya et al. |

(56) References Cited

U.S. PATENT DOCUMENTS

| | | | |
|---|---|---|---|
| 2018/0142357 A1 | 5/2018 | Yoshikazu | |
| 2018/0151346 A1 | 5/2018 | Blanquart | |
| 2018/0151358 A1 | 5/2018 | Margetis et al. | |
| 2018/0158688 A1 | 6/2018 | Chen | |
| 2018/0166258 A1 | 6/2018 | Kim et al. | |
| 2018/0166315 A1 | 6/2018 | Coomer | |
| 2018/0171475 A1 | 6/2018 | Maes et al. | |
| 2018/0171477 A1 | 6/2018 | Kim et al. | |
| 2018/0174826 A1 | 6/2018 | Raaijmakers et al. | |
| 2018/0182613 A1 | 6/2018 | Blanquart et al. | |
| 2018/0182618 A1 | 6/2018 | Blanquart et al. | |
| 2018/0189923 A1 | 7/2018 | Zhong et al. | |
| 2018/0195174 A1 | 7/2018 | Kim et al. | |
| 2018/0223429 A1 | 8/2018 | Fukazawa et al. | |
| 2018/0233372 A1 | 8/2018 | Vayrynen et al. | |
| 2018/0286663 A1 | 10/2018 | Kobayashi et al. | |
| 2018/0286675 A1 | 10/2018 | Blomberg et al. | |
| 2018/0286711 A1 | 10/2018 | Oosterlaken et al. | |

FOREIGN PATENT DOCUMENTS

| | | |
|---|---|---|
| CN | 1664987 | 9/2005 |
| CN | 1825535 | 8/2006 |
| CN | 101330015 | 12/2008 |
| CN | 101522943 | 9/2009 |
| CN | 101681873 | 3/2010 |
| CN | 101423937 | 9/2011 |
| CN | 102383106 | 3/2012 |
| DE | 102008052750 | 6/2009 |
| EP | 0887632 | 12/1998 |
| EP | 1889817 | 2/2008 |
| EP | 2036600 | 3/2009 |
| EP | 2426233 | 7/2012 |
| FR | 1408266 | 8/1965 |
| FR | 2233614 | 1/1975 |
| GB | 752-277 | 7/1956 |
| JP | 58-19462 | 4/1983 |
| JP | 59-211779 | 11/1984 |
| JP | 61038863 | 2/1986 |
| JP | H01296613 | 11/1989 |
| JP | H0293071 | 4/1990 |
| JP | H02-185038 | 7/1990 |
| JP | 03-044472 | 2/1991 |
| JP | H03-044472 | 2/1991 |
| JP | H03-155625 | 7/1991 |
| JP | H03-248427 | 11/1991 |
| JP | H04029313 | 1/1992 |
| JP | H04-115531 | 4/1992 |
| JP | H04115531 | 4/1992 |
| JP | H05-23079 | 3/1993 |
| JP | H02-118928 | 5/1993 |
| JP | H05-171446 | 7/1993 |
| JP | 06-53210 | 2/1994 |
| JP | H06-053210 | 2/1994 |
| JP | H0684888 | 3/1994 |
| JP | H06-338497 | 12/1994 |
| JP | H07-297271 | 1/1995 |
| JP | H0729836 | 1/1995 |
| JP | H07-109576 | 4/1995 |
| JP | 07-130731 | 5/1995 |
| JP | 07-034936 | 8/1995 |
| JP | H07-034936 | 8/1995 |
| JP | 7-272694 | 10/1995 |
| JP | H07-283149 | 10/1995 |
| JP | H07283149 | 10/1995 |
| JP | H07-209093 | 11/1995 |
| JP | 08-181135 | 7/1996 |
| JP | H08-181135 | 7/1996 |
| JP | H08-335558 | 12/1996 |
| JP | H08335558 | 12/1996 |
| JP | 9-89676 | 4/1997 |
| JP | H09148322 | 6/1997 |
| JP | H10041096 | 2/1998 |
| JP | 10-064696 | 3/1998 |
| JP | H10-064696 | 3/1998 |
| JP | H10-153494 | 6/1998 |
| JP | H10-227703 | 8/1998 |
| JP | 10-0261620 | 9/1998 |
| JP | H10-0261620 | 9/1998 |
| JP | 2845163 | 1/1999 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2001-15698 | 1/2001 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001342570 | 12/2001 |
| JP | 2002164342 | 6/2002 |
| JP | 2002170781 | 6/2002 |
| JP | 2003035574 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004091848 | 3/2004 |
| JP | 2004113270 | 4/2004 |
| JP | 2004128019 | 4/2004 |
| JP | 2004134553 | 4/2004 |
| JP | 2004294638 | 10/2004 |
| JP | 2004310019 | 11/2004 |
| JP | 2004538374 | 12/2004 |
| JP | 2005033221 | 2/2005 |
| JP | 2005079254 | 3/2005 |
| JP | 2005507030 | 3/2005 |
| JP | 2005172489 | 6/2005 |
| JP | 2006059931 | 3/2006 |
| JP | 2006090762 | 4/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 3140111 | 3/2008 |
| JP | 2008060304 | 3/2008 |
| JP | 2008066159 | 3/2008 |
| JP | 2008172083 | 7/2008 |
| JP | 2008527748 | 7/2008 |
| JP | 2008202107 | 9/2008 |
| JP | 2009016815 | 1/2009 |
| JP | 2009088421 | 4/2009 |
| JP | 2009239082 | 4/2009 |
| JP | 2009099938 | 5/2009 |
| JP | 2009194248 | 8/2009 |
| JP | 2009251216 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2011049592 | 3/2011 |
| JP | 2011162830 | 8/2011 |
| JP | 2011181681 | 9/2011 |
| JP | 2012089837 | 5/2012 |
| JP | 2012146939 | 8/2012 |
| JP | 2013026479 | 2/2013 |
| JP | 2013235912 | 11/2013 |
| JP | 2016174158 | 9/2016 |
| KR | 10-2000-0031098 | 6/2000 |
| KR | 10-2000-0045257 | 7/2000 |
| KR | 10-0295043 | 4/2001 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |

(56) References Cited

FOREIGN PATENT DOCUMENTS

| | | |
|---|---|---|
| KR | 10-0593960 | 6/2006 |
| KR | 10-0688484 | 2/2007 |
| KR | 10-2007-0084683 | 8/2007 |
| KR | 10-2009-0055443 | 6/2009 |
| KR | 10-2010-0020834 | 2/2010 |
| KR | 20100020834 | 2/2010 |
| KR | 10-2010-0032812 | 3/2010 |
| KR | 10-1114219 | 3/2012 |
| KR | 10-1535573 | 7/2015 |
| TW | 538327 | 6/2003 |
| TW | I226380 | 1/2005 |
| TW | M292692 | 6/2006 |
| TW | 200701301 | 1/2007 |
| TW | 200731357 | 8/2007 |
| TW | 201247690 | 12/2012 |
| TW | 201330086 | 7/2013 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004008827 | 1/2004 |
| WO | 2004010467 | 1/2004 |
| WO | 2004106584 | 12/2004 |
| WO | 2005112082 | 11/2005 |
| WO | 2006054854 | 5/2006 |
| WO | 2006056091 | 6/2006 |
| WO | 2006078666 | 7/2006 |
| WO | 2006080782 | 8/2006 |
| WO | 2006101857 | 9/2006 |
| WO | 2006114781 | 11/2006 |
| WO | 2007024720 | 3/2007 |
| WO | 2007027165 | 3/2007 |
| WO | 2007117718 | 10/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2010118051 | 1/2011 |
| WO | 2011019950 | 2/2011 |
| WO | 2011149640 | 12/2011 |
| WO | 2012077590 | 6/2012 |
| WO | 2013078065 | 5/2013 |
| WO | 2013078066 | 5/2013 |
| WO | 2014107290 | 7/2014 |
| WO | 2015026230 | 2/2015 |
| WO | 2015107009 | 7/2015 |
| WO | 2018109553 | 6/2016 |
| WO | 2018109554 | 6/2016 |
| WO | 2017108713 | 6/2017 |
| WO | 2017108714 | 6/2017 |
| WO | 2017212546 | 12/2017 |
| WO | 2018003072 | 1/2018 |
| WO | 2018008088 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 20181095 | 6/2018 |
| WO | 2018109552 | 6/2018 |

OTHER PUBLICATIONS

USPTO; Notice of Allowance dated Sep. 13, 2012 in U.S. Appl. No. 13/085,968.

USPTO; Final Office Action dated May 26, 2015 in U.S. Appl. No. 13/169,591.

USPTO; Office Action dated Jan. 10, 2013 in U.S. Appl. No. 13/339,609.

USPTO; Office Action dated Feb. 13, 2014 in U.S. Appl. No. 13/411,271.

USPTO; Office Action dated Jul. 31, 2014 in U.S. Appl. No. 13/411,271.

USPTO; Restriction Requirement dated Oct. 29, 2013 in U.S. Appl. No. 13/439,528.

USPTO; USPTO; Notice of Allowance dated Aug. 28, 2015 in U.S. Appl. No. 13/597,043.

USPTO; Final Office Action dated Jan. 22, 2016 in U.S. Appl. No. 13/679,502.

USPTO; Notice of Allowance dated Mar. 13, 2015 dated in U.S. Appl. No. 13/749,878.

USPTO; Final Office Action dated Feb. 11, 2016 U.S. Appl. No. 14/090,750.

USPTOl; Notice of Allowance dated Feb. 23, 2016 in U.S. Appl. No. 14/327,134.

PCT; International Search report and Written Opinion dated Nov. 12, 2010 in Application No. PCT/US2010/030126.

PCT; International Preliminary Report on Patentability dated Oct. 11, 2011 Application No. PCT/US2010/030126.

PCT; International Search report and Written Opinion dated Jan. 20, 2011 in Application No. PCT/US2010/045368.

PCT; International Search report and Written Opinion dated Feb. 6, 2013 in Application No. PCT/US2012/065343.

PCT; International Search report and Written Opinion dated Feb. 13, 2013 in Application No. PCT/US2012/065347.

Chang et al. "Small-Subthreshold-Swing and Low-Voltage Flexible Organic Thin-Film Transistors Which Use HfLaO as the Gate Dielectric," IEEE Electron Device Letters, 30, 2, IEEE Electron Device Society 133-135 (2009).

Chen et al., "A Self-Aligned Airgap Interconnect Scheme," IEEE International Interconnect Technology Conference, 1-3, 146-148 (2009).

Choi et al., "Low Temperature Formation of Silicon Oxide Thin Films by Atomic Layer Deposition Using NH3/O2 Plasma," ECS Solid State Letters, 2(12) 114-116 (2013).

Crowell, "Chemical methods of thin film deposition: Chemical vapor deposition, atomic layer deposition, and related technologies," Journal of Vacuum Science & Technology A 21.5, S88-S95 (2003).

H.J. Yun et al., "Comparison of Atomic Scale Etching of Poly-Si in Inductively Coupled Ar and He Plasmas," Korean Journal of Chemical Engineering, 24, 670-673 (2007).

Kim et al., "Characteristics of Low Tempemure High Quality Silicon Oxide by Plasma Enhanced Atomic Layer Deposition with In-Situ Plasma Densification Process," The Electrochemical Society, ECS Transactions, College of Information and Communication Engineerign, Sungkyunkwan University, 53(1), 321-329 (2013).

Kobayshi et al. "Temperature Dependence of SiO2 Film Growth with Plasma-Enhanced Atomic Layer Deposition," International Journal on the Science and Technology of Condensed Matter, 520, 3994-3998, (2012).

Koutsokeras et al. Texture and Microstructure Evolution in Single-Phase TixTa1-xN Alloys of Rocksalt Structure. Journal of Applied Physics, 110, 043535-1-043535-6, (2011).

Krenek et al. "IR Laser CVD of Nanodisperse Ge—Si—Sn Alloys Obtained by Dielectric Breakdown of GeH4/SiH4/SnH4 Mixtures", NanoCon, Brno, Czech Republic, EU (2014).

Liu et al., "Research, Design, and Experimen of End Effector for Wafer Transfer Robot," Industrial Robot: An International Journal, 79-91 (2012).

Maeng et al., "Electrical properties of atomic layer disposition Hf02 and Hf0xNy on Si Substrates with Various Crystal Orientations,"

(56) References Cited

OTHER PUBLICATIONS

Journal of the Electrochemical Society, 155, Department of Materials Science and Engineering, Pohang University of Science and Technology, H267-H271 (2008).
Novaro et al., "Theoretical Study on a Reaction Pathway of Ziegler-Natta-Type Catalysis," J. Chem. Phys. 68(5), 2337-2351 (1978).
Radamson et al.,"Growth of Sn-alloyed Group IV Materials for Photonic and Electronic Applications", Manufacturing Nano Structures, 5, 129-144.
S.D. Athavale et al., "Realization of Atomic Layer Etching of Silicon", Journal of Vacuum Science and Technology B, 14, 3702-3705 (1996).
Varma, et al., "Effect of Metal Halides on Thermal, Mechanical, and Electrical Properties of Polypyromelitimide Films," Journal of Applied Polymer Science, 32, 3987-4000, (1986).
Yun et al., "Behavior of Various Organosilicon Molecules in PECVD Processes for Hydrocarbon-Doped Silicon Oxide Films," Solid State Phenomena, 124-126, 347-350 (2007).
EPO; Extended European Search Report dated Apr. 28, 2014 in Application No. 11162225.4.
EPO; Notice of Allowance dated Feb. 3, 2015 in Application No. 11162225.4.
IPOS; Notice of Allowance dated Aug. 14, 2017 in Application No. 10201401237.
JPO; Office Action dated Mar. 27, 2012 in Application No. 2009-532567.
JPO; Notice of Allowance dated Jul. 31, 2012 in Application No. 2009-532567.
JPO; Office Action dated May 9, 2013 in Application No. 2010058415.
JPO; Office Action dated Nov. 5, 2013 in Application No. 2010058415.
JPO; Office Action dated Aug. 29, 2014 in Application No. 2010058415.
JPO; Notice of Allowance dated Dec. 24, 2014 in Application No. 2010058415.
JPO; Office Action dated Aug. 26, 2013 in Application No. 2010-153754.
JPO; Office Action dated Nov. 5, 2013 in Application No. 2010-193285.
JPO; Notice of Allowance dated Apr. 2, 2013 in Application No. 2010-509478.
JPO; Office Action dated Aug. 31, 2015 in Application No. 2011-284831.
JPO; Notice of Allowance dated Mar. 9, 2016 in Application No. 2011-284831.
JPO; Notice of Allowance dated Dec. 21, 2012 in Application No. 2011-514650.
JPO; Office Action dated Dec. 15, 2014 in Application No. 2011090067.
JPO; Notice of Allowance dated May 1, 2015 in Application No. 2011090067.
JPO; Office Action dated Jul. 19, 2016 in Application No. 2012-153698.
JPO; Notice of Allowance dated Oct. 26, 2016 in Application No. 2012-153698.
JPO; Notice of Allowance dated Jun. 12, 2015 in Application No. 2012-504786.
JPO; Notice of Allowance dated Jul. 2, 2013 in Application No. 2012-509857.
JPO; Office Action dated May 31, 2017 in Application No. 2013-160173.
JPO; Notice of Allowance dated Aug. 25, 2017 in Application No. 2013-160173.
JPO; Office Action dated Jun. 15, 2017 in Application No. 2013-178344.
JPO; Office Action dated Jan. 29, 2018 in Application No. 2013-178344.
JPO; Notice of Allowance dated Aug. 21, 2018 in Application No. 2013-178344.
JPO; Office Action dated Apr. 10, 2018 in Application No. 2014-120675.
JPO; Notice of Allowance dated Jun. 12, 2018 in Application No. 2014-120675.
JPO; Office Action dated Apr. 3, 2018 in Application No. 2014-188835.
JPO; Notice of Allowance dated Jun. 12, 2018 in Application No. 2014-188835.
JPO; Office Action dated May 8, 2018 in Application No. 2014-205548.
JPO; Notice of Allowance dated May 22, 2018 in Application No. 2014-216540.
JPO; Office Action dated Jul. 31, 2018 in Application No. 2015-034774.
KIPO; Notice of Allowance dated Sep. 29, 2016 in Application No. 10-2010-0028336.
KIPO; Notice of Allowance dated Dec. 1, 2016 in Application No. 10-2010-0067768.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Notice of Allowance dated Oct. 24, 2018 in Application No. 10-2011-0036449.
KIPO; Notice of Allowance dated Jan. 11, 2018 in Application No. 10-2011-0087600.
KIPO; Notice of Allowance dated Mar. 14, 2018 in Application No. 10-2011-0142924.
KIPO; Notice of Allowance dated Jun. 2, 0216 in Application No. 10-2011-7023416.
KIPO; Notice of Allowance dated Feb. 28, 2018 in Application No. 10-2012-0041878.
KIPO; Notice of Allowance dated May 30, 2018 in Application No. 10-2012-0042518.
KIPO; Office Action dated Dec. 13, 2018 in Application No. 10-2012-0064526.
KIPO; Notice of Allowance dated Nov. 22, 2018 in Application No. 10-2012-0103114.
KIPO; Notice of Allowance dated Feb. 23, 2018 in Application No. 10-2014-7017112.
KIPO; Notice of Allowance dated May 30, 2017 in Application No. 10-2016-7023913.
KIPO; Notice of Allowance dated Feb. 27, 2018 in Application No. 10-2017-0175442.
KIPO; Notice of Allowance dated Jul. 19, 2018 in Application No. 20187013945.
KIPO; Notice of Allowance dated Jan. 19, 2018 in Application No. 30-2017-0001320.
KIPO; Notice of Allowance dated Jul. 1, 2018 in Application No. 30-2017-0052872.
KIPO; Notice of Allowance dated Oct. 16, 2018 in Application No. 30-2018-0006016.
SIPO; Notice of Allowance dated May 8, 2015 in Application No. 201080015699.9.
SIPO; Notice of Allowance dated Aug. 22, 2014 in Application No. 201080020267.7.
SIPO; Notice of Allowance dated Oct. 16, 2015 in Application No. 201080020268.1.
SIPO; Notice of Allowance dated Oct. 24, 2014 in Application No. 201080036764.6.
SIPO; Notice of Allowance dated Aug. 26, 2015 in Application No. 201110155056.
SIPO; Notice of Allowance dated Apr. 13, 2017 in Application No. 201210201995.9.
SIPO; Notice of Allowance dated Jun. 16, 2016 in Application No. 201280057466.4.
SIPO; Notice of Allowance dated Jan. 3, 2017 in Application No. 201280057542.1.
SIPO; Notice of Allowance dated Jul. 20, 2017 in Application No. 201310412808.6.
SIPO; Notice of Allowance dated May 25, 2017 in Application No. 201730010308.9.

(56) References Cited

OTHER PUBLICATIONS

SIPO; Notice of Allowance dated Oct. 24, 2018 in Application No. 201830060972.9.
TIPO; Notice of Allowance dated Jun. 12, 2014 in Application No. 98117513.
TIPO; Notice of Allowance dated Feb. 24, 2016 in Application No. 99110511.
TIPO; Notice of Allowance dated Apr. 28, 2015 in Application No. 99114330.
TIPO; Notice of Allowance dated Oct. 16, 2015 in Application No. 99114331.
TIPO; Notice of Allowance dated Mar. 14, 2016 in Application No. 99127063.
TIPO; Notice of Allowance dated Jun. 29, 2016 in Applicaton No. 100113130.
TIPO; Notice of Allowance dated Oct. 14, 2015 in Application No. 100130472.
TIPO; Notice of Allowance dated Oct. 19, 2016 in Application No. 101124745.
TIPO; Notice of Allowance dated Nov. 2, 2016 in Application No. 101142581.
TIPO; Notice of Allowance dated Sep. 9, 2016 in Application No. 101142582.
TIPO; Notice of Allowance dated Feb. 13, 2017 in Application No. 102113028.
TIPO; Notice of Allowance dated Dec. 26, 2017 in Application No. 102115605.
TIPO; Notice of Allowance dated May 3, 2017 in Application No. 102129262.
TIPO; Notice of Allowance dated Aug. 24, 2018 in Application No. 102126071.
TIPO; Notice of Allowance dated Jul. 18, 2017 in Application No. 102127065.
TIPO; Notice of Allowance dated Aug. 29, 2017 in Application No. 102129397.
TIPO; Notice of Allowance dated Jan. 26, 2017 in Application No. 102131839.
TIPO; Notice of Allowance dated Apr. 19, 2017 in Application No. 102132952.
TIPO; Notice of Allowance dated Jan. 24, 2018 in Application No. 103101400.
TIPO; Notice of Allowance dated Nov. 30, 2017 in Application No. 103102563.
TIPO; Notice of Allowance dated Oct. 20, 2017 in Application No. 103105251.
TIPO; Notice of Allowance dated Apr. 10, 2018 in Application No. 103106021.
TIPO; Notice of Allowance dated Apr. 10, 2018 in Application No. 103106022.
TIPO; Notice of Allowance dated Jan. 22, 2018 in Application No. 103117477.
TIPO; Notice of Allowance dated Mar. 13, 2018 in Application No. 103117478.
TIPO; Notice of Allowance dated Sep. 25, 2017 in Application No. 103120478.
TIPO; Office Action dated Sep. 20, 2018 in Application No. 103123439.
TIPO; Office Action dated Apr. 25, 2018 in Application No. 103124509.
TIPO; Notice of Allowance dated Jun. 19, 2018 in Application No. 103127588.
TIPO; Notice of Allowance dated Dec. 11, 2017 in Application No. 103127734.
TIPO; Notice of Allowance dated Apr. 19, 2018 in Application No. 103134537.
TIPO; Notice of Allowance dated Oct. 17, 2017 in Application No. 103136251.
TIPO; Notice of Allowance dated Jun. 13, 2018 in Application No. 103138510.
TIPO; Notice of Allowance dated Sep. 11, 2018 in Application No. 103139014.
TIPO; Notice of Allowance dated Sep. 18, 2018 in Application No. 104111910.
TIPO; Notice of Allowance dated Dec. 5, 2017 in Application No. 105308015.
TIPO; Notice of Allowance dated Jun. 5, 2018 in Application No. 106117181.
TIPO; Office Action dated Sep. 28, 2018 in Application No. 106119537.
TIPO; Office Action dated Aug. 31, 2018 in Application No. 106138119.
TIPO; Office Action dated Oct. 3, 2018 in Application No. 106142731.
TIPO; Office Action dated Sep. 28, 2018 in Application No. 107112951.
TIPO; Notice of Allowance dated Aug. 29, 2018 in Application No. 107300633.
TIPO; Notice of Allowance dated Apr. 11, 2018 in Application No. 105308015D01.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Final Office Action dated Nov. 2, 2018 in U.S. Appl. No. 13/169,951.
USPTO; Final Office Action dated Nov. 1, 2018 in U.S. Appl. No. 14/219,839.
USPTO; Final Office Action dated Nov. 2, 2018 in U.S. Appl. No. 14/219,879.
USPTO; Final Office Action dated Nov. 28, 2018 in U.S. Appl. No. 14/508,489.
USPTO; Notice of Allowance dated Nov. 19, 2018 in U.S. Appl. No. 14/656,588.
USPTO; Notice of Allowance dated Nov. 19, 2018 in U.S. Appl. No. 14/919,536.
USPTO; Final Office Action dated Dec. 10, 2018 in U.S. Appl. No. 14/997,683.
USPTO; Final Office Action dated Oct. 19, 2018 in U.S. Appl. No. 15/060,412.
USPTO; Non-Final Office Action dated Sep. 26, 2018 in U.S. Appl. No. 15/074,813.
USPTO; Non-Final Office Action dated Nov. 23, 2018 in U.S. Appl. No. 15/135,258.
USPTO; Non-Final Office Action dated Oct. 9, 2018 in U.S. Appl. No. 15/182,504.
USPTO; Final Office Action dated Oct. 9, 2018 in U.S. Appl. No. 15/205,827.
USPTO; Non-Final Office Action dated Nov. 14, 2018 in U.S. Appl. No. 15/377,439.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Restriction Requirement dated Dec. 5, 2018 in U.S. Appl. No. 15/402,993.
USPTO; Advisory Action dated Dec. 4, 2018 in U.S. Appl. No. 15/434,051.
USPTO; Notice of Allowance dated Nov. 30, 2018 in U.S. Appl. No. 15/472,750.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Final Office Action dated Nov. 16, 2018 in U.S. Appl. No. 15/592,730.
USPTO; Restriction Requirement dated Oct. 10, 2018 in U.S. Appl. No. 15/615,489.
USPTO; Non-Final Office Action dated Nov. 9, 2018 in U.S. Appl. No. 15/636,307.
USPTO; Final Office Action dated Nov. 20, 2018 in U.S. Appl. No. 15/650,686.
USPTO; Non-Final Office Action dated Dec. 4, 2018 in U.S. Appl. No. 15/672,063.

(56) References Cited

OTHER PUBLICATIONS

USPTO; Restriction Requirement dated Oct. 15, 2018 in U.S. Appl. No. 15/672,119.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Non-Final Office Action dated Dec. 6, 2018 in U.S. Appl. No. 15/705,955.
USPTO; Notice of Allowance dated Dec. 6, 2018 in U.S. Appl. No. 15/711,989.
USPTO; Final Office Action dated Dec. 13, 2018 in U.S. Appl. No. 15/719,208.
USPTO; Final Office Action dated Nov. 14, 2018 in U.S. Appl. No. 15/726,959.
USPTO; Non-Final Office Action dated Nov. 28, 2018 in U.S. Appl. No. 15/795,056.
USPTO; Non-Final Office Action dated Sep. 26, 2018 in U.S. Appl. No. 15/832,188.
USPTO; Notice of Allowance dated Dec. 10, 2018 in U.S. Appl. No. 15/863,340.
USPTO; Restriction Requirement dated Dec. 13, 2018 in U.S. Appl. No. 15/886,225.
USPTO; Non-Final Office Action dated Nov. 15, 2018 in U.S. Appl. No. 15/890,037.
USPTO; Restriction Requirement dated Oct. 9, 2018 in U.S. Appl. No. 15/892,756.
USPTO; Restriction Requirement dated Nov. 26, 2018 in U.S. Appl. No. 15/917,262.
USPTO; Restriction Requirement dated Nov. 2, 2018 in U.S. Appl. No. 16/018,692.
WIPO; International Search Report and Written Opinion dated Nov. 6, 2018 in Application No. PCT/IB2017/001652.
Beynet et al. "Low temperature plasma-enhanced ALD enables cost-effective spacer defined double patterning," Proceedings of SPIE, 7520, (2009).
Gupta et al., "Charge carrier transport and electroluminescence in atomic layer deposited poly-GaN/c-Si heterojunction diodes," Journal of Applied Physics, 124, 084503 (2018).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Mar. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.

(56) References Cited

OTHER PUBLICATIONS

USPTO; Restriction Requirement dated Dec. 20, 2011 in U.S. Appl. No. 12/436,306.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Advisory Action dated Oct. 1, 2014 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Notice of Allowance dated Oct. 9, 2013 in U.S. Appl. No. 12/618,419.
USPTO; Requirement for Restriction dated Sep. 12, 2011 in U.S. Appl. No. 12/718,731.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.

(56) References Cited

OTHER PUBLICATIONS

USPTO; Notice of Allowance dated Jan. 9, 2012 in U.S. Appl. No. 12/901,323.
USPTO; Requirement for Restriction dated Jul. 22, 2013 in U.S. Appl. No. 12/910,607.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Requirement for Restriction dated Sep. 10, 2010 in U.S. Appl. No. 12/148,956.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Requirement for Restriction dated Jun. 5, 2014 in U.S. Appl. No. 13/154,271.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Requirement for Restriction dated Apr. 6, 2016 in U.S. Appl. No. 13/166,367.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Requirement for Restriction dated Jun. 18, 2014 in U.S. Appl. No. 13/169,951.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Requirement for Restriction Sep. 25, 2012 in U.S. Appl. No. 13/184,351.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.

(56) References Cited

OTHER PUBLICATIONS

USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Restriction Requirement dated Aug. 21, 2014 in U.S. Appl. No. 13/187,300.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Restriction Requirement dated Oct. 2, 2013 in U.S. Appl. No. 13/312,591.
USPTO; Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Requirement for Restriction dated Nov. 26, 2013 in U.S. Appl. No. 13/333,420.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Requirement for Restriction dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.

(56) References Cited

OTHER PUBLICATIONS

USPTO; Notice of Allowance dated Mar. 20, 2014 in U.S. Appl. No. 13/493,897.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO;; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Restriction Requirement dated Jul. 9, 2013 in U.S. Appl. No. 13/612,538.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Notice of Allowance dated Feb. 25, 2015 in U.S. Appl. No. 13/612,538.
USPTO; Requirement for Restriction dated Feb. 4, 2015 in U.S. Appl. No. 13/646,403.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Requirement for Restriction dated Apr. 11, 2014 in U.S. Appl. No. 13/646,471.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Restriction Requirement dated Mar. 4, 2015 in U.S. Appl. No. 13/651,144.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Requirement for Restriction dated Dec. 24, 2014 in U.S. Appl. No. 13/665,366.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.

(56) References Cited

OTHER PUBLICATIONS

USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Sep. 1, 2016 in U.S. Appl. No. 14/827,177.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Requirement for Restriction dated Sep. 4, 2014 in U.S. Appl. No. 13/915,732.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.

(56) References Cited

OTHER PUBLICATIONS

USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action Restriction dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Requirement for Restriction dated Aug. 11, 2015 in U.S. Appl. No. 14/090,750.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.

(56) References Cited

OTHER PUBLICATIONS

USPTO; Non-Final Office Action dated Nov. 17, 2015 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Requirement for Restriction dated Sep. 24, 2015 in U.S. Appl. No. 14/188,760.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Restriction Requirement dated May 20, 2016 in U.S. Appl. No. 14/218,690.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Requirement for Restriction dated Jun. 15, 2015 in U.S. Appl. No. 14/268,348.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 30, 2016 in U.S. Appl. No. 14/268,348.
USPTO; Requirement for Restriction dated May 21, 2015 in U.S. Appl. No. 14/281,477.
USPTO; Non-Final Office Action dated Oct. 20, 2015 in U.S. Appl. No. 14/281,477.
USPTO; Advisory Action dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action dated Jul. 27, 2018 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.

(56) References Cited

OTHER PUBLICATIONS

USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated May 31, 2018 in U.S. Appl. No. 15/491,726.
USPTO; Requirement for Restriction dated Sep. 3, 2015 in U.S. Appl. No. 14/498,036.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Requirement for Restriction dated Mar. 20, 2015 in U.S. Appl. No. 14/505,290.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Restriction for Requirement dated Dec. 30, 2016 in U.S. Appl. No. 14/508,489.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Restriction Requirement dated Mar. 7, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Non-Final Office Action dated Sep. 27, 2016 in U.S. Appl. No. 14/606,354.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Requirement for Restriction dated Oct. 26, 2015 in U.S. Appl. No. 14/659,152.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Sep. 7, 2017 in U.S. Appl. No. 14/660,755.
USPTO; Restriction Requirement dated Sep. 11, 2017 in U.S. Appl. No. 14/660,755.
USPTO; Notice of Allowance dated Oct. 2, 2017 in U.S. Appl. No. 14/660,755.

(56) References Cited

OTHER PUBLICATIONS

USPTO; Notice of Allowance dated Mar. 25, 2016 in U.S. Appl. No. 14/693,138.
USPTO; Requirement for Restriction dated Jul. 5, 2017 in U.S. Appl. No. 14/752,712.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Requirement for Restriction dated Mar. 17, 2016 in U.S. Appl. No. 14/827,177.
USPTO; Notice of Allowance dated Jan. 27, 2017 in U.S. Appl. No. 14/827,177.
USPTO; Requirement for Restriction dated Aug. 8, 2016 in U.S. Appl. No. 14/829,565.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Requirement for Restriction dated Dec. 1, 2016 in U.S. Appl. No. 14/886,571.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Requirement for Restriction dated Sep. 20, 2016 in U.S. Appl. No. 14/919,536.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Requirement for Restriction dated Sep. 15, 2016 in U.S. Appl. No. 14/938,180.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.

(56) References Cited

OTHER PUBLICATIONS

USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Requirement for Restriction dated Apr. 19, 2017 in U.S. Appl. No. 15/050,159.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Requirement for Restriction dated Jun. 4, 2018 in U.S. Appl. No. 15/067,028.
USPTO; Non-Final Office Action dated Aug. 27, 2018 in U.S. Appl. No. 15/067,028.
USPTO; Requirement for Restriction dated Jun. 28, 2018 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Jan. 9, 2018 in U.S. Appl. No. 15/135,333.
USPTO; Notice of Allowance dated Oct. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Requirement for Restriction dated Jun. 22, 2018 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Requirement for Restriction dated Jan. 26, 2017 in U.S. Appl. No. 15/205,890.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Requirement for Restriction dated Apr. 3, 2017 in U.S. Appl. No. 15/222,715.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Sep. 10, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Requirement for Restriction dated Dec. 5, 2017 in U.S. Appl. No. 15/254,605.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Aug. 3, 2018 in U.S. Appl. No. 15/273,488.
USTPO; Non-Final Office Action dated Jul. 2, 2018 in U.S. Appl. No. 15/286,503.
USPTO; Requirement for Restriction dated Sep. 12, 2017 in U.S. Appl. No. 15/377,439.

(56) References Cited

OTHER PUBLICATIONS

USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated Jan. 4, 2018 in U.S. Appl. No. 15/380,921.
USPTO; Requirement for Restriction dated Sep. 21, 2017 in U.S. Appl. No. 15/380,921.
USPTO; Final Office Action dated Jun. 28, 2018 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Sep. 20, 2018 in U.S. Appl. No. 15/410,503.
USPTO; Non-Final Office Action dated Aug. 7, 2018 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Notice of Allowance dated Dec. 19, 2017 in U.S. Appl. No. 15/489,660.
USPTO; Non-Final Office Action dated Apr. 6, 2018 in U.S. Appl. No. 15/472,750.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Office Action dated May 3, 2018 in U.S. Appl. No. 15/589,861.
USPTO; Requirement of Restriction dated Mar. 30, 2018 in U.S. Appl. No. 15/589,849.
USPTO; Office Action dated Aug. 30, 2018 in U.S. Appl. No. 15/589,849.
USPTO; Non-Final Office Action dated Apr. 4, 2018 in U.S. Appl. No. 15/592,730.
USPTO; Requirement for Restriction dated Aug. 1, 2018 in U.S. Appl. No. 15/627,189.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Non-Final Office Action dated Sep. 21, 2017 in U.S. Appl. No. 15/659,631.
USPTO; Requirement for Restriction dated Apr. 6, 2018 in U.S. Appl. No. 15/659,631.
USPTO; Non-Final Office Action dated Aug. 9, 2018 in U.S. Appl. No. 15/660,805.
USPTO; Non-Final Office Action dated Aug. 27, 2018 in U.S. Appl. No. 15/662,107.
USPTO; Requirement for Restriction dated Sep. 11, 2018 in U.S. Appl. No. 15/672,063.
USPTO; Non-Final Office Action dated Jul. 27, 2018 in U.S. Appl. No. 15/673,110.
USPTO; Non-Final Office Action dated Apr. 25, 2018 in U.S. Appl. No. 15/673,278.
USPTO; Non-Final Office Action dated Jan. 18, 2018 in U.S. Appl. No. 15/683,701.
USPTO; Final Office Action dated Aug. 24, 2018 in U.S. Appl. No. 15/683,701.
USPTO; Non-Final Office Action dated Aug. 9, 2018 in U.S. Appl. No. 15/691,241.
USPTO; Requirement for Restriction dated Aug. 14, 2018 in U.S. Appl. No. 15/705,955.
USPTO; Requirement for Restriction dated Jul. 11, 2018 in U.S. Appl. No. 15/707,786.
USPTO; Requirement for Restriction dated May 11, 2018 in U.S. Appl. No. 15/711,989.
USPTO; Non-Final Office Action dated Jun. 14, 2018 in U.S. Appl. No. 15/711,989.
USPTO; Non-Final Office Action dated May 29, 2018 in U.S. Appl. No. 15/719,208.
USPTO; Non-Final Office Action dated Oct. 4, 2018 in U.S. Appl. No. 15/726,222.
USPTO; Non-Final Office Action dated Apr. 19, 2018 in U.S. Appl. No. 15/726,959.
USPTO; Non-Final Office Action dated May 17, 2018 in U.S. Appl. No. 15/729,485.
USPTO; Restriction Requirement dated Aug. 31, 2018 in U.S. Appl. No. 15/795,056.
USPTO; Non-Final Office Action dated Jun. 26, 2018 in U.S. Appl. No. 15/796,593.
USPTO; Non-Final Office Action dated Jun. 26, 2018 in U.S. Appl. No. 15/796,693.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Requirement for Restriction dated Apr. 6, 2018 in U.S. Appl. No. 15/798,201.
USPTO; Non-Final Office Action dated Aug. 9, 2018 in U.S. Appl. No. 15/798,201.
USPTO; Non-Final Office Action dated Jul. 2, 2018 in U.S. Appl. No. 15/815,483.
USPTO; Non-Final Office Action dated Sep. 10, 2018 in U.S. Appl. No. 15/836,547.
USPTO; Requirement for Restriction dated Mar. 21, 2018 in U.S. Appl. No. 15/863,340.
USPTO; Non-Final Office Action dated Jul. 23, 2018 in U.S. Appl. No. 15/863,340.

(56) References Cited

OTHER PUBLICATIONS

USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Requirement for Restriction dated Dec. 1, 2014 in U.S. Appl. No. 29/481,312.
USPTO; Notice of Allowance dated Jan. 12, 2015 in U.S. Appl. No. 29/481,312.
USPTO; Requirement for Restriction dated Dec. 4, 2014 in U.S. Appl. No. 29/481,315.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Notice of Allowance dated Jun. 26, 2018 in U.S. Appl. No. 29/604,288.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO: International Search Report and Written Opinion dated Jun. 1, 2018 in Application No. PCT/IB2017/001656.
WIPO; International Search Report and Written Opinion dated Jul. 9, 2018 in Application No. PCT/IB2018/000419.
Chinese Patent Office; Office Action dated Jan. 10, 2013 in Application No. 201080015699.9.
Chinese Patent Office; Office Action dated Aug. 1, 2013 in Application No. 201080015699.9.
Chinese Patent Office; Office Action dated Jan. 21, 2014 in Application No. 201080015699.9.
Chinese Patent Office; Office Action dated Jul. 24, 2014 in Application No. 201080015699.9.
Chinese Patent Office; Office Action dated Jan. 12, 2015 in Application No. 201080015699.9.
Chinese Patent Office; Office Action dated Dec. 10, 2013 in Application No. 201080020267.7.
Chinese Patent Office; Office Action dated Jan. 21, 2013 in Application No. 201080020268.1.
Chinese Patent Office; Office Action dated Sep. 26, 2013 in Application No. 201080020268.1.
Chinese Patent Office; Office Action dated Apr. 3, 2014 in Application No. 201080020268.1.
Chinese Patent Office; Office Action dated Sep. 23, 2014 in Application No. 201080020268.1.
Chinese Patent Office; Office Action dated Apr. 7, 2015 in Application No. 201080020268.1.
Chinese Patent Office; Office Action dated May 24, 2013 in Application No. 201080036764.6.
Chinese Patent Office; Office Action dated Jan. 2, 2014 in Application No. 201080036764.6.
Chinese Patent Office; Office Action dated Jul. 1, 2014 in Application No. 201080036764.6.
Chinese Patent Office; Office Action dated Feb. 8, 2014 in Application No. 201110155056.
Chinese Patent Office; Office Action dated Sep. 16, 2014 in Application No. 201110155056.
Chinese Patent Office; Office Action dated Feb. 9, 2015 in Application No. 201110155056.
Chinese Patent Office; Office Action dated Dec. 4, 2015 in Application No. 201210201995.9.
Chinese Patent Office; Office Action dated Jul. 14, 2016 in Application No. 201210201995.9.
Chinese Patent Office; Office Action dated Jan. 20, 2017 in Application No. 201210201995.9.
Chinese Patent Office; Office Action dated Dec. 24, 2015 in Application No. 201280057466.4.
Chinese Patent Office; Office Action dated Dec. 4, 2015 in Application No. 201280057542.1.
Chinese Patent Office; Office Action dated May 16, 2016 in Application No. 201280057542.1.
Chinese Patent Office; Office Action dated Sep. 9, 2016 in Application No. 201280057542.1.
Chinese Patent Office; Office Action dated Dec. 5, 2016 in Application No. 201310412808.6.
Chinese Patent Office; Office Action dated Feb. 5, 2018 in Application No. 201410331047.6.
European Patent Office; Supplementary European Search Report and Opinion dated Nov. 9, 2012 in Application No. 08798519.8.
European Patent Office; Office Action dated Jul. 18, 2016 in Application No. 08798519.8.
European Patent Office; Extended European Search Report dated Dec. 9, 2016 in Application No. 9767208.3.
European Patent Office; Office Action dated Aug. 10, 2018 in Application No. 09767208.3.
European Patent Office; Supplementary European Search Report and Opinion dated Jan. 5, 2017 in Application No. 09836647.9.
European Patent Office; Office Action dated Feb. 28, 2018 in Application No. 09836647.9.
Japanese Patent Office; Office Action dated Dec. 20, 2011 in Application No. 2010-522075.
Japanese Patent Office; Office Action dated Apr. 11, 2012 in Application No. 2010-522075.

(56) References Cited

OTHER PUBLICATIONS

Japanese Patent Office; Office Action dated May 31, 2012 in Application No. 2011-514650.
Japanese Patent Office; Office Action dated Sep. 11, 2012 in Application No. 2011-514650.
Japanese Patent Office; Office Action dated Dec. 25, 2013 in Application No. 2012-504786.
Japanese Patent Office; Office Action dated Jan. 25, 2014 in Application No. 2012-504786.
Japanese Patent Office; Office Action dated Dec. 1, 2014 in Application No. 2012-504786.
Japanese Patent Office; Office Action dated Mar. 11, 2013 in Application No. 2012-509857.
Korean Patent Office; Office Action dated Dec. 10, 2015 in Application No. 10-2010-0028336.
Korean Patent Office; Final Office Action dated Jun. 29, 2016 in Application No. 10-2010-0028336.
Korean Patent Office; Office Action dated Mar. 3, 2016 in Application No. 10-2010-0067768.
Korean Patent Office; Office Action dated Aug. 1, 2016 in Application No. 10-2010-0067768.
Korean Patent Office; Office Action dated May 2, 2016 in Application No. 10-2010-0082446.
Korean Patent Office; Office Action dated Sep. 19, 2016 in Application No. 10-2010-0082446.
Korean Patent Office; Office Action dated Nov. 24, 2017 in Application No. 10-2011-0036449.
Korean Patent Office; Office Action dated May 23, 2017 in Application No. 10-2011-0036449.
Korean Patent Office; Office Action dated Apr. 2, 2018 in Application No. 10-2011-0036449.
Korean Patent Office; Office Action dated Sep. 4, 2017 in Application No. 10-2011-0087600.
Korean Patent Office; Office Action dated Oct. 23, 2017 in Application No. 10-2011-0142924.
Korean Patent Office; Office Action dated Dec. 11, 2015 in Application No. 10-2011-7023416.
Korean Patent Office; Office Action dated Mar. 13, 2016 in Application No. 10-2011-7023416.
Korean Patent Office; Office Action dated Oct. 30, 2017 in Application No. 10-2012-0041878.
Korean Patent Office; Office Action dated Mar. 21, 2018 in Application No. 2012-0042518.
Korean Patent Office; Office Action dated Mar. 21, 2018 in Application No. 10-2012-0064526.
Korean Patent Office; Office Action dated Sep. 18, 2018 in Application No. 10-2012-0064526.
Korean Patent Office; Office Action dated Mar. 30, 2018 in Application No. 10-2012-0076564.
Korean Patent Office; Office Action dated Sep. 27, 2018 in Application No. 10-2012-0076564.
Korean Patent Office; Office Action dated Apr. 30, 2018 in Application No. 10-2012-0103114.
Korean Patent Office; Office Action dated Oct. 24, 2016 in Application No. 10-2012-7004062.
Korean Patent Office; Office Action dated Jul. 24, 2017 in Application No. 10-2012-7004062.
Korean Patent Office; Office Action dated Sep. 28, 2017 in Application No. 10-20147017112.
Korean Patent Office; Office Action dated Nov. 9, 2016 in Application No. 10-2016-7023913.
Korean Patent Office; Office Action dated Sep. 28, 2017 in Application No. 10-2017-7023740.
Korean Patent Office; Office Action dated Sep. 15, 2017 in Application No. 30-2017-0001320.
Korean Patent Office; Office Action dated Jul. 11, 2018 in Application No. 30-2018-006016.
Taiwanese Patent Office; Office Action dated Aug. 30, 2013 in Application No. 97132391.
Taiwanese Patent Office; Office Action dated Dec. 20, 2013 in Application No. 98117513.
Taiwan Patent Office; Office Action dated Jul. 4, 2014 in Application No. 099110511.
Taiwanese Patent Office; Office Action dated Aug. 27, 2014 in Application No. 99114329.
Taiwanese Patent Office; Office Action dated Dec. 26, 2014 in Application No. 99114330.
Taiwanese Patent Office; Office Action dated Aug. 14, 2014 in Application No. 99114331.
Taiwan Patent Office; Office Action dated Dec. 19, 2014 in Taiwan Application No. 099127063.
Taiwanese Patent Office; Office Action received in Application No. 100113130.
Taiwan Patent Office; Office Action dated May 13, 2016 in Taiwan Application No. 101142582.
Taiwanese Patent Office; Office Action dated Aug. 1, 2016 in Application No. 101124745.
Taiwanese Patent Office; Office Action received in Application No. 102113028.
Taiwanese Patent Office; Office Action received in Application No. 102115605.
Taiwanese Patent Office; Office Action dated Feb. 24, 2017 in Application No. 102115605.
Taiwanese Patent Office; Office Action received in Application No. 102125191.
Taiwanese Patent Office; Office Action dated Dec. 6, 2016 in Application No. 102126071.
Taiwanese Patent Office; Office Action dated May 17, 2018 in Application No. 102126071.
Taiwanese Patent Office; Office Action dated Feb. 10, 2017 in Application No. 102127065.
Taiwanese Patent Office; Office Action dated Mar. 11, 2016 in Application No. 102129262.
Taiwanese Patent Office; Office Action dated Dec. 29, 2016 in Application No. 102129397.
Taiwanese Patent Office; Office Action dated Nov. 4, 2016 in Application No. 102131839.
Taiwanese Patent Office; Office Action dated Dec. 2, 2016 in Application No. 102136496.
Taiwanese Patent Office; Office Action dated Jan. 10, 2018 in Application No. 102136496.
Taiwanese Patent Office; Office Action dated Nov. 11, 2016 in Application No. 102132952.
Taiwanese Patent Office; Office Action dated Jul. 17, 2017 in Application No. 103101400.
Taiwanese Patent Office; Office Action dated Feb. 23, 2017 in Application No. 103102563.
Taiwanese Patent Office; Office Action dated Mar. 3, 2017 in Application No. 103105251.
Taiwanese Patent Office; Office Action received in Application No. 103106021.
Taiwanese Patent Office; Office Action dated Oct. 31, 2017 in Application No. 103106022.
Taiwanese Patent Office; Office Action dated Jul. 5, 2017 in Application No. 103117477.
Taiwanese Patent Office; Office Action dated Nov. 22, 2017 in Application No. 103117478.
Taiwanese Patent Office; Office Action dated May 19, 2017 in Application No. 103120478.
Taiwanese Patent Office; Office Action dated Nov. 8, 2017 in Application No. 103124509.
Taiwanese Patent Office; Office Action dated Nov. 20, 2017 in Application No. 103127588.
Taiwanese Patent Office; Office Action dated Sep. 19, 2017 in Application No. 103127734.
Taiwanese Patent Office; Office Action dated Sep. 26, 2018 in Application No. 103132230.
Taiwanese Patent Office; Office Action dated Nov. 22, 2017 in Application No. 103134537.
Taiwanese Patent Office; Office Action dated Aug. 24, 2017 in Application No. 103136251.

(56) References Cited

OTHER PUBLICATIONS

Taiwanese Patent Office; Office Action dated Feb. 26, 2018 in Application No. 103138510.
Taiwanese Patent Office; Office Action dated May 21, 2018 in Application No. 103139014.
Taiwanese Patent Office; Office Action dated Jun. 22, 2018 in Application No. 104105533.
Taiwanese Patent Office; Office Action dated Jul. 9, 2018 in Application No. 104107876.
Taiwanese Patent Office; Office Action dates Aug. 7, 2018 Application No. 104107888.
Taiwanese Patent Office; Office Action dated Jul. 9, 2018 in Application No. 104110326.
Taiwanese Patent Office; Office Action dated Jun. 13, 2018 in Application No. 104111910.
Taiwanese Patent Office; Office Action dated Jul. 11, 2018 in Application No. 104124377.
Taiwanese Patent Office; Office Action received in Application No. 106117181.
Taiwanese Patent Office; Office Action dated Jun. 25, 2018 in Application No. 106138800.
Taiwanese Patent Office; Office Action dated Aug. 31, 2018 in Application No. 10720809210.
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Coates, "Process Analytical Technology: Spectroscopic Tools and Implementation Strategies for the Chemical and Pharmaceutical Industries." Blackwell Publishing Ltd, 91-132, (2005).
Crowell, "Chemical methods of thin film deposition: Chemical vapor deposition, atomic layer deposition, and related technologies," Journal of Vacuum Science & Technology A 21.5, (2003): S88-S95.
Crystal IS "Application Note: Using UV Reflective Materials to Maximize Disinfection"; AN011; Jun. 16, 2016.
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Harrison et al., "Poly-gate Replacement Through Contact Hole (PRETCH): A New Method for High-K/ Metal Gate and Multi-Oxide Implementation on Chip," IEEE (2004).
Heo et al., "Structural Characterization of Nanoporous Low-Dielectric Constant SiCOH Films Using Organosilane Precursors," NSTI—Nanotech, vol. 4, 122-123 (2007).
Henke et al.., "X-Ray Interactions: Photo absorption, Scattering, Transmission, and Reflection at E=50−30,000 eV, Z=1−92," Atomic Data and Nuclear Data Tables, 54, 181-342 (1993).
H.J. Yun et al., "Comparison of Atomic Scale Etching of Poly-Si in Inductively Coupled Ar and He Plasmas", Korean Journal of Chemical Engineering, vol. 24, 670-673 (2007).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Hudis, "Surface Crosslinking of Polyethylene Using a Hydrogen Glow Discharge," J. Appl. Polym. Sci., 16 (1972) 2397.
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
King, Plasma Enhanced Atomic Layer Deposition of SiNx: H and SiO2, J. Vac. Sci. Technol., A29(4) (2011).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).

(56) References Cited

OTHER PUBLICATIONS

Koutsokeras et al. "Texture and Microstructure Evolution in Single-Phase TixTa1-xN Alloys of Rocksalt Structure," Journal of Applied Physics, 110, pp. 043535-1-043535-6, (2011).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703.
Kurosawa et al., "Synthesis and Characterization of Plasma-Polymerized Hexamethyldisiloxane Films," Thin Solid Films, 506-507, 176-179 (2006).
Lanford et al., "The Hydrogen Content of Plasmadeposited Silicon Nitride," J. Appl. Phys., 49, 2473 (1978).
Lee et al., Layer Selection by Multi-Level Permutation in 3-D Stacked NAND Flash Memory, IEEE Electron Device Letters, vol. 37, No. 7, 866-869 (2016).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2.
Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experiment of End Effector for Wafer Transfer Robot," Industrial Robot: An International Journal, 79-91 (2012).
Longrie et al., "Plasma-Enhanced ALD of Platinum with O2, N2 and NH3 Plasmas", ECS Journal of Solid State Science and Technology, vol. 1, pp. Q123-Q129 (2012).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2Al)2O]n and (RAIO)n," J. American Chemical Society, vol. 115, No. 12, pp. 4971-4984 (1993).
Massachusetts Institute of Technology Lincoln Laboratory, "Solid State Research," Quarterly Technical Report (1995).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnC14 Precursor," ECS Transactions, 69 (5), 279-285 (2015).
Mukai et al., "A Study of CD Budget in Spacer Patterning Technology," Proc. of SPIE, 6924, 1-8 (2008).
Nigamananda et al., "Low-Temperature (<200oC) Plasma Enhanced Atomic Deposition of Dense Titanium Nitride Thin Films."
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
S. Okamoto et al., "Luminescent Properties of Pr3+-sensitized LaPO4: Gd3+ Ultraviolet-B Phosphor Under Vacuum-Ultraviolet Light Excitation," J. App. Phys. 106, 013522 (2009).
Park, "Substituted Aluminum Metal Gate on High-K Dielectric for Low Work-Function and Fermi-Level Pinning Free," 4 pages, IEEE 0-7803-8684-1/04 (2004).
"Polyurethane_HF"; webpage; no date.
Portet et al., "Impact of Synthesis Conditions on Surface Chemistry and Structure of Carbide-Derived Carbons," Thermochimica Acta, 497, 137-142 (2010).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al., "Correlation of Film Density and Wet Etch Rate in Hydrofluoric Acid of Plasma. Enhanced Atomic Layer Deposited Silicon Nitride," AIP Advances, 6 (2016).
Radamson et al. "Growth of Sn-alloyed Group IV Materials for Photonic and Electronic Applications", Chapter 5 pp. 129-144, Manufacturing Nano Structures.
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).

(56) References Cited

OTHER PUBLICATIONS

S.D. Athavale and D.J. Economou, "Realization of Atomic Layer Etching of Silicon", Journal of Vacuum Science and Technology B, vol. 14, year 1996, pp. 3702-3705.
Shamma et al., "PDL Oxide Enabled Doubling," Proc. of SPIE, 6924, 69240D, 1-10 (2008).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Varma, et al., "Effect of Metal Halides on Thermal, Mechanical, and Electrical Properties of Polypyromelitimide Films," Journal of Applied Polymer Science, vol. 32, pp. 3987-4000, (1986).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths, et al, "SiGeSn Growth tudies Using Reduced Pressure Chemical Vapor Deposition Towards Optoeleconic Applications," This Soid Films, 557, 183-187 (2014).
Xu et al., "14NM Metal Gate Film Stack Development and Challenges," SMIC et al. (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yun et al., "Behavior of Various Organosilicon Molecules in Pecvd Processes for Hydrocarbon-Doped Silicon Oxide Films," Solid State Phenomena, vol. 124-126, 347-350 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemial and Solid State Letters, 8(11) F47-F50 (2005).
Yushin et al., "Carbon-Derived Carbon," Department of Materials Science and Engineering, Taylor & Francis Group, LLC (2006).
Chemistry Stack Exchange, "Why is CF4 Non-Polar and CHF Polar," https://chemistry.stackexchange.com/questions/31604/why-is-cf4-non-polar-and-chf3-polar, (2015).

* cited by examiner

METHOD OF FORMING INSULATION FILM BY MODIFIED PEALD

CROSS REFERENCE TO RELATED APPLICATIONS

This application claims the benefit of U.S. Provisional Application No. 61/114,847, filed Nov. 14, 2008, and the disclosure of which is herein incorporated by reference in its entirety.

BACKGROUND

Field of the Invention

The present invention generally relates to a method of forming an insulation film by plasma enhanced atomic layer deposition (PEALD).

Description of the Related Art

ALD is a method of forming a film that offers a great coverage, but it presents a challenge in terms of throughput. On the other hand, CVD can achieve high film growth rates, but its coverage is not as good as what can be achieved with ALD. Conventional PEALD is a method whereby the first key material is adsorbed to the surface of the target and then a reactant gas that has been activated by a plasma is supplied to cause surface reaction with the adsorbed material (refer to US2005/0037154 A1, for example). Since what is occurring is surface reaction, height gaps are covered effectively and a good coverage can be achieved. However, this reaction only involves the adsorbed material and thus the film growth rate is low. In particular, the first material is sometimes a polymer material, in which case there are unfavorable three-dimensional shapes that keep the adsorption amount low. FIG. 1(*a*) shows a sequence of first material, reactant gas and plasma application as a comparative example in this disclosure.

SUMMARY

In some embodiments of the present invention, the film growth rate is increased while maintaining a good coverage, to achieve a high throughput. In other words, the material is broken down using a plasma into, say, a more active material having a smaller molecular weight and thereby increase the amount of material adsorbed to the surface, because then the film growth rate of ALD can be raised. In addition, the key operating principle of ALD is that material molecules are chemically adsorbed to the surface in a single layer until saturation. This is why a good coverage is achieved. Here, the intention is to partially activate the material, lowering the molecular size, and raise the adsorption amount. It should be noted, however, that the material may be adsorbed in multiple layers in some embodiments.

Under the method of forming a film proposed in some embodiments of the present invention, the precursor (also referred to as first material) is partially activated by use of a plasma, which means that the molecular weight of the material is lowered and the material is partially activated, and consequently more of this material thus activated is adsorbed to the surface. In the above, not all of the material is activated, and there are various species in terms of the activation degree, some of which are activated and some of which are not activated (the overall activation degree depends on plasma power), and in terms of the molecular size. If the activation degree of the material is high, the material may be adsorbed in multiple layers before the surface is sufficiently saturated, reducing the coverage property of deposition. In order to improve the coverage and the deposition rate, various species are generated wherein the material is partially decomposed and is partially activated by a plasma. Thereafter, a reactant gas that has been activated using a plasma is supplied to cause reaction with the first material now adsorbed to the surface to form and fix a film. In ALD, without the reaction with the reactant gas, the adsorbed material does not form a film. By the reaction with the reactant gas, a film is formed and fixed so that films can be stacked through multiple film-forming cycles to obtain a target film having a desired thickness. This sequence in a representative embodiment is shown in FIG. 1(*b*).

As for applications, this method can be favorably applied to a gate spacer SiN film (at a film thickness of 25 nm, for example), among others, because it can achieve an insulation film offering good coverage.

For example, the PEALD (plasma enhanced atomic layer deposition) film growth rate of SiN film based on a prior art is 0.05 nm/cycle or less. If the thickness of the target SiN film to be used as a gate spacer is 25 nm, for example, 500 cycles are required (Tae-Ho Yoon et al., "low temperature plasma enhanced atomic layer deposition of silicon nitride," abstract of ALD Conference 2008, Hodson C., "silicon nitride and silicon oxide thin film by plasma ALD," abstract of ALD Conference 2008). More cycles means lower throughput. The sequence conforming to an embodiment of the present invention can achieve a film growth rate of approx. 0.15 nm/cycle based on a similar combination of material and reactant gas. This means that 167 cycles are needed to form a film of 25 nm in thickness, which is a significant improvement in throughput.

In a typical embodiment, a method of forming an insulation film by plasma enhanced atomic layer deposition (PEALD) comprises: (i) introducing a precursor into a reaction space where a substrate is placed; (ii) treating the precursor with a plasma; (iii) adsorbing the plasma-treated precursor onto a surface of the substrate (without forming and fixing a film); (iv) treating the adsorbed surface using a reactant gas and a plasma to form and fix a film, wherein steps (i) to (iv) constitute one cycle; and (v) repeating the one cycle multiple times until an atomic layer of a desired thickness (e.g., less than 100 nm, depending on the application; e.g., about 30 nm as a gate spacer) is obtained.

In some embodiments, no reactant gas is supplied in steps (i) to (iii). In some embodiment, the reactant gas is also supplied in steps (i) to (iii), wherein in order to control reactivity between the precursor and the reactant gas, a slow reaction compound such as non-metal, silicon-based compounds (as compared with metal-based compounds) is used as the precursor, and a less reactive gas such as nitrogen or nitrogen-containing gas (as compared with oxygen gas) is used as the reactant gas, thereby reducing generation of particles and efficiently removing unwanted deposition by cleaning. In the above embodiments, the slow reaction compound can be decomposed to smaller molecules and excited by a plasma, thereby enhancing adsorption of the smaller molecules onto a surface of the substrate. In some embodiments, a purge process is conducted between step (iii) and step (iv).

In some embodiment, RF power generating the plasma in step (ii) is lower than RF power generating the plasma in step (iv). For example, the RF power generating the plasma in step (ii) may be 1 to 100 W for a 300-mm substrate, and the RF power generating the plasma in step (iv) may be more than 100 W for a 300-mm substrate. In an embodiment, the RF power generating the plasma in step (ii) is less than about 1/10 of the RF power generating the plasma in step (iv). In an embodiment, the RF power generating the plasma in step (ii) is less than about 0.07 W/cm2 per area of the substrate (less than 50 W for a 300-mm substrate). If the RF power generating the plasma in step (ii) is high, multiple sub-layers may be adsorbed on the surface, thereby increasing the deposition rate, but diminishing step coverage.

In some embodiment, the plasmas in steps (ii) and (iv) are generated in a gap between capacitively-coupled parallel plate electrodes.

In this disclosure, "gas" may include vaporized solid and/or liquid and may be constituted by a mixture of gases. In this disclosure, the precursor, the reactant gas, and the rare gas may be different from each other or mutually exclusive in terms of gas types, i.e., there is no overlap of gases among these categories. Further, in this disclosure, any ranges indicated may include or exclude the endpoints.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

FIG. 1(*b*) shows a film formation cycle according to an embodiment of the present invention.

DETAILED DESCRIPTION

Figure 1:
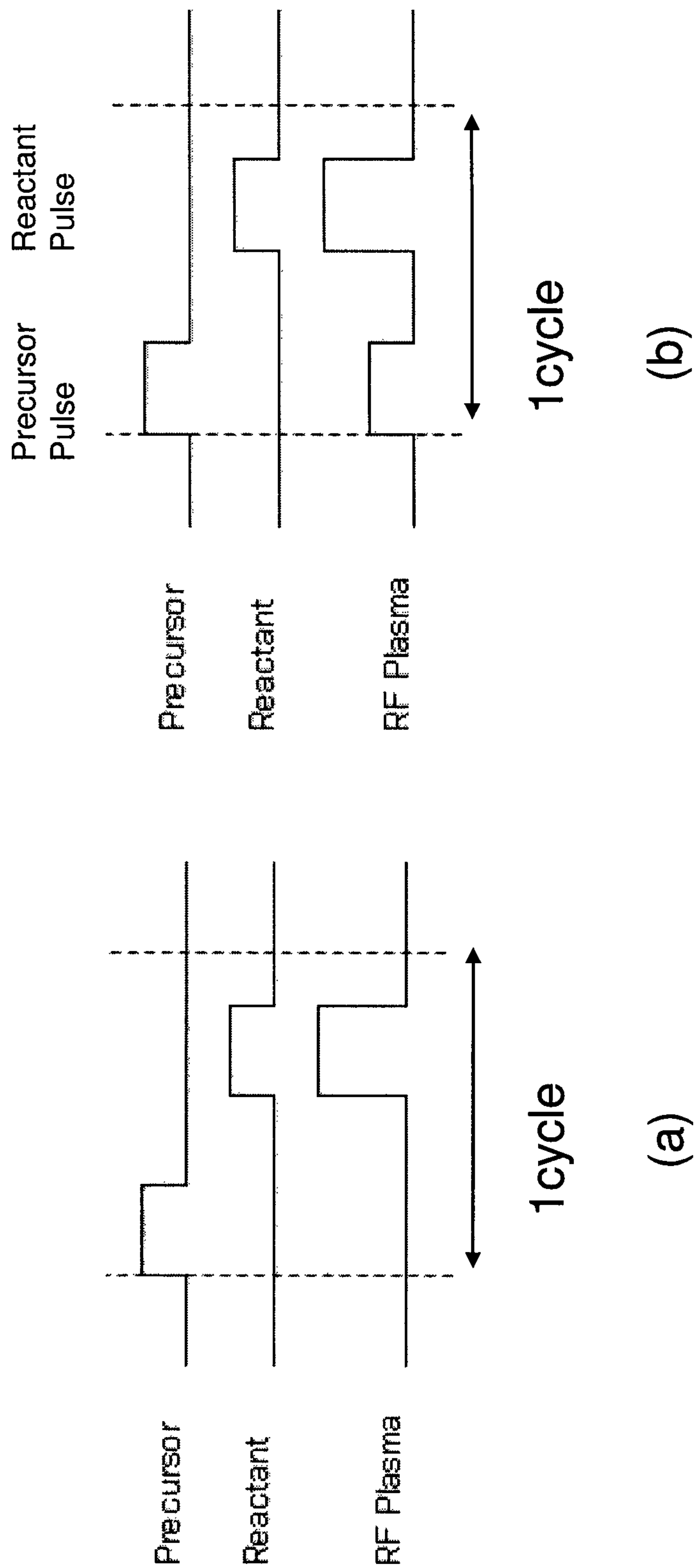
FIG. 1(*a*) shows a film formation cycle according to a conventional method.

The present invention relates to PEALD; however, in conventional PEALD, applying a plasma to the precursor has never been considered. This is because the first step of ALD which is the process of adsorbing a material (Precursor) to a surface of the target is not a process of forming a film; but it is a process of substantially or nearly self-adsorption and self-saturation of the material (i.e., a non-film forming process) that adsorbs the precursor material onto a surface of a substrate. Thus, even when the amount of the precursor supply increases more than a certain amount, the amount adsorbed will not increase and adsorption will stop at the level where the surface is saturated. This saturation process leads to a good coverage; however, the film growth rate is very low because the activity of the precursor is low. In an embodiment of the present invention, by treating a precursor with a plasma in the process of adsorption to the surface, the molecular weight of the precursor is lowered and the decomposed precursor is excited, enabling an increase in the adsorbed amount. Materials for ALD tend to have high molecular weights, causing three-dimensional interference on a surface that keeps the adsorption amount low. Therefore, in some embodiments of the present invention, some molecules of the precursor are made smaller by applying a plasma (the adsorption species are formed in a gas phase), obtaining greater adsorption on the surface. As a result, the film growth rate is enabled to rise. However, if the molecules are highly activated, multi-layer adsorption occurs in some cases, increasing the film growth rate, but the coverage deteriorates. In some embodiments, the precursor is partially activated by a plasma so that some precursor species are non-activated or slightly activated, resulting in saturated adsorption and good coverage, and some precursor species are more activated, resulting in unsaturated adsorption, high deposition rate, and low coverage. By manipulating plasma power, the activation degree can be controlled, thereby obtaining a desired coverage and deposition rate. Precursor species which reach the substrate surface are adsorbed thereon. In PEALD, the material which has adsorbed on surface is reacted with a reactant, changing the adsorbed precursor material to a film-forming substance, and ultimately the deposition or formation of film.

In some embodiments, the precursor is excited by increasing the power of applied RF, which sometimes causes not single-layer but multilayer adsorption. The higher the RF power, the more the molecules are decomposed and activated. Active molecules sometimes cause multi-layer adsorption, increasing deposition rate but lowering the coverage. RF power is applied to the extent that some precursor species remain non-activated or slightly activated, achieving good coverage. Good coverage depends on the number of activated precursor species and their degrees of activation. To have good coverage (e.g., 80% or more), it is desirable to keep the power of applied RF low (e.g., for a substrate having a diameter of 300 mm, under 100 W, 80 W, 50 W, 30 W, and even under 10 W,) for adsorbing in the surface.

In some embodiments of the present invention, a silicon group material (or silicon-containing or silicon-based material) is used as a precursor. The silicon group material has a high gas phase pressure, is a stable material, and easy to use compared to a metal material which is used in the conventional PEALD. In addition, the silicon group insulation film is easy to clean and removable by cleaning before it peels (SiN, SiO, SiCN, etc. can be removed with NF3 radicals, O2 radicals, etc.). Moreover the reaction is moderate even when applying a plasma in the silicon group material. Therefore, silicon group material can be supplied simultaneously with a reactant (especially with reactant N2, N2O, etc., but not O2 etc., which has high reactivity), and even when a plasma is applied, the mixture does not causes the generation of particles or clogging of the showerhead.

The embodiments presented herein include those specified below. It should be noted, however, that the present invention is not at all limited to these embodiments:

1) A method of forming an insulation film by alternating multiple times, respectively, a process of adsorbing a precursor onto a substrate and a process of treating the adsorbed surface using a reactant gas and a plasma, wherein a plasma is applied in the process of supplying the precursor.

2) A method according to 1), wherein a reactant gas is not supplied in the precursor adsorption process.

3) A method according to 1) or 2), wherein a purge process is provided between the precursor adsorption process and plasma treatment process using a reactant gas.

4) A method according to any one of 1) to 3), wherein the precursor is at least one type of material selected from the group that includes silicon.

5) A method according to any one of 1) to 4), wherein the insulation film is constituted by a silicon compound.

6) A method according to any one of 1) to 5), wherein the reactant gas is $NO_2$, $O_2$, $H_2$, $CO_2$, $N_2O$, $N_2$ and/or $NH_3$.

7) A method according to 5), wherein the silicon compound is SiO, SiN, SiC, SiON, SiCON, SiCO, SiBN, SiBO or SiCN.

8) A method according to 4), wherein the compound containing silicon is one of the aminosilane group.

9) A method according to any one of 1) to 8), wherein a reactant gas is also supplied in the precursor adsorption process.

10) A method according to 1), wherein the plasma power in the precursor adsorption process is lower than in the plasma treatment process using a reactant gas.

11) A method according to any one of 1) to 10), wherein the process pressures in the precursor adsorption process and plasma treatment process using a reactant gas are in a range of 50 to 2000 Pa.

12) A method according to any one of 1) to 11), wherein radio frequency waves are applied to the gap between the parallel plate electrodes to generate a plasma.

13) A method according to 12), wherein the high-frequency power applied in the precursor adsorption process is 1 to 500 W.

14) A method according to 13), wherein the high-frequency power applied in the precursor adsorption process is 1 to 100 W (in some embodiments it is under 80 W, 50 W, or 30 W).

In the embodiment of 2) above, reaction between the material and reactant gas in the gas phase can be suppressed because no reactant gas is supplied. Accordingly, a reactant gas is not supplied in the material supply process if the reactivity of material and reactant gas is high. This is because such high reactivity may result in generation of particles.

In the embodiment of 9) above, continuously supplying a reactant gas all the times improves throughput. No time for reactant purge is required, and thus, the cycle time can be shortened. In some cases, the embodiment of 9) improves the film growth rate. However, simultaneous supply of material and reactant gas followed by plasma application causes the material and reactant gas to react in the gas phase. To cause adsorption reaction to occur as close as possible onto the surface, therefore, reaction in the gas phase should be suppressed to an appropriate degree. If reaction progresses excessively in the gas phase, the film growth rate will rise but the coverage will drop. The coverage depends on the RF power as well as concentrations of material and reactant gas. If the reactivity of material and reactant gas is high, however, supplying the two simultaneously may result in particle generation.

The range of how much reactant gas should be supplied, ratio of reactant gas and material gas and other conditions in the embodiment of 9) above vary according to the types of material and reactant gas. When 3DMAS is used as the material, representative ranges of reactant gas flow rates are 0 to 900 sccm for $N_2$; 0 to 500 sccm for $H_2$; and 0 to 300 sccm for $NH_3$ in an embodiment. If the material is 3DMAS-Cl, it reacts with $H_2$ in the gas phase to generate particles. Among these, $H_2$, for example, can be used effectively by supplying it in the reactant gas process, but not in the material supply process. As for $N_2$ gas, in an embodiment it makes little difference whether or not $N_2$ gas is supplied in the material supply process. In the case of $NH_3$, too much supply of $NH_3$ in the material supply process lowers the coverage in an embodiment. In an embodiment, the amount of material supply is estimated to be approx. 1 to 30 sccm.

In the embodiment of 1) above, representative examples of temperature range, range of processing time and flow rate range of precursor are shown below. The temperature range is 500° C. or below in an embodiment where the base method is PEALD involving application of plasma. In the case of thermal ALD where a plasma is not applied, on the other hand, high temperatures of 500° C. or above are required. The use of plasma makes the temperature range of the process to be low, such as 500° C. or below. In addition, a representative temperature range is 200 to 400° C. in the case of SiN film. With SiO film, a representative temperature range is from room temperature to 400° C. Lower temperatures provide an advantage from the viewpoint of application requirements. As for processing time, representative settings are 0.1 to 10 sec in the material supply process, 0 to 2 sec during purge and 0.5 to 10 sec in the reactant gas supply process. RF is applied in the material supply process. Typically when 3DMAS is used as the material, 100 to 500 sccm of carrier gas is used and the flow rate of 3DMAS is estimated to be 1 to 30 sccm. The same applies when HEAD is used.

The processing time mentioned above refers to the time during which precursor is supplied and radio frequency waves are applied.

In the embodiment of 1) above, representative examples of temperature range, range of processing time and flow rate range of precursor for plasma treatment using a reactant gas are shown below. In an embodiment, only one plasma processing temperature is required regardless of the type of precursor adsorption process, where this one temperature is normally 500° C. or below or preferably 200 to 400° C. The plasma treatment time using a reactant gas is typically 0.5 to 10 sec. The flow rate of reactant gas is approx. 100 to 1000 sccm for $H_2$ and also 100 to 1000 sccm for $N_2$, for example. The processing time mentioned above refers to the time during which a reactant gas is supplied and radio frequency waves are also applied.

In the embodiment of 3) above, representative examples of type of gas, flow rate range of gas, range of purge processing time and pressure are shown below. In the purge process, material is not supplied but inert gas, such as Ar, is supplied by approx. 100 to 3000 sccm. A reactant gas may be used in the purge process in some embodiments. Typically the purge time is 0 to 2 sec, while the pressure is typically 200 to 500 Pa, or approx. 50 to 2000 Pa in other embodiments. Note that typically evacuation is not performed after the purge. The purge time above refers to the time during which the atmosphere is exhausted while gas is still being supplied.

In the embodiment of 3) above, conversely a purge process may be provided in the same manner between the plasma treatment process using a reactant gas and the precursor adsorption process. However, this purge can be omitted in some cases. The chances of this purge being omitted without presenting problems are high, so long as all gases used in the plasma treatment process using a reactant gas and in the material adsorption process are the same, except for the material gas(es).

In the embodiment of 10) above, desirably the RF power should be 100 W or less in the material supply process and 100 W or more when a plasma is applied under reactant gas. The plasma power affects the film growth rate/coverage in the material supply process, while in the reactant gas supply process it is considered to affect the film quality primarily and film growth rate to some extent. Accordingly, the plasma power can be adjusted as deemed appropriate. In an embodiment, the RF power in the precursor adsorption process may be 5 to 50% (in some embodiments it may be under 20% or 10%) of the RF power used in the plasma treatment process.

Figure 4:
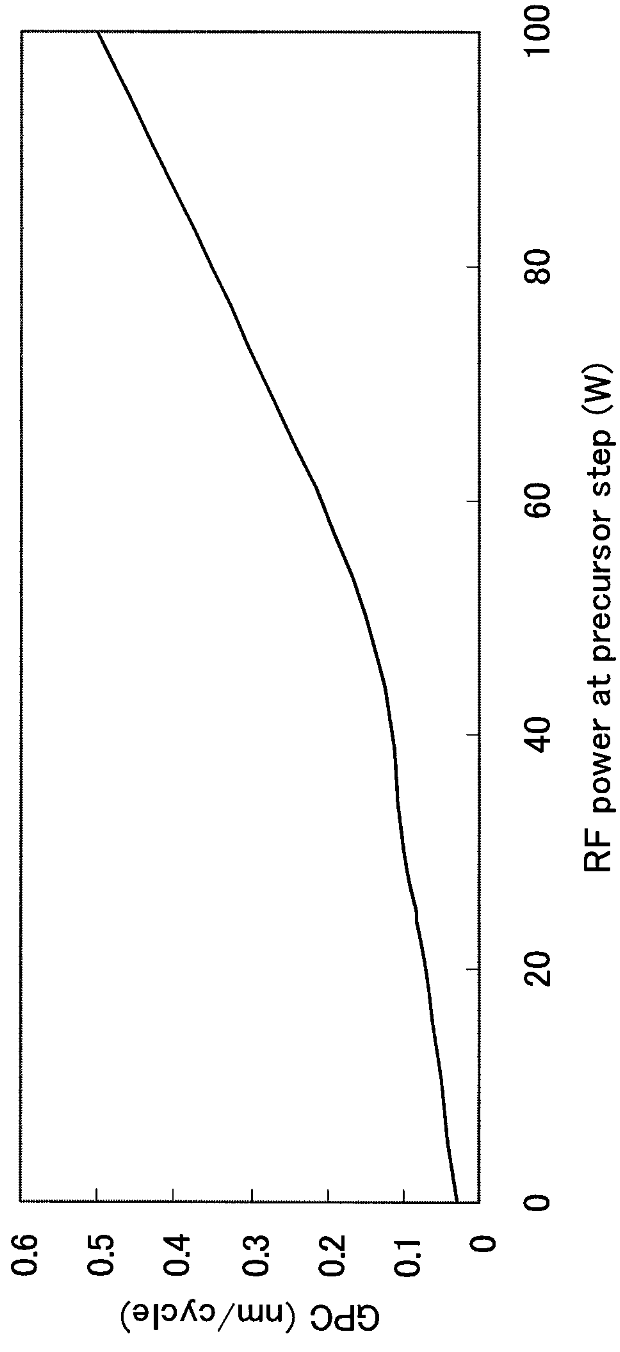
FIG. 4 is a graph showing the relationship between growth rate per cycle (GPC) and RF power applied during the precursor supply cycle according to an embodiment of the present invention.

In the embodiment of 13) above, FIG. 4 shows the RF power dependence of film growth rate until 100 W. Here, it should be noted that the film growth rate still maintains high dependence on the RF power at 100 W or more. However, the coverage drops at such high RF power levels (FIG. 5) and thus this RF power range is not used, which is a key difference between this embodiment and normal PECVD.

In relation to the embodiment of 13) above, the plasma power is typically 100 to 2000 W, or preferably 100 to 1000 W, in the plasma treatment process using a reactant gas.

In the embodiment of 12) above, typically the radio frequency range is around 13.56 MHz. In other embodiments, frequencies in a range of 400 kHz to 3 GHz may be used.

In an embodiment of the present invention, HEAD ($Si_2[NHC_2H_6]_6$), 3DMASCl ($Si[N(CH_3)_2]_3Cl$), 3EMAS ($H_2Si[N(C_2H_5)CH_3]_3$), 4DMAS ($Si[N(C_2H_6)_2]_4$), 4DEAS ($Si[N(C_2H_6)_2]_4$) and other materials belonging to the aminosilane group can be used as the first material (precursor). Other materials that can be used include $SiH_4$, $Si_2H_6$, TSA ($[SiH_3]_3N$), HCDS ($Si_2Cl_6$), $Si_3H_8$, TICS ($Si[NCO]_4$), TBOS ($Si[OtBu]_3OH$), TDMHyS ($Si[NHMe_2]_4$), among others. Only one type of precursor may be used alone, or two or more types may be combined together.

In an embodiment of the present invention, the reactant gas may be $N_2$, $H_2$, $O_2$, $NH_3$, $CH_3$, CO, $C_2H_6$, $CO_2$, $N_2O$, $B_2H_6$, etc., (only one type of reactant gas may be used alone, or two or more types may be combined together). Depending on the reactant gas(es) used, such films as SiN, SiO, SiON, SiCN, SiC, SiCO, SiCON, SiON, SiBN, SiBO, etc., can be formed.

Figure 6:
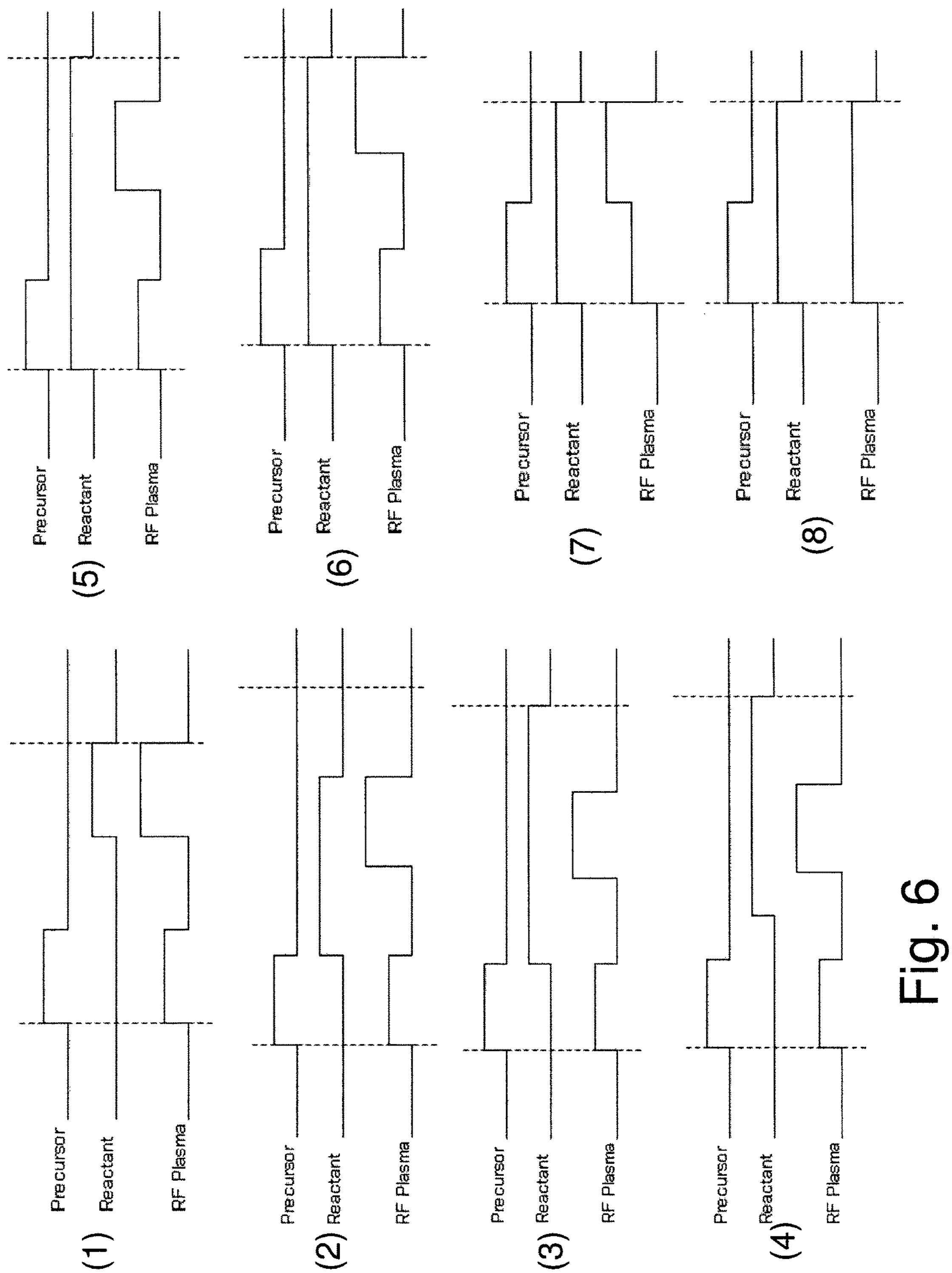
FIG. 6 shows modified film formation cycles according to embodiments (1) to (8) of the present invention.
Figure 7:
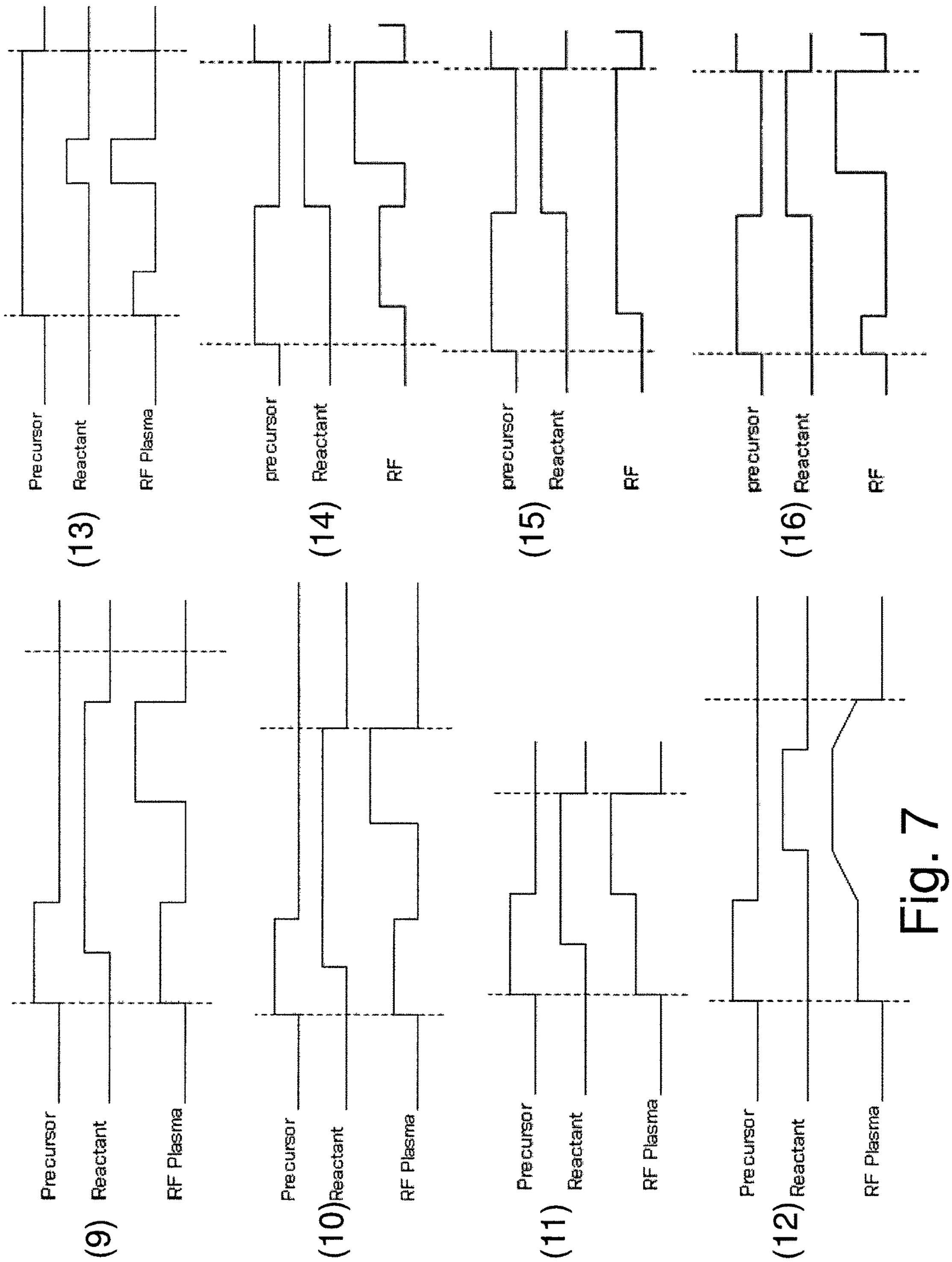
FIG. 7 shows modified film formation cycles according to embodiments (9) to (16) of the present invention.

FIGS. 6 (1) to (8) and FIGS. 7 (9) to (16) shows examples of sequences in other embodiments. In those figures, the region defined by 2 vertical dashed lines represents one cycle.

(1) No purge process is provided after the reactant gas supply process.

(2) Reactant gas is supplied after the material gas supply process, after which RF is applied.

(3) (1) and (2) are combined.

(4) Supply of reactant gas is started after the purge process following the completion of material gas supply process, after which RF is applied.

(5) Reactant gas is supplied during the cycle process.

(6) Reactant gas is supplied during the cycle process, and no purge is performed after the application of high RF power.

(7) Reactant gas is supplied during the cycle process, and no purge process is provided.

(8) Reactant gas is supplied during the cycle process, no purge process is provided, and the RF power is constant.

(9) Supply of reactant gas is started in the middle of the material supply process.

(10) Supply of reactant gas is started in the middle of the material supply process, and no purge is performed before the material supply process.

(11) Supply of reactant gas is started in the middle of the material supply process, and no purge is performed.

(12) Application of RF power is always on and the power is changed successively.

(13) Reactant gas is supplied during the material supply process.

(14) RF is applied in the middle of the material supply process.

(15) RF is applied in the middle of the material supply process, and no purge process is provided.

(16) RF is applied only at the beginning of the material supply process, a purge process is provided, and RF is applied after the supply of reactant gas.

In the above, in one cycle in some embodiments, a duration of a precursor pulse overlapped by an RF pulse may be in a range of 0.2 to 5 seconds (preferably 0.2 to 2 seconds), a duration of a reactant pulse overlapped by an RF pulse without a precursor pulse may be in a range of 0.2 to 5 seconds (preferably 0.2 to 2 seconds), and an interval between the duration of the precursor pulse overlapped by the RF pulse and the duration of the reactant pulse overlapped by the RF pulse may be in an range of 0 to 5 seconds (preferably more than 0 but less than 2 seconds).

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in specific embodiments can be modified by a range of at least ±50% in other embodiments, and the ranges applied in embodiments may include or exclude the end-points.

EXAMPLES

Example 1

Figure 2:
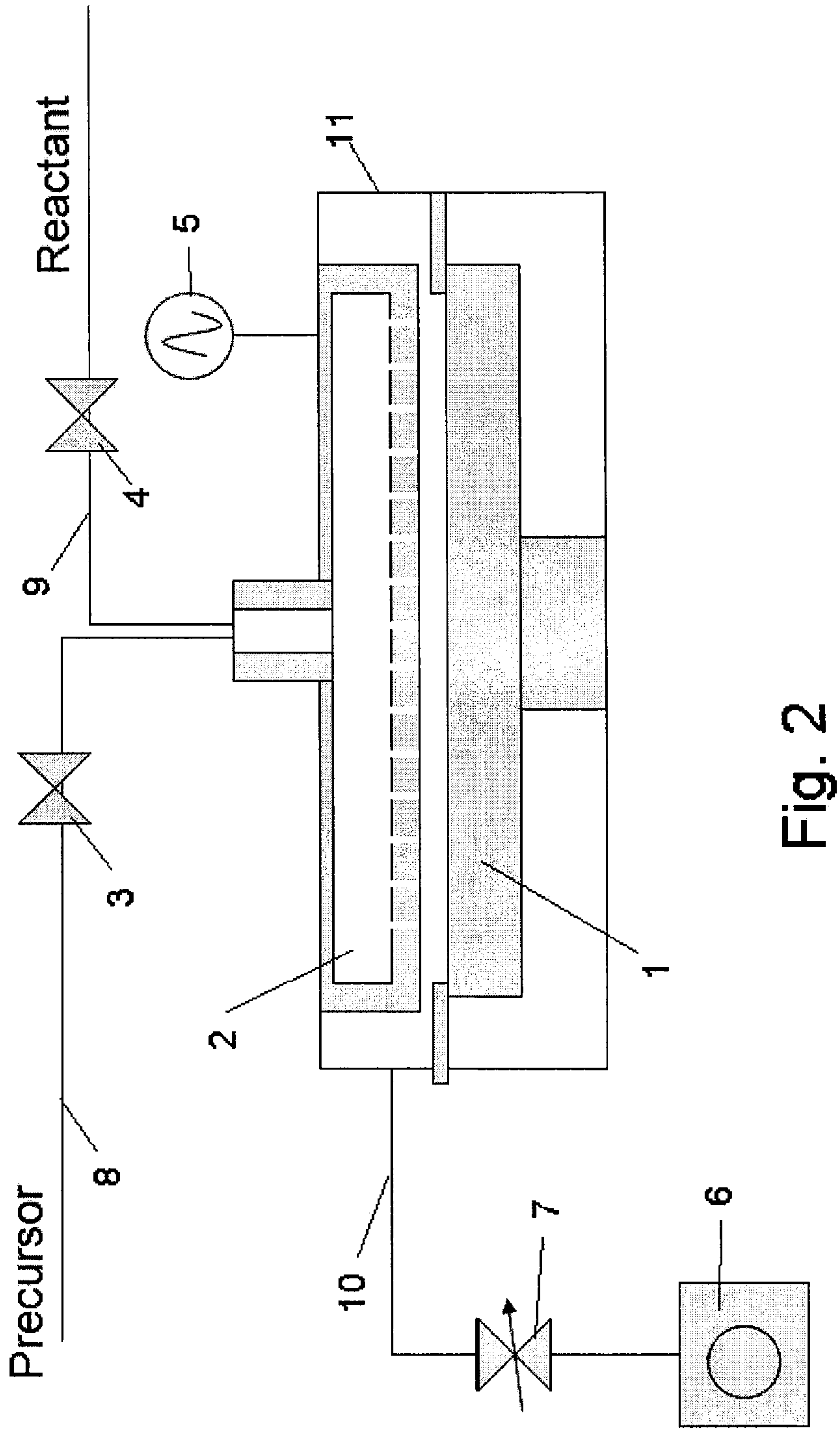
FIG. 2 is a schematic view of an apparatus useable in an embodiment of the present invention.

In this example, the apparatus shown in the schematic diagram of FIG. 2 was used to form a film. This apparatus comprises a reactor 11 which can be retained in a vacuum state, susceptor 1 with heating mechanism used to hold a wafer on top, shower head 2 which provides a mechanism for supplying gas, RF application mechanism 5 that generates a plasma between the shower head and susceptor, material gas supply line 8 equipped with an open/close valve 3 connected to the shower head 2, reactant gas supply line 9 equipped with another open/close valve 4, exhaust line 10 used to exhaust the atmosphere inside the reactor 11, and vacuum pump 6 connected after the exhaust line via a pressure control valve 7, among others. Note that a purge gas line (not illustrated) is also connected to the shower head 2 just like the reactant gas supply line 9.

A Si wafer (300 mm in diameter) is heated to 400° C., and then HEAD $Si_2[NHC_2H_6]_6$ being the first material, $N_2$ being the reactant gas, as well as Ar being the carrier gas and purge gas, are introduced, with the reactor pressure adjusted to approx. 400 Pa. The material carrier gas (any gas can be used as long as it is inert; Ar was used in this example, but the carrier gas may be the same as or different from the purge gas) was adjusted to a flow rate of 300 sccm (which resulted in a material gas flow rate of approx. 1 to 30 sccm), while the flow rate of reactant gas $N_2$ was adjusted to 500 sccm. Ar purge gas was introduced (1 SLM) and the pressure was retained at a specified level for 1 min, after which material HEAD was supplied together with carrier gas (by precursor pulses) for 1 sec. Subsequently, the material supply was stopped and the purge process was provided (for 1 sec). Then, the reactant gas $N_2$ was introduced (in the reactant step) for 1 sec, after which the supply of reactant gas was stopped and the purge process was implemented (for 0.5 sec). RF (13.56 MHz) was applied by 30 W in the material supply process and by 500 W in the reactant gas supply process. For comparison purposes, a similar operation was performed without applying RF in the aforementioned material supply process.

Figure 3:
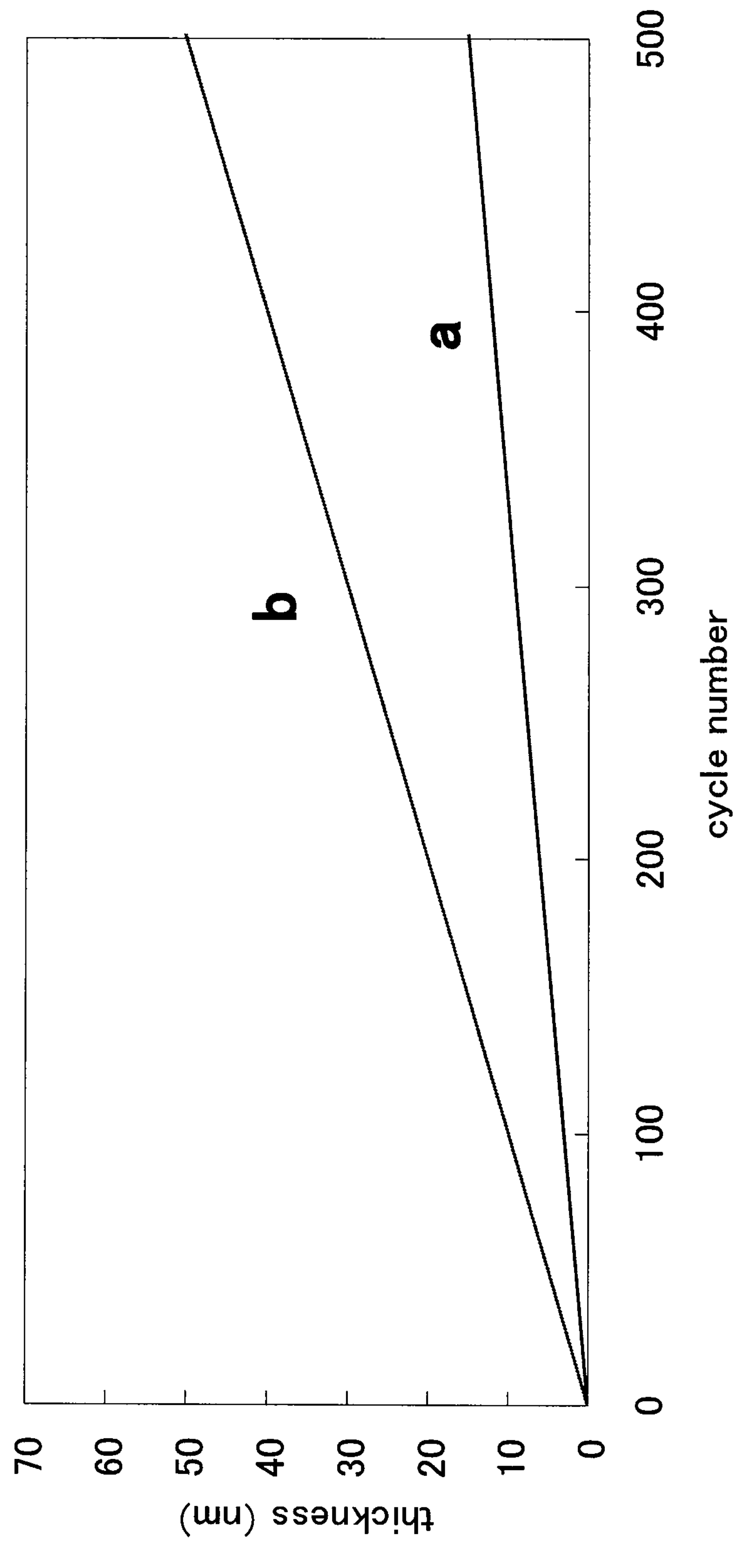
FIG. 3 is a graph showing the relationship between thickness and cycle number according to an embodiment of the present invention (marked "b") and according to a conventional method (marked "a").

FIG. 1(*a*) shows the sequence in the comparative example, while FIG. 1(*b*) shows the sequence in the present example. FIG. 3 shows the thickness of SiN film formed per cycle in each of these examples. In sequence A in the comparative example, the thickness of film formed per cycle was 0.03 nm, while it was 0.10 nm in sequence B in the present example.

Figure 5:
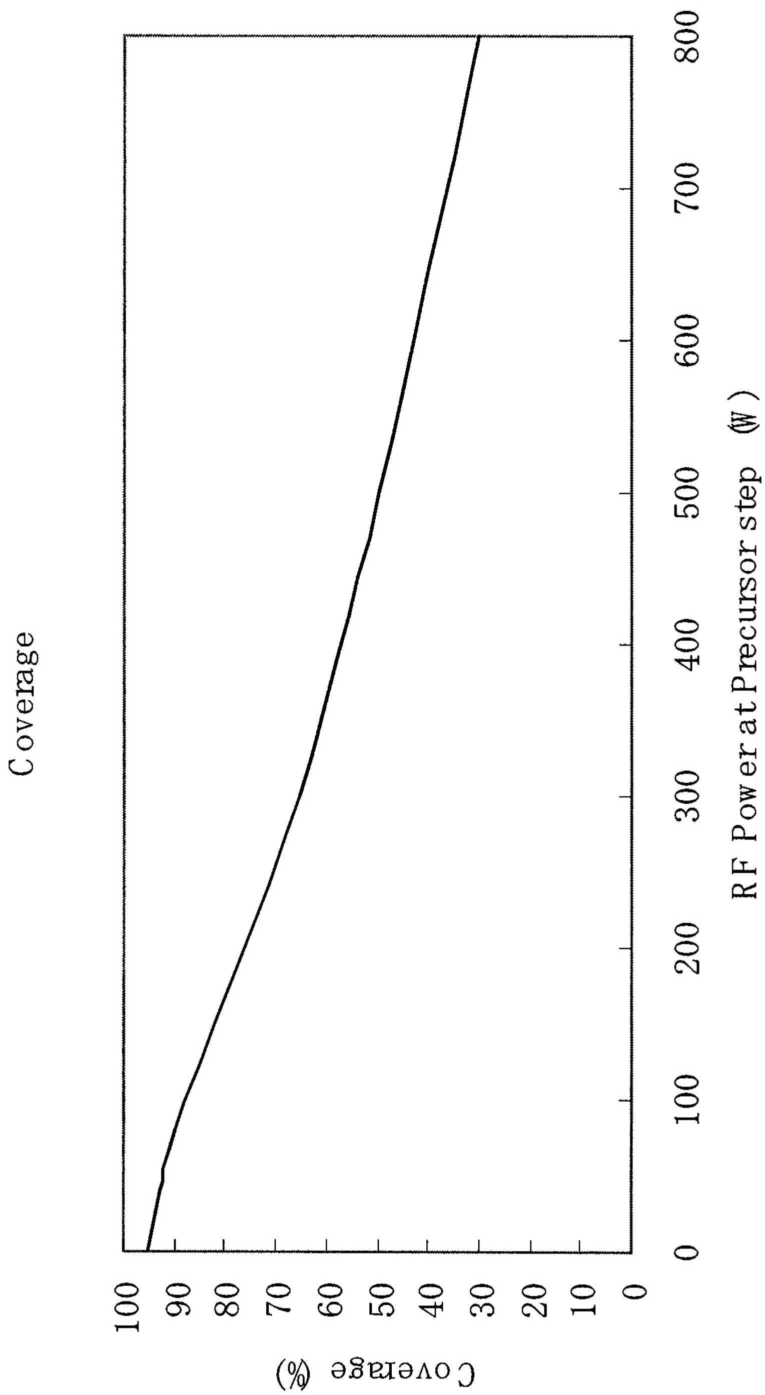
FIG. 5 is a graph showing the relationship between coverage (a ratio of film thickness on the side wall of a trench to film thickness on the top surface) and RF power applied during the precursor supply cycle according to an embodiment of the present invention.

Also note that in sequence B in the present example, changing the RF power in the material supply process changes the film growth rate. FIG. 4 shows the relationship of RF power applied in the material supply process vs. film growth rate per cycle (GPC). The film growth rate has dependence on the RF power, where increasing the RF power increases the GPC film growth speed. At the same time, however, increasing the RF power negatively affects the coverage (film thickness on the side walls and top of trenches). FIG. 5 shows the RF power dependence of coverage (for trenches with an aspect ratio (depth/opening width) of 3). As shown, higher RF power results in lower coverage. To maintain a high film growth rate while keeping the coverage at 50% or more, it is appropriate to adjust the plasma power to 100 W or less in the first material supply process.

For example, assuming that a side coverage of 90% or more is desired for trenches with an aspect ratio (depth/opening width) of 3, if the RF power is 50 W or less, the required film can be formed at a growth rate of up to 0.1 nm/cycle. If the desired coverage is 85% or more, the required film can be formed at a growth rate of up to 0.15 nm/cycle with a RF power of 100 W or less.

As explained above, the method explained herein can increase the film growth rate and thereby improve the throughput to the extent that the coverage, which is a function of the RF power, is acceptable.

Furthermore, the film formed according to the present example was confirmed to have a minimum plasma damage and the uniformity of film thickness was also excellent at $1\sigma=1.0\%$.

It should be noted that an appropriate film forming pressure is 50 Pa to 2 kPa, partly because a plasma can be maintained at pressures in this range and partly because the coverage becomes higher as the pressure increases.

Example 2

In accordance with Example 1, a $SiO_2$ film was formed using BDEAS (bis(diethylamino)silane, $SiH_2[N(C_2H_5)_2]_2$ as the first material and $O_2$ (900 sccm, supplied for 1 sec) as the reactant gas. Therefore, when a conventional PEALD sequence (FIG. 1(*a*)), was used, the film growth rate was 0.1 nm/cycle. On the other hand, use of a sequence (FIG. 1(*b*)) similar to the one explained in Example 1, where RF was applied by 10 W in the material supply process and by 300 W in the reactant gas supply process boosted the film growth rate to 0.25 nm/cycle. A good coverage was also achieved (98%). However, application of 80 W in the aforementioned material supply process resulted in a film growth rate of 1 nm/cycle and the coverage also dropped (80%).

Further, the film growth rate increased to 5 nm/cycle when RF was applied by 20 W in the first material process while $O_2$, being the reactant gas, was being supplied (by 300 sccm). However, this led to generation of particles also at the shower head which is the gas introduction mechanism. This is probably because reaction occurring in the gas phase resulted in a CVD reaction.

Example 3

In accordance with Example 1, a film was formed in the same manner as in Example 1, except that 3EMAS (tris (ethylmethylamino)silane, $H_2Si[N(C_2H_5)CH_3]_3$ was used as the first material, 3EMAS was supplied simultaneously with the first reactant gas $N_2$ (300 sccm), RF was applied by 30 W, and then RF was turned off and the atmosphere was purged, followed by supply of the second reactant gas $H_2$ (500 sccm) and application of RF by 500 W. As a result, or specifically as a result of applying the reactant gases and RF in the first material supply process, the film growth rate increased (achieved film growth rate=0.1 nm/cycle).

Example 4

In accordance with Example 1, 4DMAS (tetra(dimethylamino)silane, $Si[N(C_2H_6)_2]_4$ was used as the first material and $N_2O$ was used as the reactant gas. When 3DMAS and $N_2O$ were supplied simultaneously, RF was applied by 10 W, after which RF was turned off and the supply of 3DMAS was stopped, followed by a purge time and application of RF by 500 W, a SiON film was formed at a film growth rate of 0.3 nm/cycle.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming an insulation film by plasma enhanced atomic layer deposition (PEALD), comprising in the following sequence:

(i) introducing a precursor without a reactant gas into a reaction space where a substrate is placed, which precursor is an aminosilane compound;

(ii) exciting the precursor in the reaction space with a plasma by applying a first RF power to the reaction space for adsorbing the precursor on a surface of the substrate;

(iii) adsorbing the plasma-treated precursor onto the surface of the substrate;

(iiia) purging the reaction space between steps (iii) and (iv) without RF power;

(iv) introducing a reactant gas without a precursor to the reaction space and exciting the reactant gas with a plasma by applying a second RF power to the reaction space to treat the precursor-adsorbed surface with the excited reactant gas to form and fix a film on the surface, wherein the reactant gas is $NO_2$, $O_2$, $H_2$, $CO_2$, $N_2O$, $N_2$ and/or $NH_3$, wherein steps (i) to (iv) constitute one cycle of PEALD, wherein the first RF power is lower than the second RF power wherein the first RF power is less than 50 W so as to maintain a step coverage of the film at 90% or higher as measured for an aspect ratio (depth/opening width) of 3, and the second RF power is 100 W or more; and (v) repeating the one cycle multiple times until an atomic layer of a desired thickness is obtained.

2. The method according to claim 1, wherein no reactant gas is supplied in steps (i) to (iii).

3. The method according to claim 1, wherein the insulation film is constituted by a silicon compound.

4. The method according to claim 3, wherein the silicon compound is SiO, SiN, SiC, SiON, SiCON, SiCO, SiBN, SiBO or SiCN.

5. The method according to claim 1, wherein the first RF power is less than 1/10 of the second RF power.

6. The method according to claim 1, wherein the first RF power is less than 0.07 $W/cm^2$ per area of the substrate.

7. The method according to claim 1, wherein the process pressures in steps (i) to (iv) are in a range of 50 to 2000 Pa.

8. The method according to claim 1, wherein the plasmas in steps (ii) and (iv) are generated in a gap between capacitively-coupled parallel plate electrodes.

9. The method according to claim 1, wherein in the one cycle, a duration of step (ii) is 0.2 to 5 seconds, a duration of step (iv) is 0.2 to 5 seconds, and an interval between step (ii) and step (iv) is 0 to 5 seconds.

10. The method according to claim 1, wherein the surface has a trench, and the method further comprises, prior to step (i), setting a target step coverage of the insulation film at the trench, and setting the first value of RF power according to the target step coverage based on a predetermined correlation between a value of RF power and step coverage for the insulation film.

* * * * *